United States Patent
Nakano et al.

(10) Patent No.: US 12,289,995 B2
(45) Date of Patent: Apr. 29, 2025

(54) COMPOUND, MATERIAL FOR ORGANIC ELECTROLUMINESCENT ELEMENT, ORGANIC ELECTROLUMINESCENT ELEMENT AND ELECTRONIC DEVICE

(71) Applicant: IDEMITSU KOSAN CO.,LTD., Tokyo (JP)

(72) Inventors: Hiromi Nakano, Sodegaura (JP);
Hisato Matsumoto, Sodegaura (JP);
Yuichi Nishimae, Basel (CH)

(73) Assignee: IDEMITSU KOSAN CO., LTD., Tokyo (JP)

( * ) Notice: Subject to any disclaimer, the term of this patent is extended or adjusted under 35 U.S.C. 154(b) by 632 days.

(21) Appl. No.: 17/236,029

(22) Filed: Apr. 21, 2021

(65) Prior Publication Data

US 2021/0359222 A1 Nov. 18, 2021

(30) Foreign Application Priority Data

Apr. 22, 2020 (JP) .................................. 2020-076138

(51) Int. Cl.
*H01L 51/00* (2006.01)
*C07F 5/02* (2006.01)
(Continued)

(52) U.S. Cl.
CPC ......... *H10K 85/6572* (2023.02); *C07F 5/027* (2013.01); *H10K 50/11* (2023.02)

(58) Field of Classification Search
None
See application file for complete search history.

(56) References Cited

U.S. PATENT DOCUMENTS

| 2014/0175419 A1 | 6/2014 | Nakano et al. |
| 2014/0183486 A1 | 7/2014 | Nakano et al. |
| (Continued) |

FOREIGN PATENT DOCUMENTS

| CN | 103985822 A | * 8/2014 |
| CN | 105762279 B | * 4/2018 |
| (Continued) |

OTHER PUBLICATIONS

Adachi, "Yuki Hando-tai no Debaisu Bussei (Device Physics of Organic Semiconductors)", Kodansha Ltd., Apr. 1, 2012, 19 pages (with English Machine Translation).
(Continued)

*Primary Examiner* — Tae H Yoon
(74) *Attorney, Agent, or Firm* — Oblon, McClelland, Maier & Neustadt, L.L.P.

(57) ABSTRACT

A compound is represented by a formula (1). In the formula (1), at least one combination of adjacent two or more of $R_1$ to $R_{17}$ are mutually bonded to form a ring represented by a formula (2), in which $R_{X1}$ to $R_{X4}$ and $R_1$ to $R_{17}$ are each independently a hydrogen atom, a substituent or the like, (Continued)

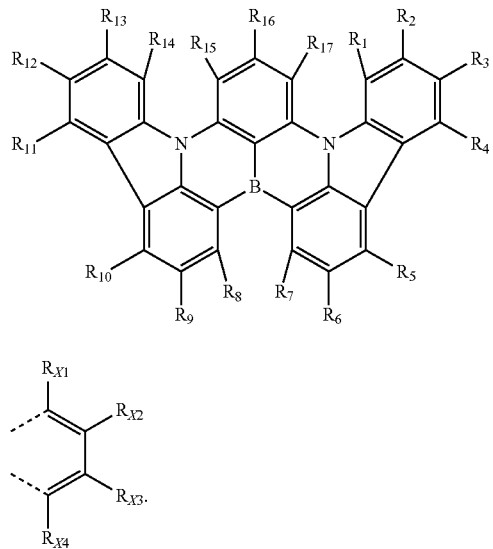

Figure 1:
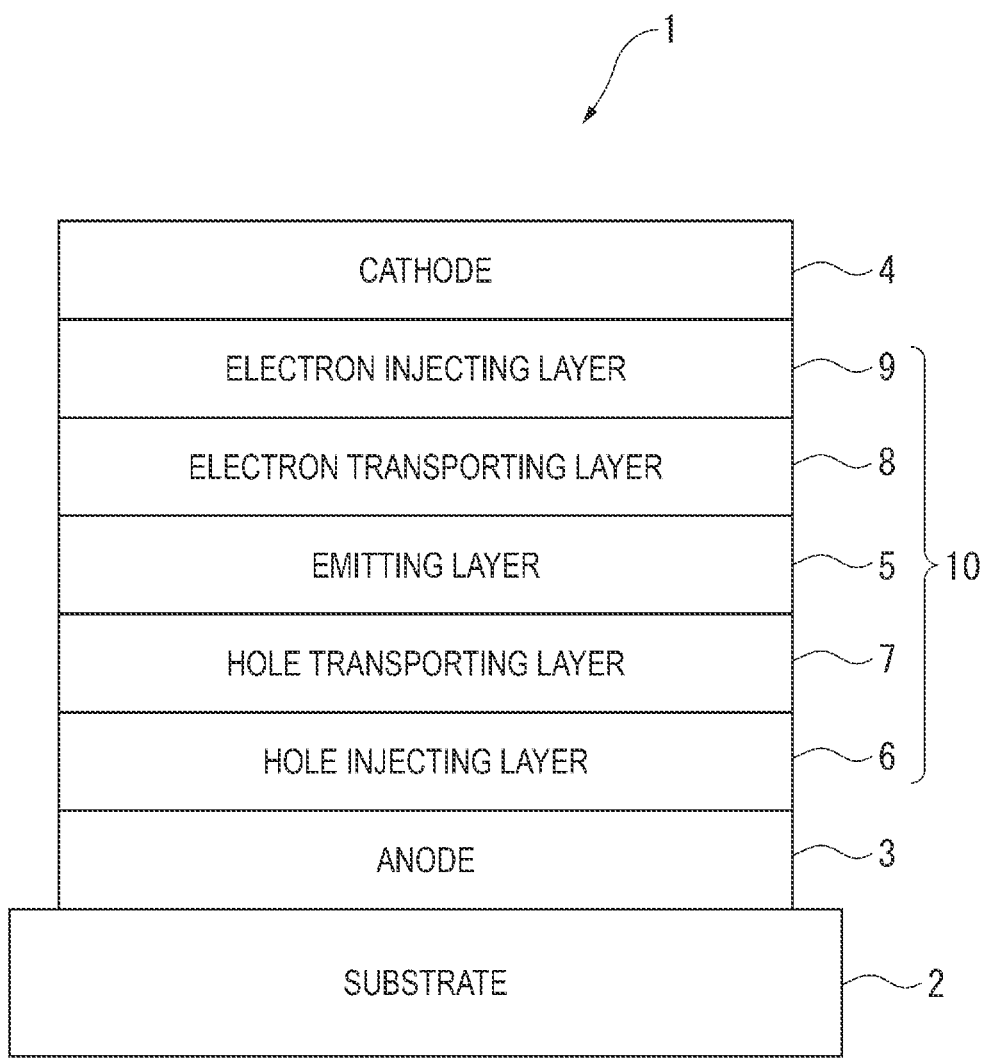

(51) Int. Cl.
*H10K 85/60* (2023.01)
*H10K 50/11* (2023.01)

(56) References Cited

U.S. PATENT DOCUMENTS

| | | |
|---|---|---|
| 2015/0236274 A1 | 8/2015 | Hatakeyama et al. |
| 2020/0066997 A1 | 2/2020 | Huang et al. |
| 2020/0144513 A1 | 5/2020 | Hatakeyama et al. |
| 2020/0144514 A1 | 5/2020 | Hatakeyama et al. |
| 2020/0144515 A1 | 5/2020 | Hatakeyama et al. |

FOREIGN PATENT DOCUMENTS

| | | | |
|---|---|---|---|
| CN | 110407859 A | * | 11/2019 |
| CN | 110627822 A | | 12/2019 |
| CN | 110790782 A | | 2/2020 |
| EP | 3 564 249 A1 | | 11/2019 |
| WO | WO 2012/153780 A1 | | 11/2012 |
| WO | WO 2013/038650 A1 | | 3/2013 |
| WO | WO 2015/102118 A1 | | 7/2015 |
| WO | WO 2018/095397 A1 | | 5/2018 |

OTHER PUBLICATIONS

Japanese Office Action issued Apr. 9, 2024 in Japanese Application No. 2020-076138, 3 pgs.

* cited by examiner

30 Claims, 5 Drawing Sheets

COMPOUND, MATERIAL FOR ORGANIC ELECTROLUMINESCENT ELEMENT, ORGANIC ELECTROLUMINESCENT ELEMENT AND ELECTRONIC DEVICE

The entire disclosure of Japanese Patent Application No. 2020-076138, filed Apr. 22, 2020, is expressly incorporated by reference herein.

TECHNICAL FIELD

The present invention relates to a compound, an organic-electroluminescence-device material, an organic electroluminescence device, and an electronic device.

BACKGROUND ART

When a voltage is applied to an organic electroluminescence device (hereinafter, occasionally referred to as "organic EL device"), holes are injected from an anode and electrons are injected from a cathode into an emitting layer. The injected electrons and holes are recombined in the emitting layer to form excitons. Specifically, according to the electron spin statistics theory, singlet excitons and triplet excitons are generated at a ratio of 25%:75%.

A fluorescent organic EL device using light emission from singlet excitons has been applied to a full-color display such as a mobile phone and a television set, but an internal quantum efficiency is said to be at a limit of 25%. Accordingly, studies has been made to improve a performance of the organic EL device. The performance of the organic EL device is evaluable in terms of, for instance, luminance, emission wavelength, full width at half maximum, chromaticity, luminous efficiency, drive voltage, and lifetime.

For instance, it is expected to further efficiently emit the organic EL device using triplet excitons in addition to singlet excitons. In view of the above, a highly efficient fluorescent organic EL device using thermally activated delayed fluorescence (hereinafter, sometimes simply referred to as "delayed fluorescence") has been proposed and studied.

A TADF (Thermally Activated Delayed Fluorescence) mechanism uses such a phenomenon that inverse intersystem crossing from triplet excitons to singlet excitons thermally occurs when a material having a small energy difference ($\Delta ST$) between singlet energy level and triplet energy level is used. Thermally activated delayed fluorescence is explained in "Yuki Hando-tai no Debaisu Bussei (Device Physics of Organic Semiconductors)" (edited by ADACHI, Chihaya, published by Kodansha, issued on Apr. 1, 2012, on pages 261-268).

As a compound exhibiting TADF properties (hereinafter also referred to as a TADF compound), for example, a compound in which a donor moiety and an acceptor moiety are bonded in a molecule is known.

Examples of Literatures relating to an organic EL device and a compound used for the organic EL device include Literature 1 (International Publication No. WO2015/102118), Literature 2 (International Publication No. WO2018/095397) and Literature 3 (Chinese Patent Application Publication No. 110407859).

SUMMARY OF THE INVENTION

An object of the invention is to provide a compound capable of improving performances of an organic EL device, an organic-electroluminescence-device material containing the compound, an organic electroluminescence device containing the compound, and an electronic device containing the organic electroluminescence device.

According to an aspect of the invention, a compound represented by a formula (1) is provided.

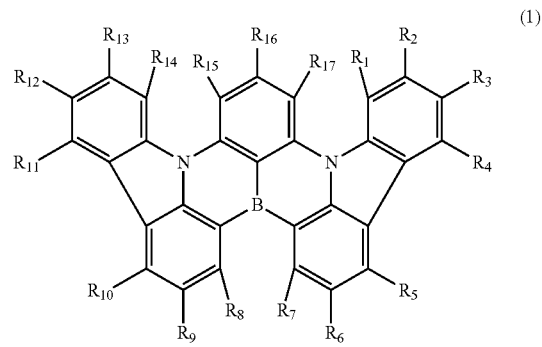

(1)

(2)

In the formula (1): at least one combination of adjacent two or more of $R_1$ to $R_{17}$ are mutually bonded to form a substituted or unsubstituted monocyclic ring, mutually bonded to form a substituted or unsubstituted fused ring, or not mutually bonded;

at least one combination of adjacent two or more of $R_1$ to $R_{17}$ are mutually bonded to form a ring represented by a formula (2), in which a dotted line in the formula (2) means a bonding position;

$R_{X1}$ to $R_{X4}$, and $R_1$ to $R_{17}$ neither forming the substituted or unsubstituted monocyclic ring nor forming the substituted or unsubstituted fused ring and not forming the ring represented by the formula (2) each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aralkyl group having 7 to 50 carbon atoms, a group represented by —Si($R_{911}$)($R_{912}$)($R_{913}$), a group represented by —O—($R_{914}$), a group represented by —S—($R_{915}$), a group represented by —N($R_{916}$)($R_{917}$), a group represented by —C(=O)$R_{918}$, a group represented by —COO$R_{919}$, a halogen atom, a cyano group, a nitro group, a substituted or unsubstituted aryl group having 6 to 50 ring carbon atoms, or a substituted or unsubstituted heterocyclic group having 5 to 50 ring atoms;

at least one of $R_1$ to $R_{17}$ represents a substituted or unsubstituted aryl group having 6 to 50 ring carbon atoms, or a substituted or unsubstituted heterocyclic group having 5 to 50 ring atoms;

when a plurality of $R_{X1}$ are present, the plurality of $R_{X1}$ are mutually the same or different;

when a plurality of $R_{X2}$ are present, the plurality of $R_{X2}$ are mutually the same or different;

when a plurality of $R_{X3}$ are present, the plurality of $R_{X3}$ are mutually the same or different;

when a plurality of $R_{X4}$ are present, the plurality of $R_{X4}$ are mutually the same or different;

$R_{911}$ to $R_{919}$ are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms;

when a plurality of $R_{911}$ are present, the plurality of $R_{911}$ are mutually the same or different;

when a plurality of $R_{912}$ are present, the plurality of $R_{912}$ are mutually the same or different;

when a plurality of $R_{913}$ are present, the plurality of $R_{913}$ are mutually the same or different;

when a plurality of $R_{914}$ are present, the plurality of $R_{914}$ are mutually the same or different;

when a plurality of $R_{915}$ are present, the plurality of $R_{915}$ are mutually the same or different;

when a plurality of $R_{916}$ are present, the plurality of $R_{916}$ are mutually the same or different;

when a plurality of $R_{917}$ are present, the plurality of $R_{917}$ are mutually the same or different;

when a plurality of $R_{918}$ are present, the plurality of $R_{918}$ are mutually the same or different; and when a plurality of $R_{919}$ are present, the plurality of $R_{919}$ are mutually the same or different.

Another aspect of the invention provides an organic-electroluminescence-device material including the compound according to the above aspect of the invention.

Still another aspect of the invention provides an organic electroluminescence device including: a cathode, an anode, and an organic layer provided between the cathode and the anode, in which the organic layer includes an emitting layer, and at least one layer included in the organic layer includes the compound according to the above aspect of the invention.

A further aspect of the invention provides an electronic device including the organic electroluminescence device according to the above aspect of the invention.

According to the above aspect of the invention, a compound capable of improving the performances of an organic EL device can be provided. According to the above aspect of the invention, an organic-electroluminescence-device material including the compound can be provided. According to the above aspect of the invention, an organic electroluminescence device including the compound can be provided. According to the aspect of the invention, an electronic device including the organic electroluminescence device can be provided.

BRIEF DESCRIPTION OF DRAWING(S)

FIG. 1 schematically shows an example of an organic electroluminescence device according to a third exemplary embodiment of the invention.

Figure 2:
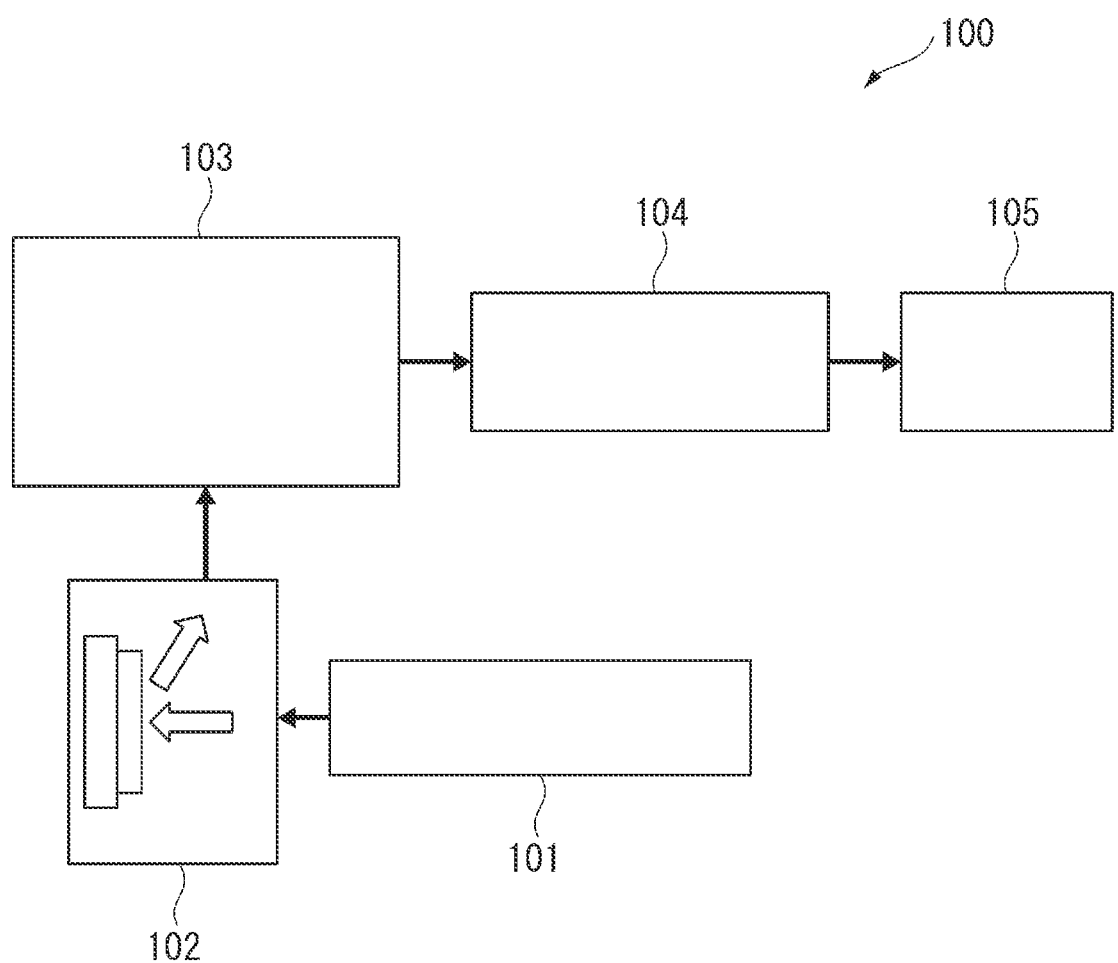

FIG. 2 schematically shows a device that measures transient PL.

Figure 3:
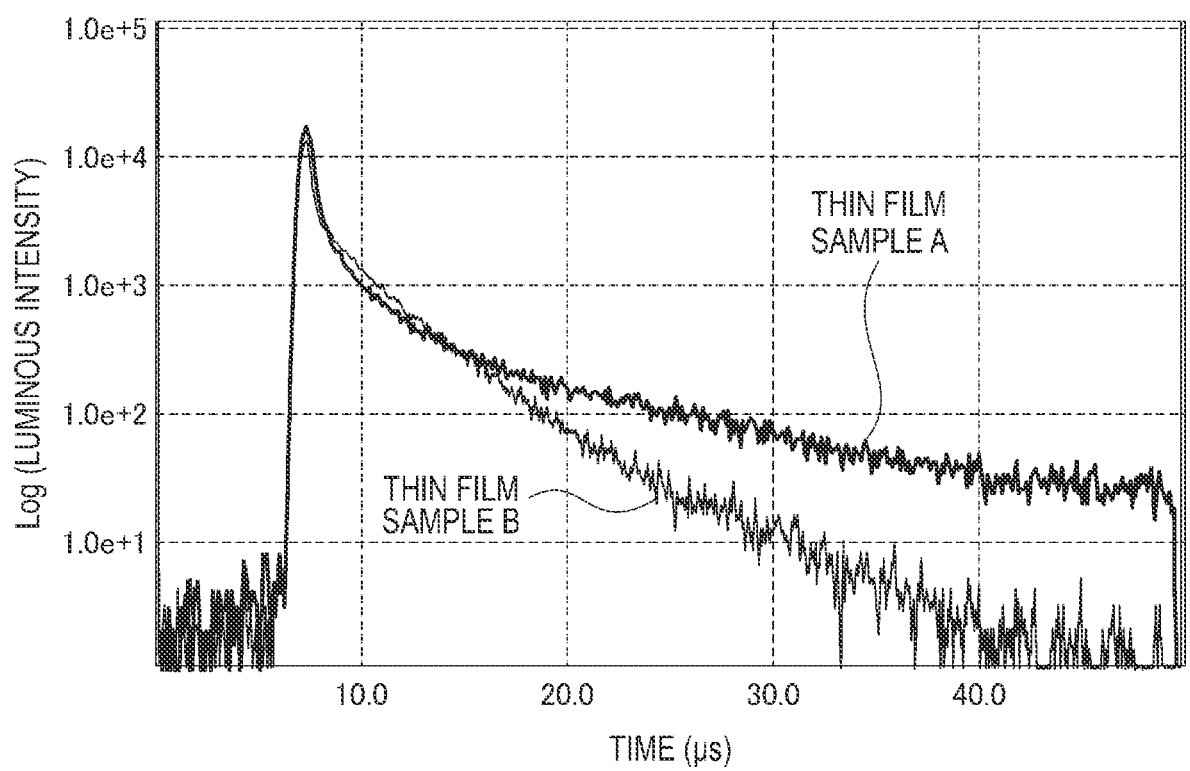

FIG. 3 shows an example of a decay curve of the transient PL.

Figure 4:
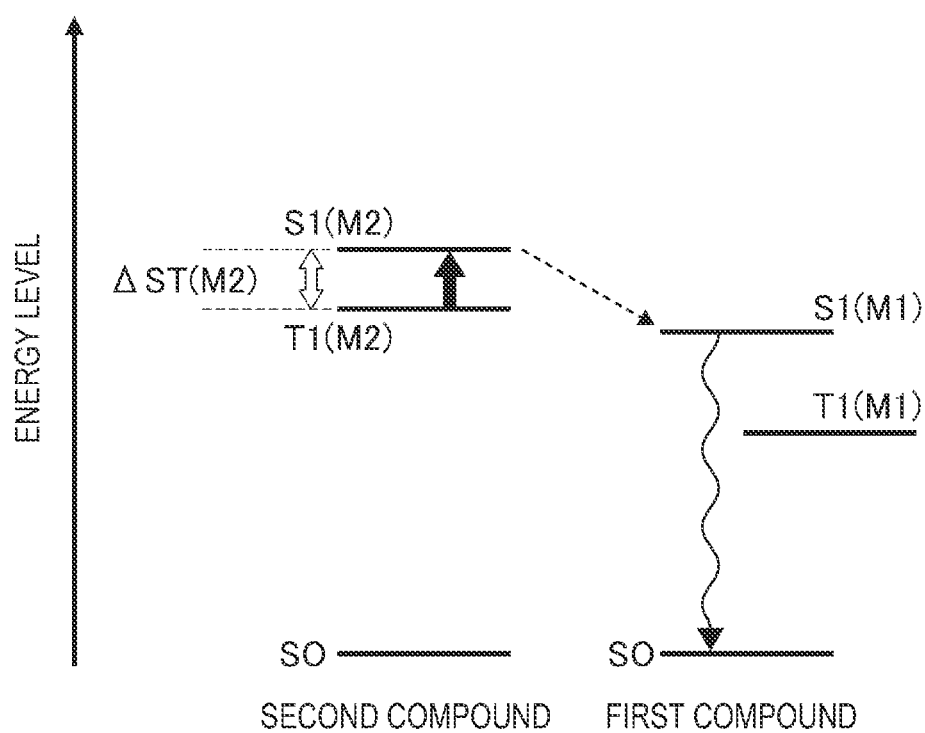

FIG. 4 schematically shows a relationship in energy level and energy transfer between a first compound and a second compound in an emitting layer of an exemplary organic electroluminescence device according to the third exemplary embodiment of the invention.

Figure 5:
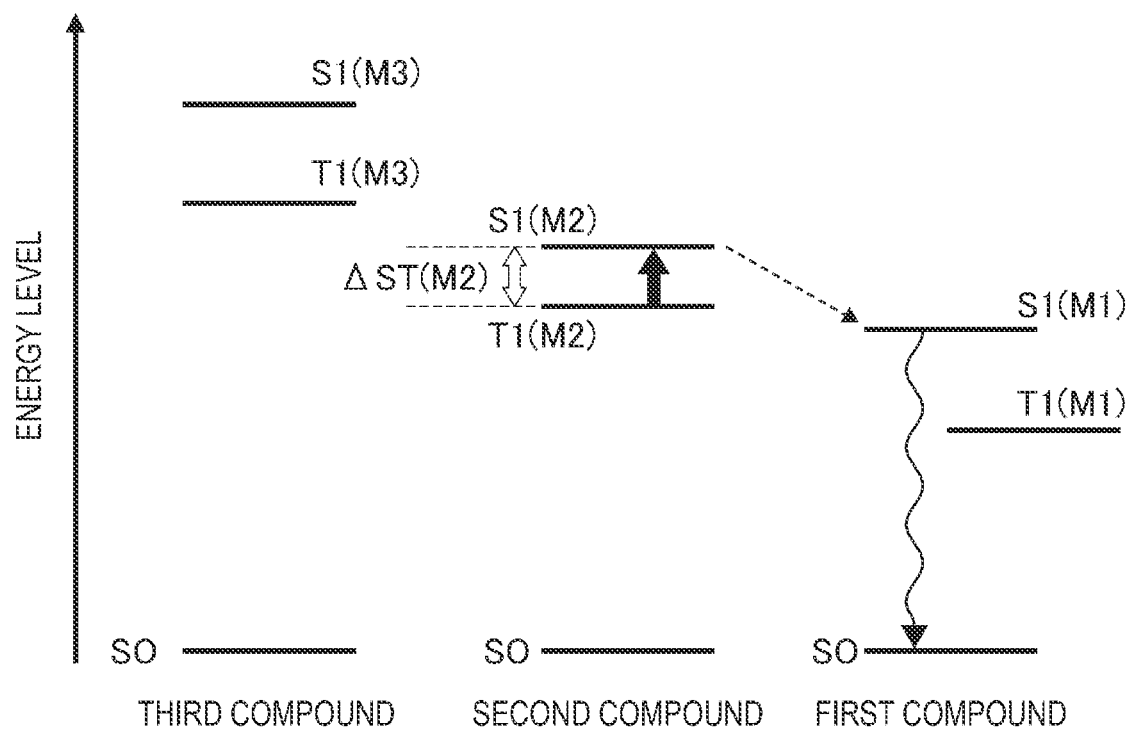

FIG. 5 schematically shows a relationship in energy level and energy transfer among a first compound, a second compound, and a third compound in an emitting layer of an exemplary organic electroluminescence device according to a fourth exemplary embodiment of the invention.

DESCRIPTION OF EMBODIMENT(S)

Definitions

Herein, a hydrogen atom includes isotope having different numbers of neutrons, specifically, protium, deuterium and tritium.

In chemical formulae herein, it is assumed that a hydrogen atom (i.e. protium, deuterium and tritium) is bonded to each of bondable positions that are not annexed with signs "R" or the like or "D" representing a protium.

Herein, the ring carbon atoms refer to the number of carbon atoms among atoms forming a ring of a compound (e.g., a monocyclic compound, fused-ring compound, crosslinking compound, carbon ring compound, and heterocyclic compound) in which the atoms are bonded with each other to form the ring. When the ring is substituted by a substituent(s), carbon atom(s) contained in the substituent(s) is not counted in the ring carbon atoms. Unless otherwise specified, the same applies to the "ring carbon atoms" described later. For instance, a benzene ring has 6 ring carbon atoms, a naphthalene ring has 10 ring carbon atoms, a pyridine ring has 5 ring carbon atoms, and a furan ring has 4 ring carbon atoms. Further, for instance, 9,9-diphenylfluorenyl group has 13 ring carbon atoms and 9,9'-spirobifluorenyl group has 25 ring carbon atoms.

When a benzene ring is substituted by a substituent in a form of, for instance, an alkyl group, the number of carbon atoms of the alkyl group is not counted in the number of the ring carbon atoms of the benzene ring. Accordingly, the benzene ring substituted by an alkyl group has 6 ring carbon atoms. When a naphthalene ring is substituted by a substituent in a form of, for instance, an alkyl group, the number of carbon atoms of the alkyl group is not counted in the number of the ring carbon atoms of the naphthalene ring. Accordingly, the naphthalene ring substituted by an alkyl group has 10 ring carbon atoms.

Herein, the ring atoms refer to the number of atoms forming a ring of a compound (e.g., a monocyclic compound, fused-ring compound, crosslinking compound, carbon ring compound, and heterocyclic compound) in which the atoms are bonded to each other to form the ring (e.g., monocyclic ring, fused ring, and ring assembly). Atom(s) not forming the ring (e.g., hydrogen atom(s) for saturating the valence of the atom which forms the ring) and atom(s) in a substituent by which the ring is substituted are not counted as the ring atoms. Unless otherwise specified, the same applies to the "ring atoms" described later. For instance, a pyridine ring has 6 ring atoms, a quinazoline ring has 10 ring atoms, and a furan ring has 5 ring atoms.

For instance, the number of hydrogen atom(s) bonded to a pyridine ring or the number of atoms forming a substituent are not counted as the pyridine ring atoms. Accordingly, a pyridine ring bonded with a hydrogen atom(s) or a substituent(s) has 6 ring atoms. For instance, the hydrogen atom(s) bonded to a quinazoline ring or the atoms forming a substituent are not counted as the quinazoline ring atoms. Accordingly, a quinazoline ring bonded with hydrogen atom(s) or a substituent(s) has 10 ring atoms.

Herein, "XX to YY carbon atoms" in the description of "substituted or unsubstituted ZZ group having XX to YY carbon atoms" represent carbon atoms of an unsubstituted ZZ group and do not include carbon atoms of a substituent(s) of the substituted ZZ group. Herein, "YY" is larger than "XX," "XX" representing an integer of 1 or more and "YY" representing an integer of 2 or more.

Herein, "XX to YY atoms" in the description of "substituted or unsubstituted ZZ group having XX to YY atoms" represent atoms of an unsubstituted ZZ group and does not include atoms of a substituent(s) of the substituted ZZ group. Herein, "YY" is larger than "XX," "XX" representing an integer of 1 or more and "YY" representing an integer of 2 or more.

Herein, an unsubstituted ZZ group refers to an "unsubstituted ZZ group" in a "substituted or unsubstituted ZZ group," and a substituted ZZ group refers to a "substituted ZZ group" in a "substituted or unsubstituted ZZ group."

Herein, the term "unsubstituted" used in a "substituted or unsubstituted ZZ group" means that a hydrogen atom(s) in the ZZ group is not substituted with a substituent(s). The hydrogen atom(s) in the "unsubstituted ZZ group" is protium, deuterium, or tritium.

Herein, the term "substituted" used in a "substituted or unsubstituted ZZ group" means that at least one hydrogen atom in the ZZ group is substituted with a substituent. Similarly, the term "substituted" used in a "BB group substituted by AA group" means that at least one hydrogen atom in the BB group is substituted with the AA group.

Substituents Mentioned Herein

Substituents mentioned herein will be described below.

An "unsubstituted aryl group" mentioned herein has, unless otherwise specified herein, 6 to 50, preferably 6 to 30, more preferably 6 to 18 ring carbon atoms.

An "unsubstituted heterocyclic group" mentioned herein has, unless otherwise specified herein, 5 to 50, preferably 5 to 30, more preferably 5 to 18 ring atoms.

An "unsubstituted alkyl group" mentioned herein has, unless otherwise specified herein, 1 to 50, preferably 1 to 20, more preferably 1 to 6 carbon atoms.

An "unsubstituted alkenyl group" mentioned herein has, unless otherwise specified herein, 2 to 50, preferably 2 to 20, more preferably 2 to 6 carbon atoms.

An "unsubstituted alkynyl group" mentioned herein has, unless otherwise specified herein, 2 to 50, preferably 2 to 20, more preferably 2 to 6 carbon atoms.

An "unsubstituted cycloalkyl group" mentioned herein has, unless otherwise specified herein, 3 to 50, preferably 3 to 20, more preferably 3 to 6 ring carbon atoms.

An "unsubstituted arylene group" mentioned herein has, unless otherwise specified herein, 6 to 50, preferably 6 to 30, more preferably 6 to 18 ring carbon atoms.

An "unsubstituted divalent heterocyclic group" mentioned herein has, unless otherwise specified herein, 5 to 50, preferably 5 to 30, more preferably 5 to 18 ring atoms.

An "unsubstituted alkylene group" mentioned herein has, unless otherwise specified herein, 1 to 50, preferably 1 to 20, more preferably 1 to 6 carbon atoms.

Substituted or Unsubstituted Aryl Group

Specific examples (specific example group G1) of the "substituted or unsubstituted aryl group" mentioned herein include unsubstituted aryl groups (specific example group G1A) below and substituted aryl groups (specific example group G1B). (Herein, an unsubstituted aryl group refers to an "unsubstituted aryl group" in a "substituted or unsubstituted aryl group," and a substituted aryl group refers to a "substituted aryl group" in a "substituted or unsubstituted aryl group." A simply termed "aryl group" herein includes both of an "unsubstituted aryl group" and a "substituted aryl group."

The "substituted aryl group" refers to a group derived by substituting at least one hydrogen atom in an "unsubstituted aryl group" with a substituent. Examples of the "substituted aryl group" include a group derived by substituting at least one hydrogen atom in the "unsubstituted aryl group" in the specific example group G1A below with a substituent, and examples of the substituted aryl group in the specific example group G1B below. It should be noted that the examples of the "unsubstituted aryl group" and the "substituted aryl group" mentioned herein are merely exemplary, and the "substituted aryl group" mentioned herein includes a group derived by substituting a hydrogen atom bonded to a carbon atom of a skeleton of a "substituted aryl group" in the specific example group G1B below, and a group derived by substituting a hydrogen atom of a substituent of the "substituted aryl group" in the specific example group G1B below.

Unsubstituted Aryl Group (Specific Example Group G1A):

phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, benzanthryl group, phenanthryl group, benzophenanthryl group, phenalenyl group, pyrenyl group, chrysenyl group, benzochrysenyl group, triphenylenyl group, benzotriphenylenyl group, tetracenyl group, pentacenyl group, fluorenyl group, 9,9'-spirobifluorenyl group, benzofluorenyl group, dibenzofluorenyl group, fluoranthenyl group, benzofluoranthenyl group, a perylenyl group, and a monovalent aryl group derived by removing one hydrogen atom from cyclic structures represented by formulae (TEMP-1) to (TEMP-15) below.

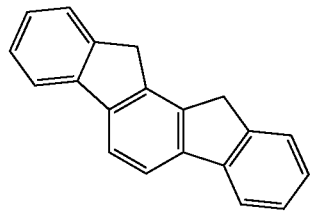

(TEMP-1)

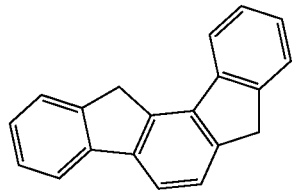

(TEMP-2)

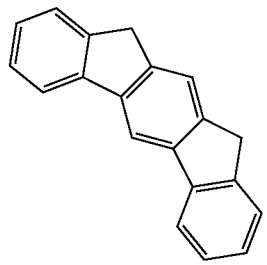

(TEMP-3)

(TEMP-4)
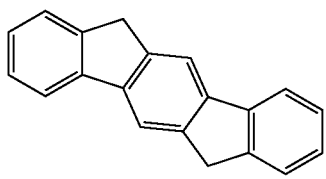

(TEMP-5)
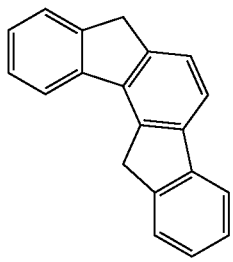

(TEMP-6)
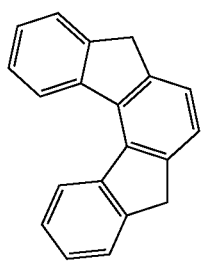

(TEMP-7)
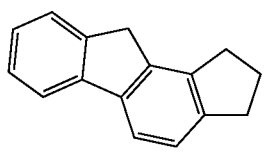

(TEMP-8)
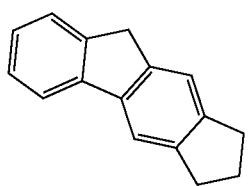

(TEMP-9)
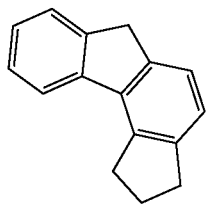

(TEMP-10)
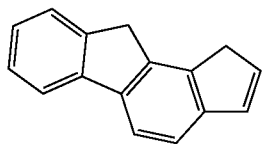

(TEMP-11)
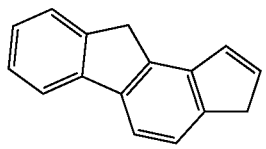

(TEMP-12)
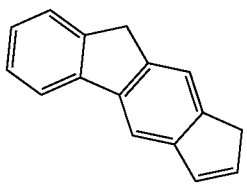

(TEMP-13)
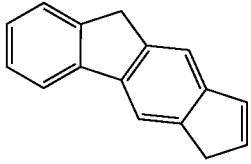

(TEMP-14)
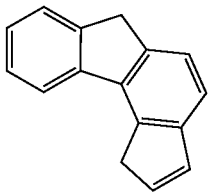

(TEMP-15)
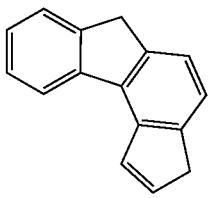

Substituted Aryl Group (Specific Example Group G1B):

o-tolyl group, m-tolyl group, p-tolyl group, para-xylyl group, meta-xylyl group, ortho-xylyl group, para-isopropylphenyl group, meta-isopropylphenyl group, ortho-isopropylphenyl group, para-t-butylphenyl group, meta-t-butylphenyl group, ortho-t-butylphenyl group, 3,4,5-trimethylphenyl group, 9,9-dimethylfluorenyl group, 9,9-diphenylfluorenyl group, 9,9-bis(4-methylphenyl)fluorenyl group, 9,9-bis(4-isopropylphenyl)fluorenyl group, 9,9-bis(4-t-butylphenyl)fluorenyl group, cyanophenyl group, triphenylsilylphenyl group, trimethylsilylphenyl group, phenylnaphthyl group, naphthylphenyl group, and a group derived by substituting at least one hydrogen atom of a monovalent group derived from the cyclic structures represented by the formulae (TEMP-1) to (TEMP-15) with a substituent.

Substituted or Unsubstituted Heterocyclic Group

The "heterocyclic group" mentioned herein refers to a cyclic group having at least one hetero atom in the ring atoms. Specific examples of the hetero atom include a nitrogen atom, oxygen atom, sulfur atom, silicon atom, phosphorus atom, and boron atom.

The "heterocyclic group" mentioned herein is a monocyclic group or a fused-ring group.

The "heterocyclic group" mentioned herein is an aromatic heterocyclic group or a non-aromatic heterocyclic group.

Specific examples (specific example group G2) of the "substituted or unsubstituted heterocyclic group" mentioned herein include unsubstituted heterocyclic groups (specific example group G2A) and substituted heterocyclic groups (specific example group G2B). (Herein, an unsubstituted heterocyclic group refers to an "unsubstituted heterocyclic group" in a "substituted or unsubstituted heterocyclic group," and a substituted heterocyclic group refers to a "substituted heterocyclic group" in a "substituted or unsubstituted heterocyclic group.") A simply termed "heterocyclic group" herein includes both of "unsubstituted heterocyclic group" and "substituted heterocyclic group."

The "substituted heterocyclic group" refers to a group derived by substituting at least one hydrogen atom in an "unsubstituted heterocyclic group" with a substituent. Specific examples of the "substituted heterocyclic group" include a group derived by substituting at least one hydrogen atom in the "unsubstituted heterocyclic group" in the specific example group G2A below with a substituent, and examples of the substituted heterocyclic group in the specific example group G2B below. It should be noted that the examples of the "unsubstituted heterocyclic group" and the "substituted heterocyclic group" mentioned herein are merely exemplary, and the "substituted heterocyclic group" mentioned herein includes a group derived by substituting a hydrogen atom bonded to a ring atom of a skeleton of a "substituted heterocyclic group" in the specific example group G2B below, and a group derived by substituting a hydrogen atom of a substituent of the "substituted heterocyclic group" in the specific example group G2B below.

The specific example group G2A includes, for instance, unsubstituted heterocyclic groups including a nitrogen atom (specific example group G2A1) below, unsubstituted heterocyclic groups including an oxygen atom (specific example group G2A2) below, unsubstituted heterocyclic groups including a sulfur atom (specific example group G2A3) below, and monovalent heterocyclic groups (specific example group G2A4) derived by removing a hydrogen atom from cyclic structures represented by formulae (TEMP-16) to (TEMP-33) below.

The specific example group G2B includes, for instance, substituted heterocyclic groups including a nitrogen atom (specific example group G2B1) below, substituted heterocyclic groups including an oxygen atom (specific example group G2B2) below, substituted heterocyclic groups including a sulfur atom (specific example group G2B3) below, and groups derived by substituting at least one hydrogen atom of the monovalent heterocyclic groups (specific example group G2B4) derived from the cyclic structures represented by formulae (TEMP-16) to (TEMP-33) below.

Unsubstituted Heterocyclic Groups Including Nitrogen Atom (Specific Example Group G2A1):

pyrrolyl group, imidazolyl group, pyrazolyl group, triazolyl group, tetrazolyl group, oxazolyl group, isoxazolyl group, oxadiazolyl group, thiazolyl group, isothiazolyl group, thiadiazolyl group, a pyridyl group, pyridazynyl group, a pyrimidinyl group, pyrazinyl group, a triazinyl group, indolyl group, isoindolyl group, indolizinyl group, quinolizinyl group, quinolyl group, isoquinolyl group, cinnolyl group, phthalazinyl group, quinazolinyl group, quinoxalinyl group, benzimidazolyl group, indazolyl group, phenanthrolinyl group, phenanthridinyl group, acridinyl group, phenazinyl group, carbazolyl group, benzocarbazolyl group, morpholino group, phenoxazinyl group, phenothiazinyl group, azacarbazolyl group, and diazacarbazolyl group.

Unsubstituted Heterocyclic Groups Including Oxygen Atom (Specific Example Group G2A2):

furyl group, oxazolyl group, isoxazolyl group, oxadiazolyl group, xanthenyl group, benzofuranyl group, isobenzofuranyl group, a dibenzofuranyl group, naphthobenzofuranyl group, benzoxazolyl group, benzisoxazolyl group, phenoxazinyl group, morpholino group, dinaphthofuranyl group, azadibenzofuranyl group, diazadibenzofuranyl group, azanaphthobenzofuranyl group, and diazanaphthobenzofuranyl group.

Unsubstituted Heterocyclic Groups Including Sulfur Atom (Specific Example Group G2A3):

thienyl group, thiazolyl group, isothiazolyl group, thiadiazolyl group, benzothiophenyl group (benzothienyl group), isobenzothiophenyl group (isobenzothienyl group), dibenzothiophenyl group (dibenzothienyl group), naphthobenzothiophenyl group (nahthobenzothienyl group), benzothiazolyl group, benzisothiazolyl group, phenothiazinyl group, dinaphthothiophenyl group (dinaphthothienyl group), azadibenzothiophenyl group (azadibenzothienyl group), diazadibenzothiophenyl group (diazadibenzothienyl group), azanaphthobenzothiophenyl group (azanaphthobenzothienyl group), and diazanaphthobenzothiophenyl group (diazanaphthobenzothienyl group).

Monovalent Heterocyclic Groups Derived by Removing One Hydrogen Atom from Cyclic Structures Represented by Formulae (TEMP-16) to (TEMP-33) (Specific Example Group G2A4):

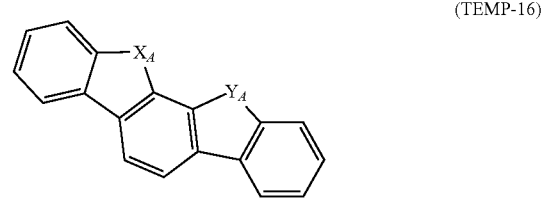

(TEMP-16)

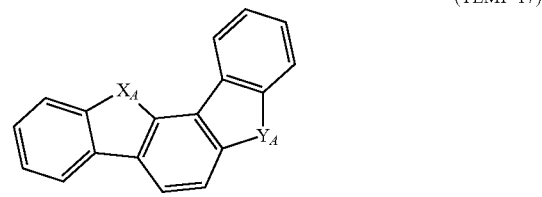

(TEMP-17)

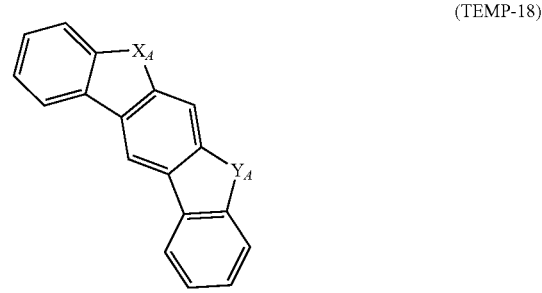

(TEMP-18)

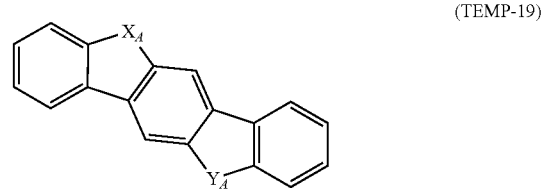

(TEMP-19)

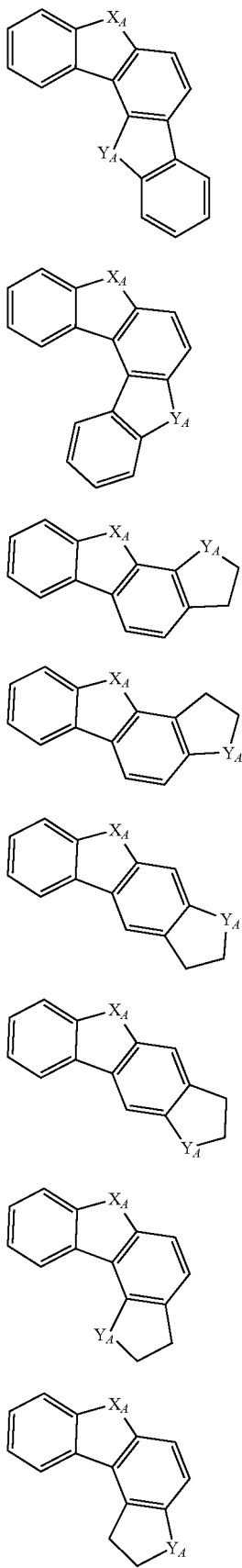

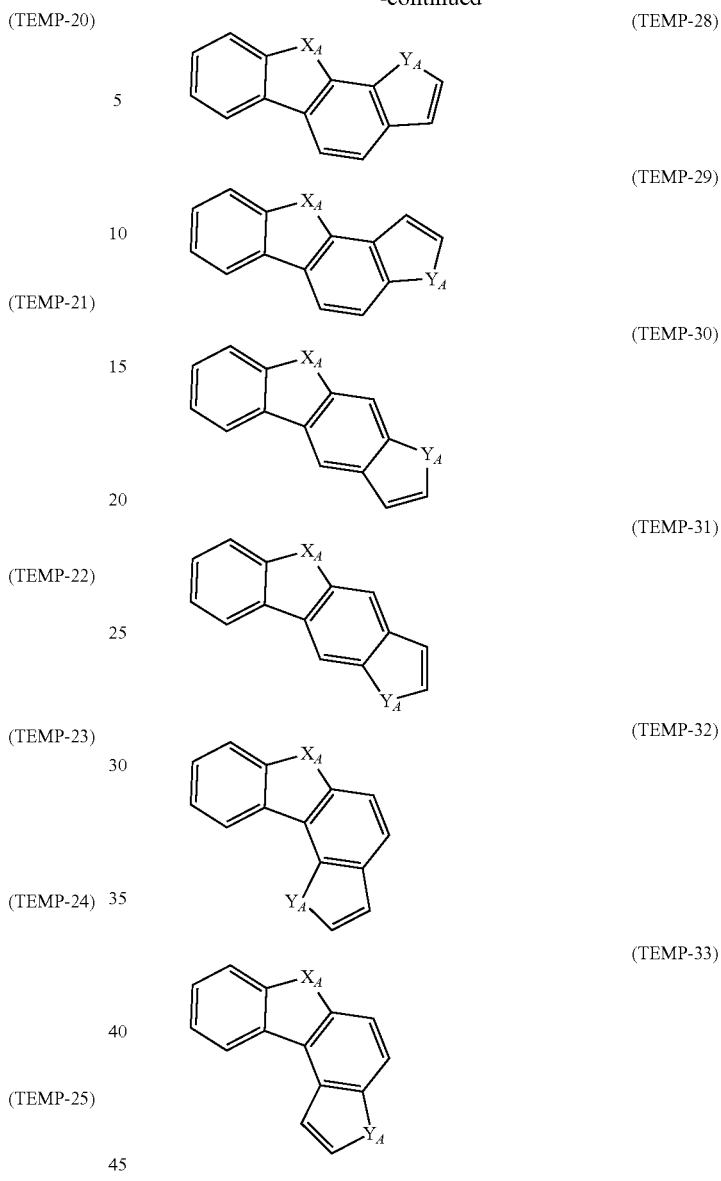

In the formulae (TEMP-16) to (TEMP-33), $X_A$ and $Y_A$ are each independently an oxygen atom, a sulfur atom, NH, or CH$_2$. However, at least one of $X_A$ and $Y_A$ is an ' ' oxygen atom, a sulfur atom, or NH.

When at least one of $X_A$ and $Y_A$ in the formulae (TEMP-16) to (TEMP-33) is NH or CH$_2$, the monovalent heterocyclic groups derived from the cyclic structures represented by the formulae (TEMP-16) to (TEMP-33) include a monovalent group derived by removing one hydrogen atom from NH, or CH$_2$.

Substituted Heterocyclic Groups Including Nitrogen Atom (Specific Example Group G2B1):

(9-phenyl)carbazolyl group, (9-biphenylyl)carbazolyl group, (9-phenyl)phenylcarbazolyl group, (9-naphthyl)carbazolyl group, diphenylcarbazole-9-yl group, phenylcarbazole-9-yl group, methylbenzimidazolyl group, ethylbenzimidazolyl group, phenyltriazinyl group, biphenylyltriazinyl group, diphenyltriazinyl group, phenylquinazolinyl group, and biphenylquinazolinyl group.

Substituted Heterocyclic Groups Including Oxygen Atom (Specific Example Group G2B2):
  phenyldibenzofuranyl group, methyldibenzofuranyl group, t-butyldibenzofuranyl group, and monovalent residue of spiro[9H-xanthene-9,9'-[9H]fluorene].
Substituted Heterocyclic Groups Including Sulfur Atom (Specific Example Group G2B3):
  phenyldibenzothiophenyl group, methyldibenzothiophenyl group, t-butyldibenzothiophenyl group, and monovalent residue of spiro[9H-thioxanthene-9,9'-[9H]fluorene].
Groups Obtained by Substituting at Least One Hydrogen Atom of Monovalent Heterocyclic Group Derived from Cyclic Structures Represented by Formulae (TEMP-16) to (TEMP-33) with Substituent (Specific Example Group G2B4):
  The "at least one hydrogen atom of a monovalent heterocyclic group" means at least one hydrogen atom selected from a hydrogen atom bonded to a ring carbon atom of the monovalent heterocyclic group, a hydrogen atom bonded to a nitrogen atom of at least one of $X_A$ or $Y_A$ in a form of NH, and a hydrogen atom of one of $X_A$ and $Y_A$ in a form of a methylene group ($CH_2$).
Substituted or Unsubstituted Alkyl Group
  Specific examples (specific example group G3) of the "substituted or unsubstituted alkyl group" mentioned herein include unsubstituted alkyl groups (specific example group G3A) and substituted alkyl groups (specific example group G3B below). (Herein, an unsubstituted alkyl group refers to an "unsubstituted alkyl group" in a "substituted or unsubstituted alkyl group," and a substituted alkyl group refers to a "substituted alkyl group" in a "substituted or unsubstituted alkyl group.") A simply termed "alkyl group" herein includes both of "unsubstituted alkyl group" and "substituted alkyl group."
  The "substituted alkyl group" refers to a group derived by substituting at least one hydrogen atom in an "unsubstituted alkyl group" with a substituent. Specific examples of the "substituted alkyl group" include a group derived by substituting at least one hydrogen atom of an "unsubstituted alkyl group" (specific example group G3A) below with a substituent, and examples of the substituted alkyl group (specific example group G3B) below. Herein, the alkyl group for the "unsubstituted alkyl group" refers to a chain alkyl group. Accordingly, the "unsubstituted alkyl group" include linear "unsubstituted alkyl group" and branched "unsubstituted alkyl group." It should be noted that the examples of the "unsubstituted alkyl group" and the "substituted alkyl group" mentioned herein are merely exemplary, and the "substituted alkyl group" mentioned herein includes a group derived by substituting a hydrogen atom bonded to a carbon atom of a skeleton of the "substituted alkyl group" in the specific example group G3B, and a group derived by substituting a hydrogen atom of a substituent of the "substituted alkyl group" in the specific example group G3B.
Unsubstituted Alkyl Group (Specific Example Group G3A):
  methyl group, ethyl group, n-propyl group, isopropyl group, n-butyl group, isobutyl group, s-butyl group, and t-butyl group.
Substituted Alkyl Group (Specific Example Group G3B):
  heptafluoropropyl group (including isomer thereof), pentafluoroethyl group, 2,2,2-trifluoroethyl group, and trifluoromethyl group.
Substituted or Unsubstituted Alkenyl Group
  Specific examples (specific example group G4) of the "substituted or unsubstituted alkenyl group" mentioned herein include unsubstituted alkenyl groups (specific example group G4A) and substituted alkenyl groups (specific example group G4B). (Herein, an unsubstituted alkenyl group refers to an "unsubstituted alkenyl group" in a "substituted or unsubstituted alkenyl group," and a substituted alkenyl group refers to a "substituted alkenyl group" in a "substituted or unsubstituted alkenyl group.") A simply termed "alkenyl group" herein includes both of "unsubstituted alkenyl group" and "substituted alkenyl group."
  The "substituted alkenyl group" refers to a group derived by substituting at least one hydrogen atom in an "unsubstituted alkenyl group" with a substituent. Specific examples of the "substituted alkenyl group" include an "unsubstituted alkenyl group" (specific example group G4A) substituted by a substituent, and examples of the substituted alkenyl group (specific example group G4B) below. It should be noted that the examples of the "unsubstituted alkenyl group" and the "substituted alkenyl group" mentioned herein are merely exemplary, and the "substituted alkenyl group" mentioned herein includes a group derived by substituting a hydrogen atom of a skeleton of the "substituted alkenyl group" in the specific example group G4B with a substituent, and a group derived by substituting a hydrogen atom of a substituent of the "substituted alkenyl group" in the specific example group G4B with a substituent.
Unsubstituted Alkenyl Group (Specific Example Group G4A):
  vinyl group, allyl group, 1-butenyl group, 2-butenyl group, and 3-butenyl group.
Substituted Alkenyl Group (Specific Example Group G4B):
  1,3-butanedienyl group, 1-methylvinyl group, 1-methylallyl group, 1,1-dimethylallyl group, 2-methylallyl group, and 1,2-dimethylallyl group.
Substituted or Unsubstituted Alkynyl Group
  Specific examples (specific example group G5) of the "substituted or unsubstituted alkynyl group" mentioned herein include unsubstituted alkynyl groups (specific example group G5A) below. (Herein, an unsubstituted alkynyl group refers to an "unsubstituted alkynyl group" in a "substituted or unsubstituted alkynyl group," and a substituted alkynyl group refers to a "substituted alkynyl group" in a "substituted or unsubstituted alkynyl group.") A simply termed "alkynyl group" herein includes both of "unsubstituted alkynyl group" and "substituted alkynyl group."
  The "substituted alkynyl group" refers to a group derived by substituting at least one hydrogen atom in an "unsubstituted alkynyl group" with a substituent. Specific examples of the "substituted alkynyl group" include a group derived by substituting at least one hydrogen atom of the "unsubstituted alkynyl group" (specific example group G5A) below with a substituent.
Unsubstituted Alkynyl Group (Specific Example Group G5A): Ethynyl Group
Substituted or Unsubstituted Cycloalkyl Group
  Specific examples (specific example group G6) of the "substituted or unsubstituted cycloalkyl group" mentioned herein include unsubstituted cycloalkyl groups (specific example group G6A) and substituted cycloalkyl groups (specific example group G6B). (Herein, an unsubstituted cycloalkyl group refers to an "unsubstituted cycloalkyl group" in a "substituted or unsubstituted cycloalkyl group," and a substituted cycloalkyl group refers to a "substituted cycloalkyl group" in a "substituted or unsubstituted cycloalkyl group.") A simply termed "cycloalkyl group" herein includes both of "unsubstituted cycloalkyl group" and "substituted cycloalkyl group."

The "substituted cycloalkyl group" refers to a group derived by substituting at least one hydrogen atom of an "unsubstituted cycloalkyl group" with a substituent. Specific examples of the "substituted cycloalkyl group" include a group derived by substituting at least one hydrogen atom of the "unsubstituted cycloalkyl group" (specific example group G6A) below with a substituent, and examples of the substituted cycloalkyl group (specific example group G6B) below. It should be noted that the examples of the "unsubstituted cycloalkyl group" and the "substituted cycloalkyl group" mentioned herein are merely exemplary, and the "substituted cycloalkyl group" mentioned herein includes a group derived by substituting at least one hydrogen atom bonded to a carbon atom of a skeleton of the "substituted cycloalkyl group" in the specific example group G6B with a substituent, and a group derived by substituting a hydrogen atom of a substituent of the "substituted cycloalkyl group" in the specific example group G6B with a substituent.

Unsubstituted Cycloalkyl Group (Specific Example Group G6A):

cyclopropyl group, cyclobutyl group, cyclopentyl group, cyclohexyl group, 1-adamantyl group, 2-adamantyl group, 1-norbornyl group, and 2-norbornyl group.

Substituted Cycloalkyl Group (Specific Example Group G6B): 4-Methylcyclohexyl Group Group Represented by —Si($R_{901}$)($R_{902}$)($R_{903}$)

Specific examples (specific example group G7) of the group represented herein by —Si($R_{901}$)($R_{902}$)($R_{903}$) include: —Si(G1)(G1)(G1); —Si(G1)(G2)(G2); —Si(G1)(G1)(G2); —Si(G2)(G2)(G2); —Si(G3)(G3)(G3); and —Si(G6)(G6)(G6).

Herein:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

A plurality of G1 in —Si(G1)(G1)(G1) are mutually the same or different.

A plurality of G2 in —Si(G1)(G2)(G2) are mutually the same or different.

A plurality of G1 in —Si(G1)(G1)(G2) are mutually the same or different.

A plurality of G2 in —Si(G2)(G2)(G2) are mutually the same or different.

The plurality of G3 in —Si(G3)(G3)(G3) are mutually the same or different.

A plurality of G6 in —Si(G6)(G6)(G6) are mutually the same or different.

Group Represented by —O—($R_{904}$)

Specific examples (specific example group G8) of a group represented by —O—($R_{904}$) herein include —O(G1); —O(G2); —O(G3); and —O(G6).

Herein:

G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —S—($R_{905}$)

Specific examples (specific example group G9) of a group represented herein by —S—($R_{905}$) include: —S(G1); —S(G2); —S(G3); and —S(G6).

Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

Group Represented by —N($R_{906}$)($R_{907}$)

Specific examples (specific example group G10) of a group represented herein by —N($R_{906}$)($R_{907}$) include: —N(G1)(G1); —N(G2)(G2); —N(G1)(G2); —N(G3)(G3); and —N(G6)(G6).

Herein: G1 represents a "substituted or unsubstituted aryl group" in the specific example group G1;

G2 represents a "substituted or unsubstituted heterocyclic group" in the specific example group G2;

G3 represents a "substituted or unsubstituted alkyl group" in the specific example group G3; and G6 represents a "substituted or unsubstituted cycloalkyl group" in the specific example group G6.

A plurality of G1 in —N(G1)(G1) are mutually the same or different.

A plurality of G2 in —N(G2)(G2) are mutually the same or different.

A plurality of G3 in —N(G3)(G3) are mutually the same or different.

A plurality of G6 in —N(G6)(G6)) are mutually the same or different.

Halogen Atom

Specific examples (specific example group G11) of "halogen atom" mentioned herein include a fluorine atom, chlorine atom, bromine atom, and iodine atom.

Substituted or Unsubstituted Fluoroalkyl Group

The "substituted or unsubstituted fluoroalkyl group" mentioned herein refers to a group derived by substituting at least one hydrogen atom bonded to at least one of carbon atoms forming an alkyl group in the "substituted or unsubstituted alkyl group" with a fluorine atom, and also includes a group (perfluoro group) derived by substituting all of hydrogen atoms bonded to carbon atoms forming the alkyl group in the "substituted or unsubstituted alkyl group" with fluorine atoms. An "unsubstituted fluoroalkyl group" has, unless otherwise specified herein, 1 to 50, preferably 1 to 30, more preferably 1 to 18 carbon atoms. The "substituted fluoroalkyl group" refers to a group derived by substituting at least one hydrogen atom in a "fluoroalkyl group" with a substituent. It should be noted that the examples of the "substituted fluoroalkyl group" mentioned herein includes a group derived by substituting at least one hydrogen atom bonded to a carbon atom of an alkyl chain of a "substituted fluoroalkyl group" with a substituent, and a group derived by substituting at least one hydrogen atom of a substituent of the "substituted fluoroalkyl group" with a substituent. Specific examples of the "substituted fluoroalkyl group" include a group derived by substituting at least one hydrogen atom of the "alkyl group" (specific example group G3) with a fluorine atom.

Substituted or Unsubstituted Haloalkyl Group

The "substituted or unsubstituted haloalkyl group" mentioned herein refers to a group derived by substituting at least one hydrogen atom bonded to carbon atoms forming the alkyl group in the "substituted or unsubstituted alkyl group" with a halogen atom, and also includes a group derived by substituting all hydrogen atoms bonded to carbon atoms forming the alkyl group in the "substituted or unsubstituted alkyl group" with halogen atoms. An "unsubstituted haloalkyl group" has, unless otherwise specified herein, 1 to 50, preferably 1 to 30, more preferably 1 to 18 carbon atoms. The "substituted haloalkyl group" refers to a group derived by substituting at least one hydrogen atom in a "haloalkyl group" with a substituent. It should be noted that the examples of the "substituted haloalkyl group" mentioned herein includes a group derived by substituting at least one hydrogen atom bonded to a carbon atom of an alkyl chain of a "substituted haloalkyl group" with a substituent, and a group derived by substituting at least one hydrogen atom of a substituent of the "substituted haloalkyl group" with a substituent. Specific examples of the "substituted haloalkyl group" include a group derived by substituting at least one hydrogen atom of the "alkyl group" (specific example group G3) with a halogen atom. The haloalkyl group is sometimes referred to as a halogenated alkyl group.

Substituted or Unsubstituted Alkoxy Group

Specific examples of a "substituted or unsubstituted alkoxy group" mentioned herein include a group represented by —O(G3), G3 being the "substituted or unsubstituted alkyl group" in the specific example group G3. An "unsubstituted alkoxy group" has, unless otherwise specified herein, 1 to 50, preferably 1 to 30, more preferably 1 to 18 carbon atoms.

Substituted or Unsubstituted Alkylthio Group

Specific examples of a "substituted or unsubstituted alkylthio group" mentioned herein include a group represented by —S(G3), G3 being the "substituted or unsubstituted alkyl group" in the specific example group G3. An "unsubstituted alkylthio group" has, unless otherwise specified herein, 1 to 50, preferably 1 to 30, more preferably 1 to 18 carbon atoms.

Substituted or Unsubstituted Aryloxy Group

Specific examples of a "substituted or unsubstituted aryloxy group" mentioned herein include a group represented by —O(G1), G1 being the "substituted or unsubstituted aryl group" in the specific example group G1. An "unsubstituted aryloxy group" has, unless otherwise specified herein, 6 to 50, preferably 6 to 30, more preferably 6 to 18 ring carbon atoms.

Substituted or Unsubstituted Arylthio Group

Specific examples of a "substituted or unsubstituted arylthio group" mentioned herein include a group represented by —S(G1), G1 being the "substituted or unsubstituted aryl group" in the specific example group G1. An "unsubstituted arylthio group" has, unless otherwise specified herein, 6 to 50, preferably 6 to 30, more preferably 6 to 18 ring carbon atoms.

Substituted or Unsubstituted Trialkylsilyl Group

Specific examples of a "trialkylsilyl group" mentioned herein include a group represented by —Si(G3)(G3)(G3), G3 being the "substituted or unsubstituted alkyl group" in the specific example group G3. The plurality of G3 in —Si(G3)(G3)(G3) are mutually the same or different. Each of the alkyl groups in the "trialkylsilyl group" has, unless otherwise specified herein, 1 to 50, preferably 1 to 20, more preferably 1 to 6 carbon atoms.

Substituted or Unsubstituted Aralkyl Group

Specific examples of a "substituted or unsubstituted aralkyl group" mentioned herein include a group represented by (G3)-(G1), G3 being the "substituted or unsubstituted alkyl group" in the specific example group G3, G1 being the "substituted or unsubstituted aryl group" in the specific example group G1. Accordingly, the "aralkyl group" is a group derived by substituting a hydrogen atom of the "alkyl group" with a substituent in a form of the "aryl group," which is an example of the "substituted alkyl group." An "unsubstituted aralkyl group," which is an "unsubstituted alkyl group" substituted by an "unsubstituted aryl group," has, unless otherwise specified herein, 7 to 50 carbon atoms, preferably 7 to 30 carbon atoms, more preferably 7 to 18 carbon atoms.

Specific examples of the "substituted or unsubstituted aralkyl group" include a benzyl group, 1-phenylethyl group, 2-phenylethyl group, 1-phenylisopropyl group, 2-phenylisopropyl group, phenyl-t-butyl group, a-naphthylmethyl group, 1-α-naphthylethyl group, 2-α-naphthylethyl group, 1-α-naphthylisopropyl group, 2-α-naphthylisopropyl group, p-naphthylmethyl group, 1-β-naphthylethyl group, 2-β-naphthylethyl group, 1-β-naphthylisopropyl group, and 2-β-naphthylisopropyl group.

Preferable examples of the substituted or unsubstituted aryl group mentioned herein include, unless otherwise specified herein, a phenyl group, p-biphenyl group, m-biphenyl group, o-biphenyl group, p-terphenyl-4-yl group, p-terphenyl-3-yl group, p-terphenyl-2-yl group, m-terphenyl-4-yl group, m-terphenyl-3-yl group, m-terphenyl-2-yl group, o-terphenyl-4-yl group, o-terphenyl-3-yl group, o-terphenyl-2-yl group, 1-naphthyl group, 2-naphthyl group, anthryl group, phenanthryl group, pyrenyl group, chrysenyl group, triphenylenyl group, fluorenyl group, 9,9'-spirobifluorenyl group, 9,9-dimethylfluorenyl group, and 9,9-diphenylfluorenyl group.

Preferable examples of the substituted or unsubstituted heterocyclic group mentioned herein include, unless otherwise specified herein, a pyridyl group, pyrimidinyl group, triazinyl group, quinolyl group, isoquinolyl group, quinazolinyl group, benzimidazolyl group, phenanthrolinyl group, carbazolyl group (1-carbazolyl group, 2-carbazolyl group, 3-carbazolyl group, 4-carbazolyl group, or 9-carbazolyl group), benzocarbazolyl group, azacarbazolyl group, diazacarbazolyl group, dibenzofuranyl group, naphthobenzofuranyl group, azadibenzofuranyl group, diazadibenzofuranyl group, dibenzothiophenyl group, naphthobenzothiophenyl group, azadibenzothiophenyl group, diazadibenzothiophenyl group, (9-phenyl)carbazolyl group ((9-phenyl)carbazole-1-yl group, (9-phenyl)carbazole-2-yl group, (9-phenyl)carbazole-3-yl group, or (9-phenyl)carbazole-4-yl group), (9-biphenylyl)carbazolyl group, (9-phenyl)phenylcarbazolyl group, diphenylcarbazole-9-yl group, phenylcarbazole-9-yl group, phenyltriazinyl group, biphenylyltriazinyl group, diphenyltriazinyl group, phenyldibenzofuranyl group, and phenyldibenzothiophenyl group.

The carbazolyl group mentioned herein is, unless otherwise specified herein, specifically a group represented by one of formulae below.

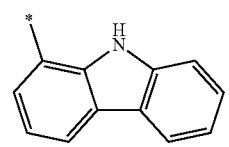

(TEMP-Cz1)

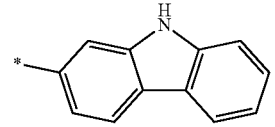

(TEMP-Cz2)

-continued (TEMP-Cz3)
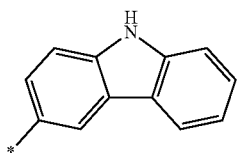

(TEMP-Cz4)
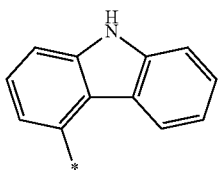

(TEMP-Cz5)
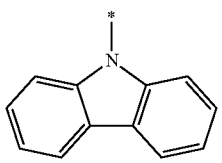

The (9-phenyl)carbazolyl group mentioned herein is, unless otherwise specified herein, specifically a group represented by one of formulae below.

(TEMP-Cz6)
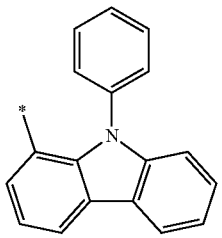

(TEMP-Cz7)
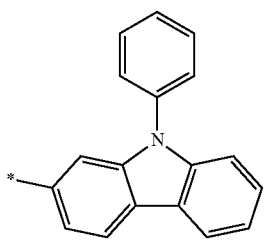

(TEMP-Cz8)
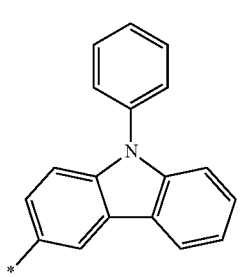

(TEMP-Cz9)
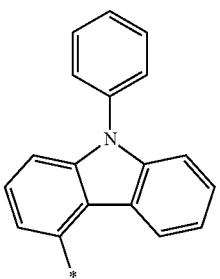

In the formulae (TEMP-Cz1) to (TEMP-Cz9), * represents a bonding position.

The dibenzofuranyl group and dibenzothiophenyl group mentioned herein are, unless otherwise specified herein, each specifically represented by one of formulae below.

(TEMP-34)
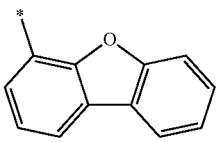

(TEMP-35)
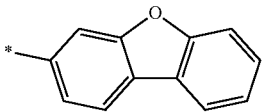

(TEMP-36)
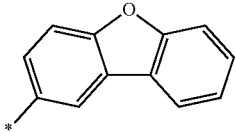

(TEMP-37)
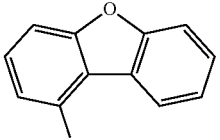

(TEMP-38)
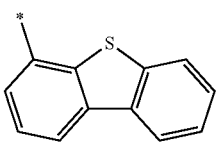

(TEMP-39)
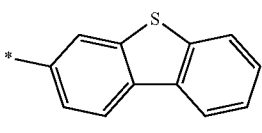

(TEMP-40)
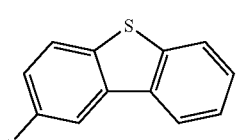

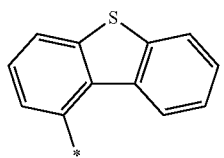
(TEMP-41)

In the formulae (TEMP-34) to (TEMP-41), * represents a bonding position.

Preferable examples of the substituted or unsubstituted alkyl group mentioned herein include, unless otherwise specified herein, a methyl group, ethyl group, propyl group, isopropyl group, n-butyl group, isobutyl group, and t-butyl group.

Substituted or Unsubstituted Arylene Group

The "substituted or unsubstituted arylene group" mentioned herein is, unless otherwise specified herein, a divalent group derived by removing one hydrogen atom on an aryl ring of the "substituted or unsubstituted aryl group." Specific examples of the "substituted or unsubstituted arylene group" (specific example group G12) include a divalent group derived by removing one hydrogen atom on an aryl ring of the "substituted or unsubstituted aryl group" in the specific example group G1.

Substituted or Unsubstituted Divalent Heterocyclic Group

The "substituted or unsubstituted divalent heterocyclic group" mentioned herein is, unless otherwise specified herein, a divalent group derived by removing one hydrogen atom on a heterocyclic ring of the "substituted or unsubstituted heterocyclic group." Specific examples of the "substituted or unsubstituted heterocyclic group" (specific example group G13) include a divalent group derived by removing one hydrogen atom on a heterocyclic ring of the "substituted or unsubstituted heterocyclic group" in the specific example group G2.

Substituted or Unsubstituted Alkylene Group

The "substituted or unsubstituted alkylene group" mentioned herein is, unless otherwise specified herein, a divalent group derived by removing one hydrogen atom on an alkyl ring of the "substituted or unsubstituted alkyl group." Specific examples of the "substituted or unsubstituted alkylene group" (specific example group G14) include a divalent group derived by removing one hydrogen atom on an alkyl ring of the "substituted or unsubstituted alkyl group" in the specific example group G3.

The substituted or unsubstituted arylene group mentioned herein is, unless otherwise specified herein, preferably any one of groups represented by formulae (TEMP-42) to (TEMP-68) below.

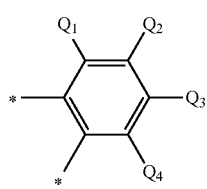
(TEMP-42)

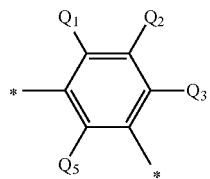
(TEMP-43)

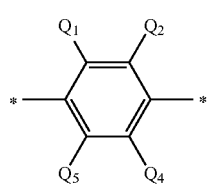
(TEMP-44)

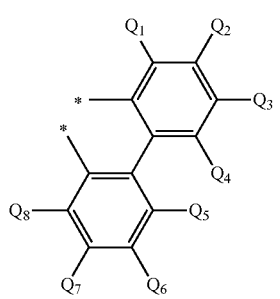
(TEMP-45)

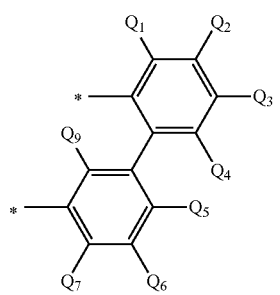
(TEMP-46)

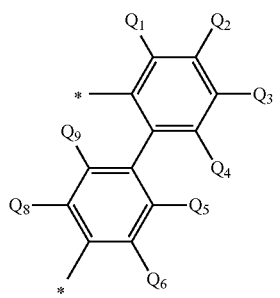
(TEMP-47)

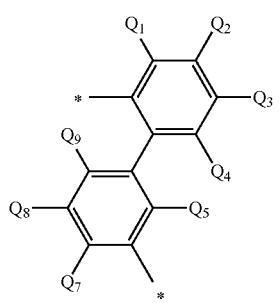
(TEMP-48)

(TEMP-49)
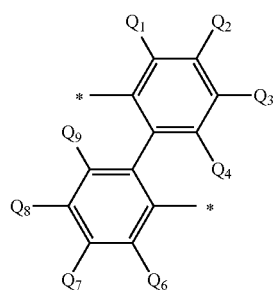
(TEMP-50)
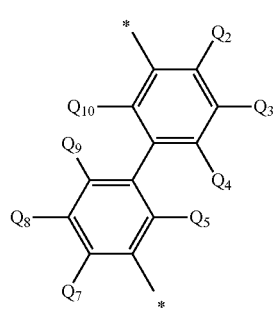
(TEMP-51)
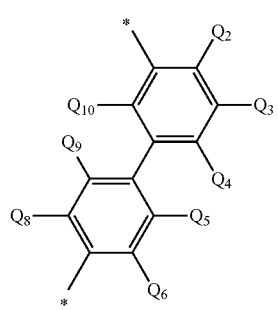
(TEMP-52)
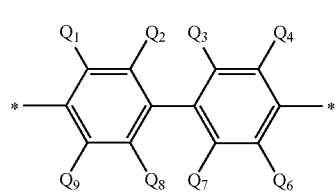
In the formulae (TEMP-42) to (TEMP-52), $Q_1$ to $Q_{10}$ each independently are a hydrogen atom or a substituent.
In the formulae (TEMP-42) to (TEMP-52), * represents a bonding position.
(TEMP-53)
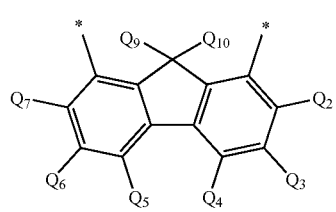
(TEMP-54)
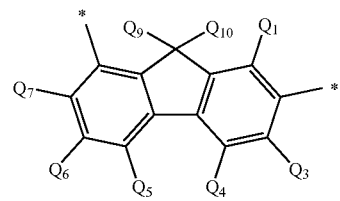
(TEMP-55)
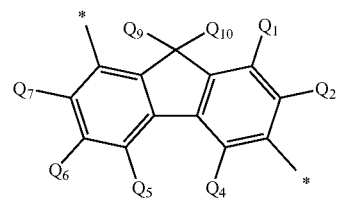
(TEMP-56)
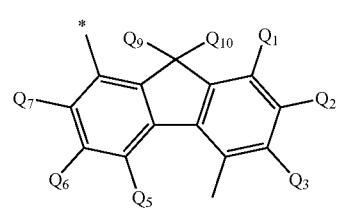
(TEMP-57)
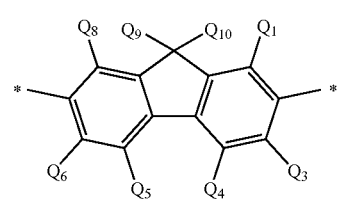
(TEMP-58)
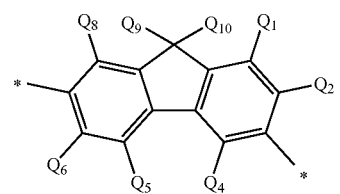
(TEMP-59)
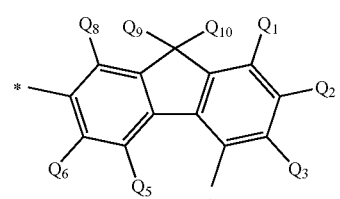
(TEMP-60)
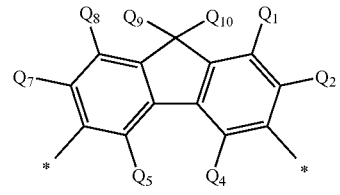

(TEMP-61)

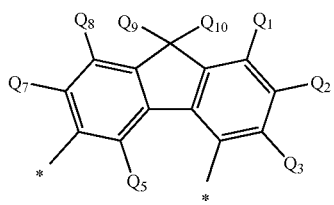

(TEMP-62)

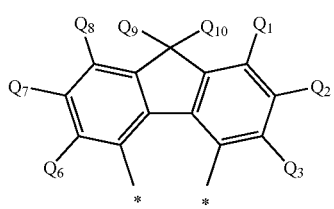

In the formulae (TEMP-53) to (TEMP-62), $Q_1$ to $Q_{10}$ each independently are a hydrogen atom or a substituent.

In the formulae, $Q_9$ and $Q_{10}$ may be mutually bonded through a single bond to form a ring.

In the formulae (TEMP-53) to (TEMP-62), * represents a bonding position.

(TEMP-67)

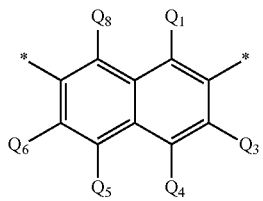

(TEMP-68)

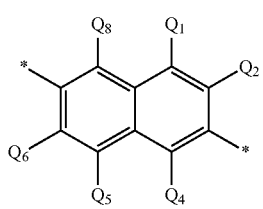

In the formulae (TEMP-63) to (TEMP-68), $Q_1$ to $Q_8$ each independently are a hydrogen atom or a substituent.

In the formulae (TEMP-63) to (TEMP-68), * represents a bonding position. The substituted or unsubstituted divalent heterocyclic group mentioned herein is, unless otherwise specified herein, preferably a group represented by any one of formulae (TEMP-69) to (TEMP-102) below.

(TEMP-63)

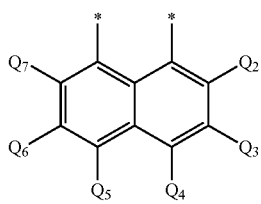

(TEMP-64)

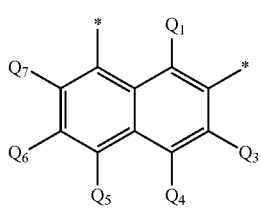

(TEMP-65)

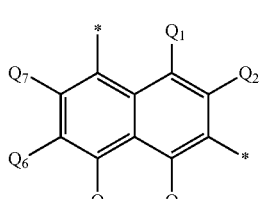

(TEMP-66)

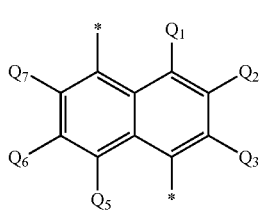

(TEMP-69)

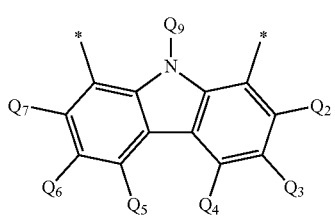

(TEMP-70)

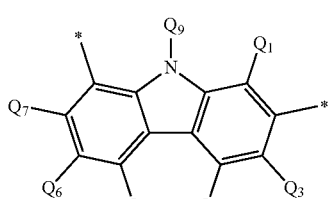

(TEMP-71)

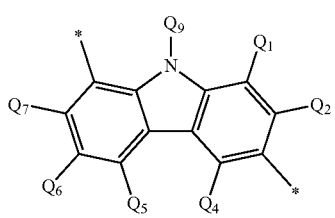

(TEMP-72)

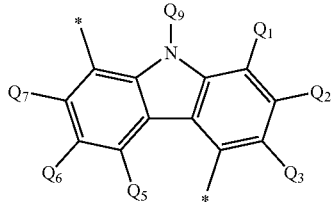

(TEMP-73)
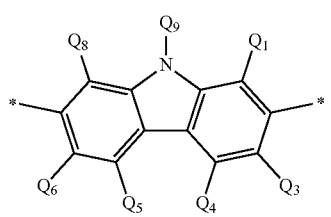
(TEMP-74)
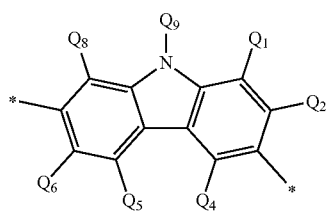
(TEMP-75)
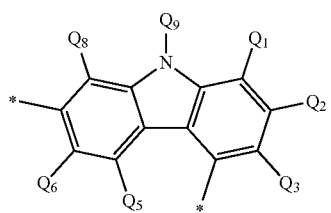
(TEMP-76)
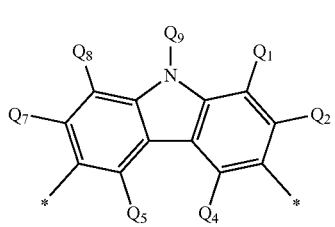
(TEMP-77)
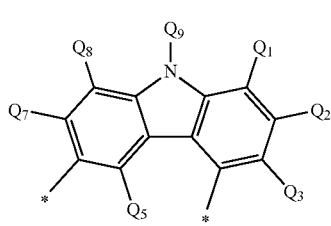
(TEMP-78)
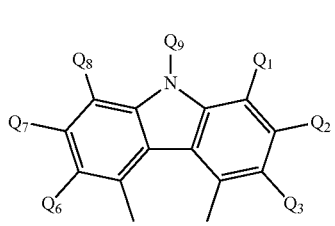
(TEMP-79)
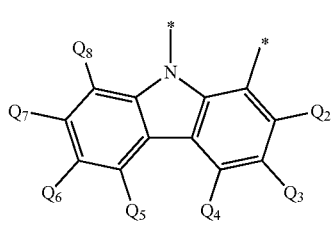
(TEMP-80)
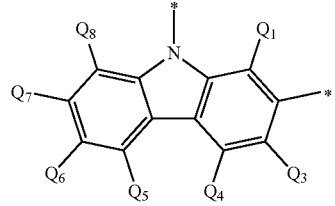
(TEMP-81)
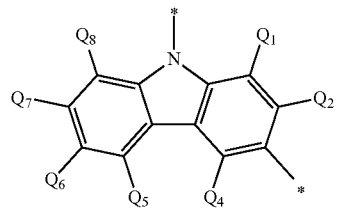
(TEMP-82)
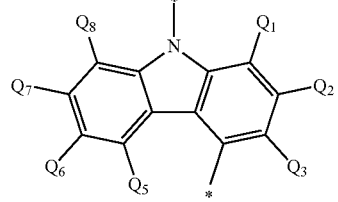
In the formulae (TEMP-69) to (TEMP-82), $Q_1$ to $Q_9$ each independently are a hydrogen atom or a substituent.
(TEMP-83)
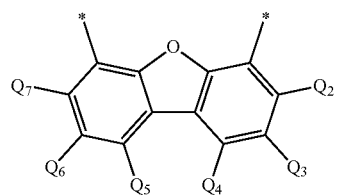
(TEMP-84)
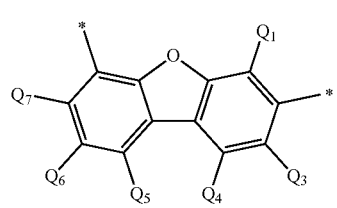
(TEMP-85)
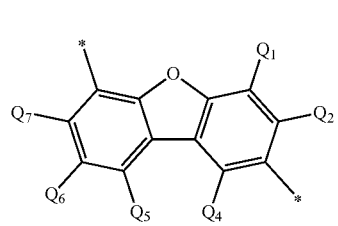

(TEMP-86)
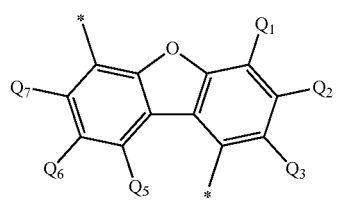
(TEMP-87)
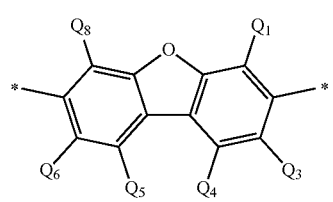
(TEMP-88)
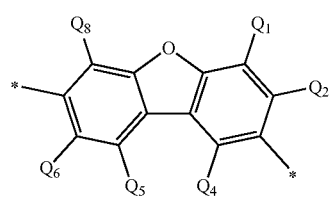
(TEMP-89)
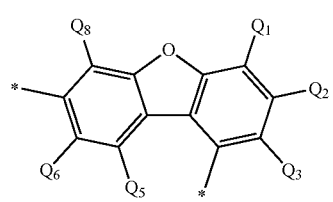
(TEMP-90)
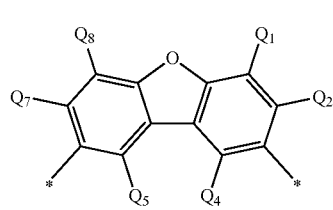
(TEMP-91)
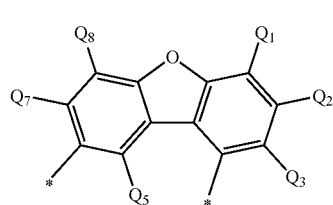
(TEMP-92)
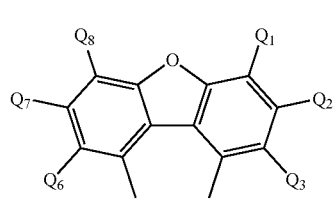
(TEMP-93)
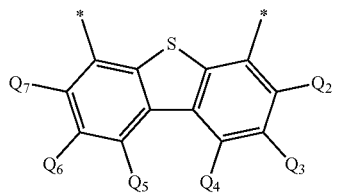
(TEMP-94)
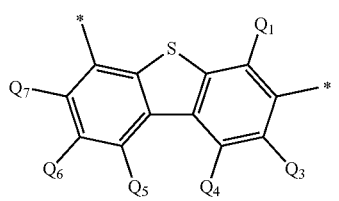
(TEMP-95)
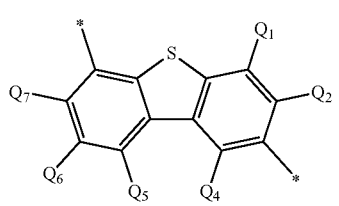
(TEMP-96)
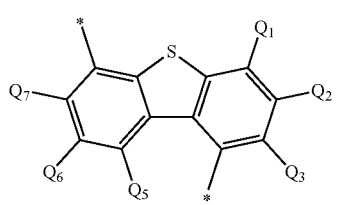
(TEMP-97)
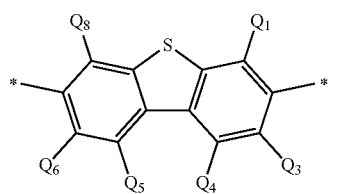
(TEMP-98)
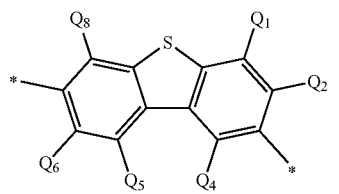
(TEMP-99)
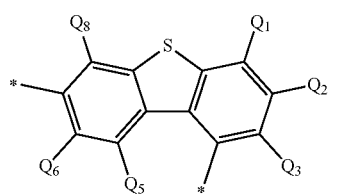
(TEMP-100)
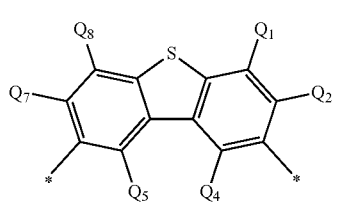

-continued (TEMP-101)

(TEMP-102)

In the formulae (TEMP-83) to (TEMP-102), $Q_1$ to $Q_8$ each independently are a hydrogen atom or a substituent.

The substituent mentioned herein has been described above.

Instance of "Bonded to Form Ring"

Instances where "at least one combination of adjacent two or more (of . . . ) are mutually bonded to form a substituted or unsubstituted monocyclic ring, mutually bonded to form a substituted or unsubstituted fused ring, or not mutually bonded" mentioned herein refer to instances where "at least one combination of adjacent two or more (of . . . ) are mutually bonded to form a substituted or unsubstituted monocyclic ring, "at least one combination of adjacent two or more (of . . . ) are mutually bonded to form a substituted or unsubstituted fused ring," and "at least one combination of adjacent two or more (of . . . ) are not mutually bonded."

Instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (these instances will be sometimes collectively referred to as an instance of "bonded to form a ring" hereinafter) will be described below. An anthracene compound having a basic skeleton in a form of an anthracene ring and represented by a formula (TEMP-103) below will be used as an example for the description.

(TEMP-103)

For instance, when "at least one combination of adjacent two or more of" $R_{921}$ to $R_{930}$ "are mutually bonded to form a ring," the pair of adjacent ones of $R_{921}$ to $R_{930}$ (i.e. the combination at issue) is a pair of $R_{921}$ and a pair of $R_{922}$, $R_{922}$ and $R_{923}$, a pair of $R_{923}$ and $R_{924}$, a pair of $R_{924}$ and $R_{930}$, a pair of $R_{930}$ and $R_{925}$, a pair of $R_{925}$ and $R_{926}$, a pair of $R_{926}$ and $R_{927}$, a pair of $R_{927}$ and $R_{928}$, a pair of $R_{928}$ and $R_{929}$, or a pair of $R_{929}$ and $R_{921}$.

The term "at least one combination" means that two or more of the above combinations of adjacent two or more of $R_{921}$ to $R_{930}$ may simultaneously form rings. For instance, when $R_{921}$ and $R_{922}$ are mutually bonded to form a ring $Q_A$ and $R_{925}$ and $R_{926}$ are simultaneously mutually bonded to form a ring $Q_B$, the anthracene compound represented by the formula (TEMP-103) is represented by a formula (TEMP-104) below.

(TEMP-104)

The instance where the "combination of adjacent two or more" form a ring means not only an instance where the "two" adjacent components are bonded but also an instance where adjacent "three or more" are bonded. For instance, $R_{921}$ and $R_{922}$ are mutually bonded to form a ring $Q_A$ and $R_{922}$, $R_{923}$ are mutually bonded to form a ring $Q_C$, and mutually adjacent three components ($R_{921}$, $R_{922}$ and $R_{923}$) are mutually bonded to form a ring fused to the anthracene basic skeleton. In this case, the anthracene compound represented by the formula (TEMP-103) is represented by a formula (TEMP-105) below. In the formula (TEMP-105) below, the ring $Q_A$ and the ring $Q_C$ share $R_{922}$.

(TEMP-105)

The formed "monocyclic ring" or "fused ring" may be, in terms of the formed ring in itself, a saturated ring or an unsaturated ring. When the "combination of adjacent two" form a "monocyclic ring" or a "fused ring," the "monocyclic ring" or "fused ring" may be a saturated ring or an unsaturated ring. For instance, the ring $Q_A$ and the ring $Q_B$ formed in the formulae (TEMP-104) and (TEMP-105) are each independently a "monocyclic ring" or a "fused ring." Further, the ring $Q_A$ and the ring $Q_C$ formed in the formula (TEMP-105) are each a "fused ring." The ring $Q_A$ and the ring $Q_C$ in the formula (TEMP-105) are fused to form a fused ring. When the ring $Q_A$ in the formula (TEMP-104) is a benzene ring, the ring $Q_A$ is a monocyclic ring. When the ring $Q_A$ in the formula (TEMP-104) is a naphthalene ring, the ring $Q_A$ is a fused ring.

The "unsaturated ring" represents an aromatic hydrocarbon ring or an aromatic heterocycle. The "saturated ring" represents an aliphatic hydrocarbon ring or a non-aromatic heterocycle.

Specific examples of the aromatic hydrocarbon ring include a ring formed by terminating a bond of a group in the specific example of the specific example group G1 with a hydrogen atom.

Specific examples of the aromatic heterocyclic ring include a ring formed by terminating a bond of an aromatic heterocyclic group in the specific example of the specific example group G2 with a hydrogen atom.

Specific examples of the aliphatic hydrocarbon ring include a ring formed by terminating a bond of a group in the specific example of the specific example group G6 with a hydrogen atom.

The phrase "to form a ring" herein means that a ring is formed only by a plurality of atoms of a basic skeleton, or by a combination of a plurality of atoms of the basic skeleton and one or more optional atoms. For instance, the ring $Q_A$ formed by mutually bonding $R_{921}$ and $R_{922}$ shown in the formula (TEMP-104) is a ring formed by a carbon atom of the anthracene skeleton bonded with $R_{921}$, a carbon atom of the anthracene skeleton bonded with $R_{922}$, and one or more optional atoms. Specifically, when the ring $Q_A$ is a monocyclic unsaturated ring formed by $R_{921}$ and $R_{922}$, the ring formed by a carbon atom of the anthracene skeleton bonded with $R_{921}$, a carbon atom of the anthracene skeleton bonded with $R_{922}$, and four carbon atoms is a benzene ring.

The "optional atom" is, unless otherwise specified herein, preferably at least one atom selected from the group consisting of a carbon atom, nitrogen atom, oxygen atom, and sulfur atom. A bond of the optional atom (e.g. a carbon atom and a nitrogen atom) not forming a ring may be terminated by a hydrogen atom or the like or may be substituted by an "optional substituent" described later. When the ring includes an optional element other than carbon atom, the resultant ring is a heterocycle.

The number of "one or more optional atoms" forming the monocyclic ring or fused ring is, unless otherwise specified herein, preferably in a range from 2 to 15, more preferably in a range from 3 to 12, further preferably in a range from 3 to 5.

Unless otherwise specified herein, the ring, which may be a "monocyclic ring" or "fused ring," is preferably a "monocyclic ring."

Unless otherwise specified herein, the ring, which may be a "saturated ring" or "unsaturated ring," is preferably an "unsaturated ring."

Unless otherwise specified herein, the "monocyclic ring" is preferably a benzene ring.

Unless otherwise specified herein, the "unsaturated ring" is preferably a benzene ring.

When "at least one combination of adjacent two or more" (of . . . ) are "mutually bonded to form a substituted or unsubstituted monocyclic ring" or "mutually bonded to form a substituted or unsubstituted fused ring," unless otherwise specified herein, at least one combination of adjacent two or more of components are preferably mutually bonded to form a substituted or unsubstituted "unsaturated ring" formed of a plurality of atoms of the basic skeleton, and 1 to 15 atoms of at least one element selected from the group consisting of carbon, nitrogen, oxygen and sulfur.

When the "monocyclic ring" or the "fused ring" has a substituent, the substituent is the substituent described in later-described "optional substituent." When the "monocyclic ring" or the "fused ring" has a substituent, specific examples of the substituent are the substituents described in the above under the subtitle "Substituents Mentioned Herein."

When the "saturated ring" or the "unsaturated ring" has a substituent, the substituent is, for instance, the substituent described in later-described "optional substituent." When the "monocyclic ring" or the "fused ring" has a substituent, specific examples of the substituent are the substituents described in the above under the subtitle "Substituents Mentioned Herein."

The above is the description for the instances where "at least one combination of adjacent two or more (of . . . ) are mutually bonded to form a substituted or unsubstituted monocyclic ring" and "at least one combination of adjacent two or more (of . . . ) are mutually bonded to form a substituted or unsubstituted fused ring" mentioned herein (sometimes referred to as an instance "bonded to form a ring".

Substituent Meant by "Substituted or Unsubstituted"

In an exemplary embodiment herein, the substituent meant by the phrase "substituted or unsubstituted" (sometimes referred to as an "optional substituent" hereinafter) is, for instance, a group selected from the group consisting of an unsubstituted alkyl group having 1 to 50 carbon atoms, an unsubstituted alkenyl group having 2 to 50 carbon atoms, an unsubstituted alkynyl group having 2 to 50 carbon atoms, an unsubstituted cycloalkyl group having 3 to 50 ring carbon atoms, —Si($R_{901}$)($R_{902}$)($R_{903}$), —O—($R_{904}$), —S—($R_{905}$), —N($R_{906}$)($R_{907}$), a halogen atom, a cyano group, a nitro group, an unsubstituted aryl group having 6 to 50 ring carbon atoms, and an unsubstituted heterocyclic group having 5 to 50 ring atoms.

Herein, $R_{901}$ to $R_{907}$ are each independently a hydrogen atom, a substituted or unsubstituted alkyl group having 1 to 50 carbon atoms, a substituted or unsubstituted cycloalkyl group having 3 to 50 ring carbon atoms, a substituted or unsubstituted aryl group having 6 to 50 ring carbon atoms, or a substituted or unsubstituted heterocyclic group having 5 to 50 ring atoms.

When two or more $R_{901}$ are present, the two or more $R_{901}$ are mutually the same or different.

When two or more $R_{902}$ are present, the two or more $R_{902}$ are mutually the same or different.

When two or more $R_{903}$ are present, the two or more $R_{903}$ are mutually the same or different.

When two or more $R_{904}$ are present, the two or more $R_{904}$ are mutually the same or different;

When two or more $R_{905}$ are present, the two or more $R_{905}$ are mutually the same or different.

When two or more $R_{906}$ are present, the two or more $R_{906}$ are mutually the same or different; and When two or more $R_{907}$ are present, the two or more $R_{907}$ are mutually the same or different.

In an exemplary embodiment, the substituent meant by "substituted or unsubstituted" is selected from the group consisting of an alkyl group having 1 to 50 carbon atoms, an aryl group having 6 to 50 ring carbon atoms, and a heterocyclic group having 5 to 50 ring atoms.

In an exemplary embodiment, the substituent meant by "substituted or unsubstituted" is selected from the group consisting of an alkyl group having 1 to 18 carbon atoms, an aryl group having 6 to 18 ring carbon atoms, and a heterocyclic group having 5 to 18 ring atoms.

Specific examples of the above optional substituent are the same as the specific examples of the substituent described in the above under the subtitle "Substituent Mentioned Herein."

Unless otherwise specified herein, adjacent ones of the optional substituents may form a "saturated ring" or an "unsaturated ring," preferably a substituted or unsubstituted saturated five-membered ring, a substituted or unsubstituted saturated six-membered ring, a substituted or unsubstituted saturated five-membered ring, or a substituted or unsubstituted unsaturated six-membered ring, more preferably a benzene ring.

Unless otherwise specified herein, the optional substituent may further include a substituent. Examples of the substituent for the optional substituent are the same as the examples of the optional substituent.

Herein, numerical ranges represented by "AA to BB" represents a range whose lower limit is the value (AA) recited before "to" and whose upper limit is the value (BB) recited after "to."

First Exemplary Embodiment

Compound

A compound according to the first exemplary embodiment is represented by a formula (1) below. A compound according to the first exemplary embodiment is sometimes referred to as the compound represented by the formula (1).

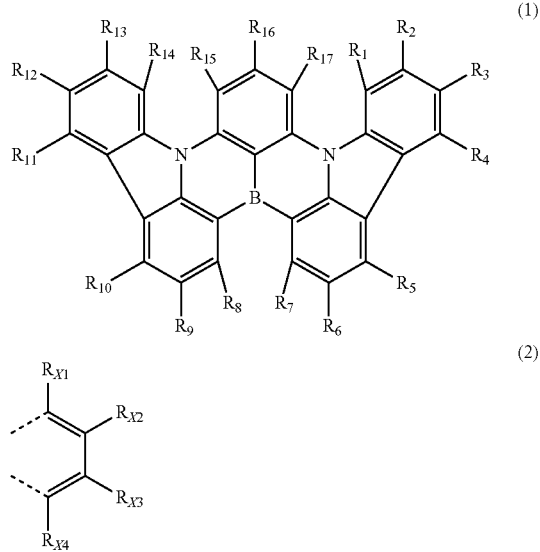

In the formula (1): at least one combination of adjacent two or more of $R_1$ to $R_{17}$ are mutually bonded to form a substituted or unsubstituted monocyclic ring, mutually bonded to form a substituted or unsubstituted fused ring, or not mutually bonded;

at least one combination of adjacent two or more of $R_1$ to $R_{17}$ are mutually bonded to form a ring represented by a formula (2), in which a dotted line in the formula (2) means a bonding position;

$R_{X1}$ to $R_{X4}$, and $R_1$ to $R_{17}$ neither forming the substituted or unsubstituted monocyclic ring nor forming the substituted or unsubstituted fused ring and not forming the ring represented by the formula (2) each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aralkyl group having 7 to 50 carbon atoms, a group represented by —Si($R_{911}$)($R_{912}$)($R_{913}$), a group represented by —O—($R_{914}$), a group represented by —S—($R_{915}$), a group represented by —N($R_{916}$)($R_{917}$), a group represented by —C(=O)$R_{918}$, a group represented by —COO$R_{919}$, a halogen atom, a cyano group, a nitro group, a substituted or unsubstituted aryl group having 6 to 50 ring carbon atoms, or a substituted or unsubstituted heterocyclic group having 5 to 50 ring atoms;

at least one of $R_{15}$ to $R_{17}$ represents a substituted or unsubstituted aryl group having 6 to 50 ring carbon atoms, or a substituted or unsubstituted heterocyclic group having 5 to 50 ring atoms;

when a plurality of $R_{X1}$ are present, the plurality of $R_{X1}$ are mutually the same or different;

when a plurality of $R_{X2}$ are present, the plurality of $R_{X2}$ are mutually the same or different;

when a plurality of $R_{X3}$ are present, the plurality of $R_{X3}$ are mutually the same or different;

when a plurality of $R_{X4}$ are present, the plurality of $R_{X4}$ are mutually the same or different;

$R_{911}$ to $R_{919}$ are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms;

when a plurality of $R_{911}$ are present, the plurality of $R_{911}$ are mutually the same or different;

when a plurality of $R_{912}$ are present, the plurality of $R_{912}$ are mutually the same or different;

when a plurality of $R_{913}$ are present, the plurality of $R_{913}$ are mutually the same or different;

when a plurality of $R_{914}$ are present, the plurality of $R_{914}$ are mutually the same or different;

when a plurality of $R_{915}$ are present, the plurality of $R_{915}$ are mutually the same or different;

when a plurality of $R_{916}$ are present, the plurality of $R_{916}$ are mutually the same or different;

when a plurality of $R_{917}$ are present, the plurality of $R_{917}$ are mutually the same or different;

when a plurality of $R_{918}$ are present, the plurality of $R_{918}$ are mutually the same or different; and when a plurality of $R_{919}$ are present, the plurality of $R_{919}$ are mutually the same or different.

In the compound according to the exemplary embodiment, it is preferable that at least one pair of a pair of $R_2$ and $R_3$, a pair of $R_6$ and $R_7$, a pair of $R_8$ and $R_9$, and a pair of $R_{12}$ and $R_{13}$ are bonded to each other to form the ring represented by the formula (2).

In the compound according to the exemplary embodiment, it is preferable that the pair of $R_6$ and $R_7$ and the pair of $R_8$ and $R_9$ do not simultaneously form the ring represented by the formula (2).

The compound according to the exemplary embodiment in which the pair of $R_2$ and $R_3$ are bonded to each other to form the ring represented by the formula (2) is represented by a formula (3).

The compound according to the exemplary embodiment is also preferably represented by the formula (3), a formula (4), a formula (5), or a formula (6).

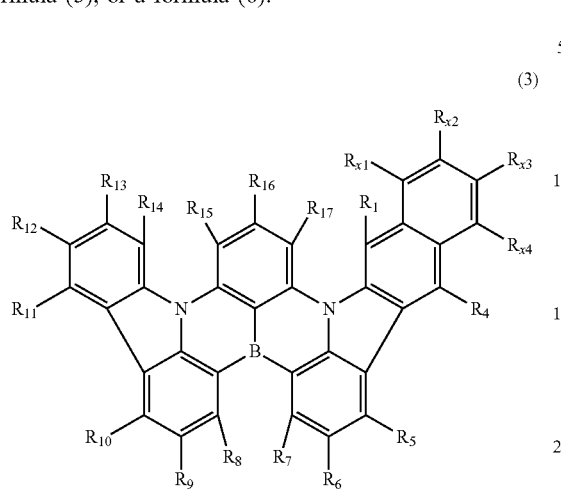

(3)

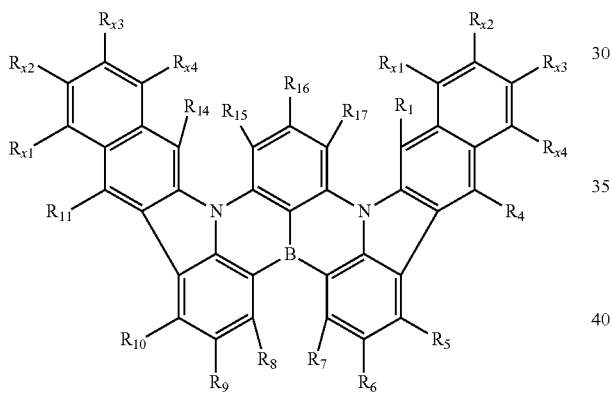

(4)

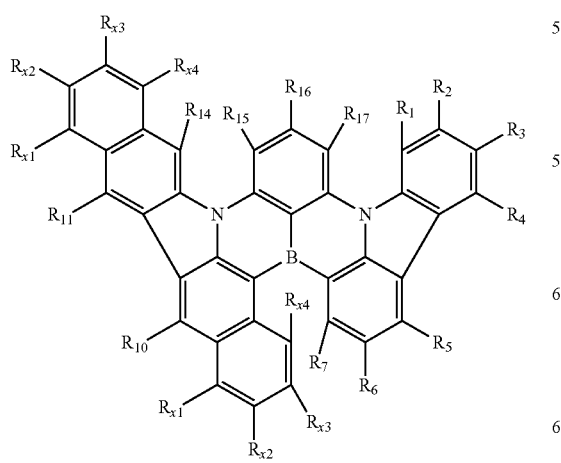

(5)

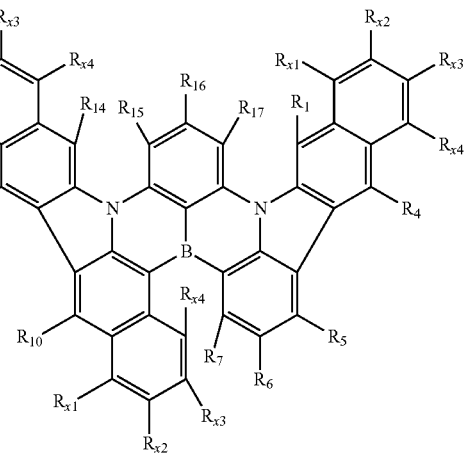

(6)

In the formulae (3) to (6), $R_1$ to $R_{17}$ and $R_{X1}$ to $R_{X4}$ each independently represent the same as those defined in the formula (1).

The compound according to the exemplary embodiment is also preferably represented by a formula (7) or a formula (8).

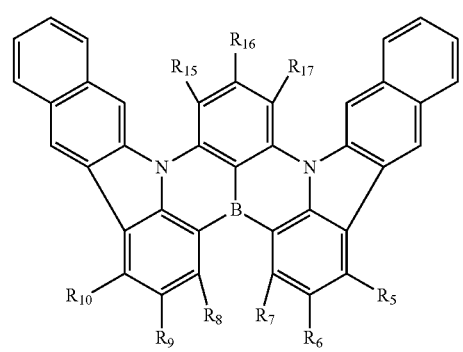

(7)

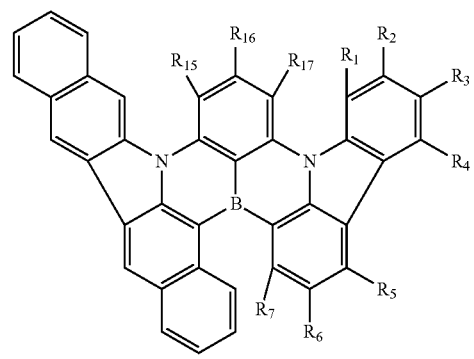

(8)

In the formulae (7) and (8), $R_1$ to $R_{10}$ and $R_{15}$ to $R_{17}$ each independently represent the same as those defined in the formula (1).

The compound according to the exemplary embodiment is also preferably represented by a formula (9) or a formula (10).

(9)

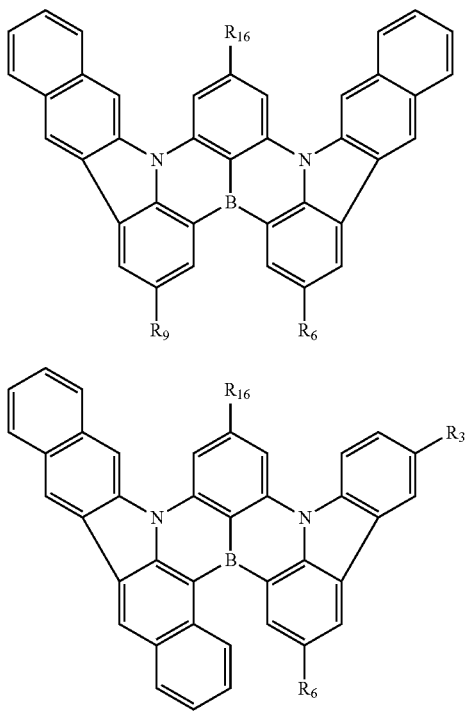

(10)

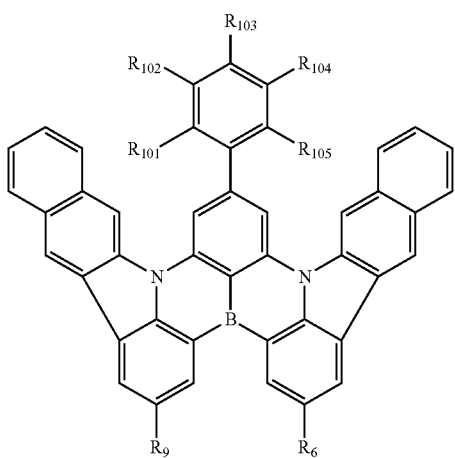

In the formulae (9) and (10), $R_3$, $R_6$, $R_9$, and $R_{16}$ each independently represent the same as those defined in the formula (1).

In the formula (9) or the formula (10), it is preferable that $R_3$, $R_6$ and $R_9$ are each independently a hydrogen atom, a substituted or unsubstituted alkyl group having 1 to 25 carbon atoms, or a substituted or unsubstituted aryl group having 6 to 25 ring carbon atoms, and $R_{16}$ is a substituted or unsubstituted aryl group having 6 to 12 ring carbon atoms, or a substituted or unsubstituted heterocyclic group having 5 to 12 ring atoms.

In the compound according to the first exemplary embodiment, $R_{16}$ is preferably a substituted or unsubstituted phenyl group, a substituted or unsubstituted naphthyl group, or a substituted or unsubstituted dibenzofuranyl group.

The compound according to the exemplary embodiment is also preferably represented by a formula (9A) or a formula (10A).

(9A)

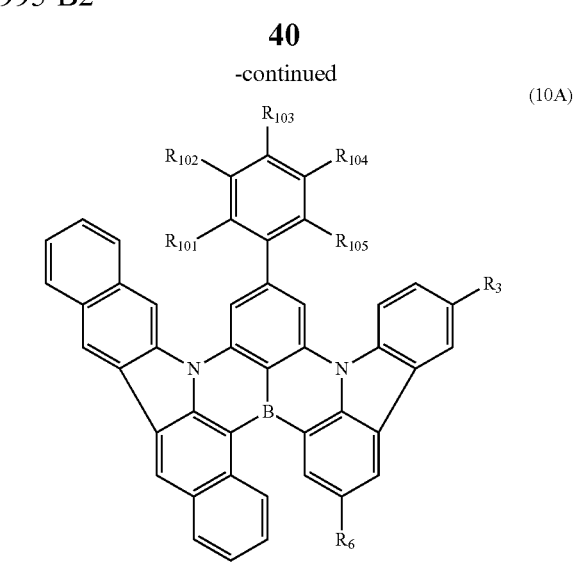

(10A)

In the formula (9A) and the formula (10A): $R_3$, $R_6$, and $R_9$ each independently represent the same as those defined in the formula (1);

at least one combination of adjacent two or more of $R_{101}$ to $R_{105}$ are mutually bonded to form a substituted or unsubstituted monocyclic ring, mutually bonded to form a substituted or unsubstituted fused ring, or not mutually bonded;

$R_{101}$ to $R_{105}$ neither forming a substituted or unsubstituted monocyclic ring nor forming a substituted or unsubstituted fused ring each independently represent a hydrogen atom, an unsubstituted alkyl group having 1 to 25 carbon atoms, an unsubstituted alkenyl group having 2 to 25 carbon atoms, an unsubstituted alkynyl group having 2 to 25 carbon atoms, an unsubstituted cycloalkyl group having 3 to 25 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), an unsubstituted aralkyl group having 7 to 50 carbon atoms, a group represented by —C(=O)$R_{908}$, a group represented by —COO$R_{909}$, a group represented by —S(=O)$_2R_{941}$, a group represented by —P(=O)($R_{942}$)($R_{943}$), a group represented by —Ge($R_{944}$)($R_{945}$)($R_{946}$), a halogen atom, a cyano group, a nitro group, an unsubstituted aryl group having 6 to 25 ring carbon atoms, or an unsubstituted heterocyclic group having 5 to 25 ring atoms; and $R_{901}$ to $R_{909}$ and $R_{941}$ to $R_{946}$ are each independently a hydrogen atom, an unsubstituted alkyl group having 1 to 25 carbon atoms, an unsubstituted aryl group having 6 to 25 ring carbon atoms, or an unsubstituted heterocyclic group having 5 to ring atoms.

In the exemplary embodiment, a substituent for a "substituted or unsubstituted" group is preferably an unsubstituted alkyl group having 1 to 25 carbon atoms, an unsubstituted alkenyl group having 2 to 25 carbon atoms, an unsubstituted alkynyl group having 2 to 25 carbon atoms, an unsubstituted cycloalkyl group having 3 to 25 ring carbon atoms, a group represented by —Si($R_{901}$)($R_{902}$)($R_{903}$), a group represented by —O—($R_{904}$), a group represented by —S—($R_{905}$), a group represented by —N($R_{906}$)($R_{907}$), an unsubstituted aralkyl group having 7 to 50 carbon atoms, a group represented by —C(=O)$R_{908}$, a group represented by —COO$R_{909}$, a group represented by —S(=O)$_2R_{941}$, a group represented by —P(=O)($R_{942}$)($R_{943}$), a group represented by —Ge($R_{944}$)($R_{945}$)($R_{946}$), a halogen atom, a cyano group, a nitro group, an unsubstituted aryl group having 6 to 25 ring carbon atoms, or an unsubstituted heterocyclic group having 5 to 25 ring atoms; and $R_{901}$ to $R_{909}$ and $R_{941}$ to $R_{946}$ are each independently preferably a hydrogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

In the exemplary embodiment, a substituent for a "substituted or unsubstituted" group is preferably a halogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

In the compound according to the exemplary embodiment, a substituent for a "substituted or unsubstituted" group is preferably a fluorine atom, an unsubstituted alkyl group having 1 to 10 carbon atoms, an unsubstituted aryl group having 6 to 12 ring carbon atoms, or an unsubstituted heterocyclic group having 5 to 12 ring atoms.

In the exemplary embodiment, it is also preferable that all groups described as "substituted or unsubstituted" groups are "unsubstituted" groups.

Main Peak Wavelength of Compound

A main peak wavelength of the compound according to the exemplary embodiment is preferably in a range from 500 nm to 560 nm, more preferably in a range from 500 nm to 540 nm, further preferably in a range from 510 nm to 530 nm.

Herein, the main peak wavelength of the compound refers to a peak wavelength of a fluorescence spectrum exhibiting a maximum luminous intensity among fluorescence spectra measured in a toluene solution in which a measurement target compound is dissolved at a concentration ranging from $10^{-6}$ mol/l to $10^{-5}$ mol/l. A spectrophotofluorometer (F-7000 manufactured by Hitachi, Ltd.) is usable as a measurement device.

Manufacturing Method of Compound According to Exemplary Embodiment

The compound according to the exemplary embodiment can be manufactured by application of known substitution reactions and materials depending on a target compound, in accordance with or based on synthesis methods described later in Examples.

Specific Examples of Compound According to Exemplary Embodiment

Examples of the compound according to the exemplary embodiment include the following compounds. However, the invention is not limited to these specific examples.

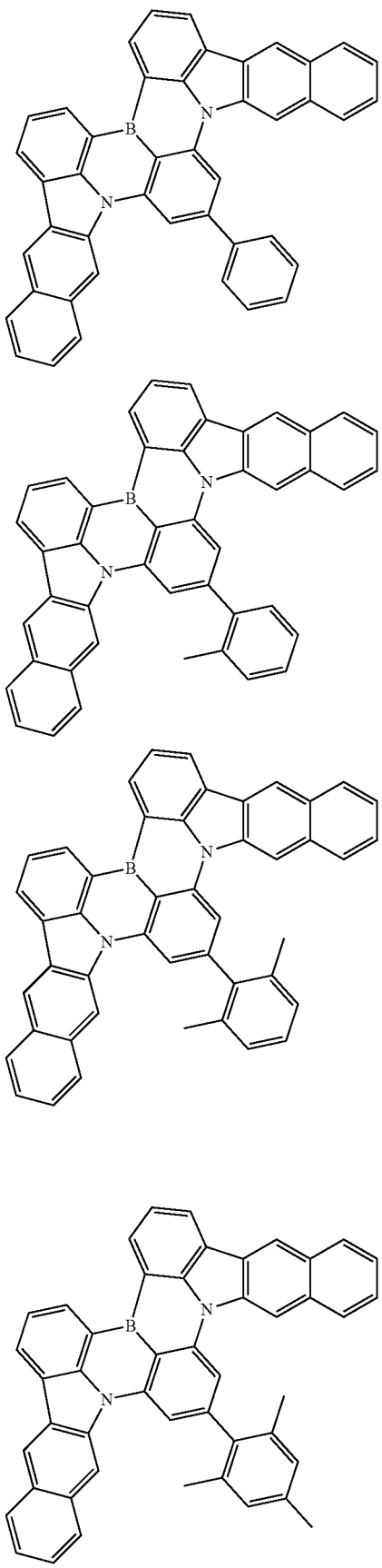

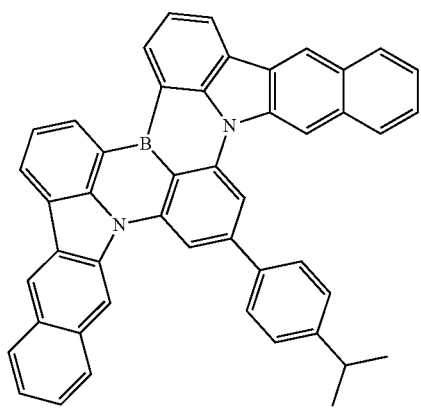
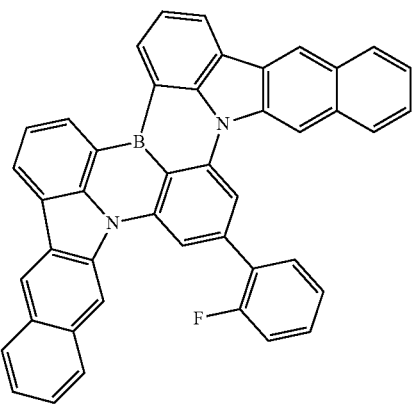
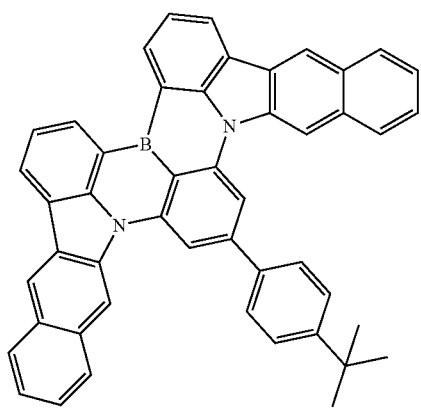
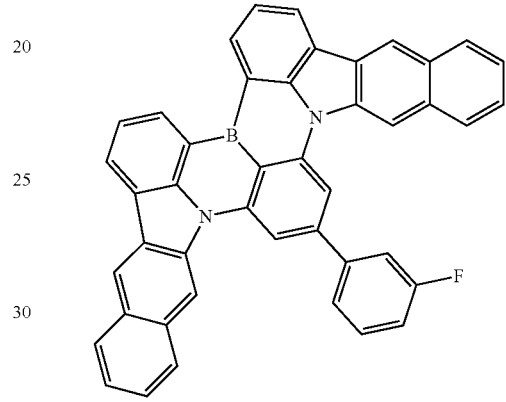
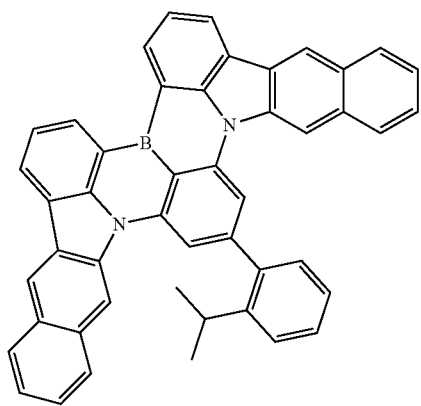
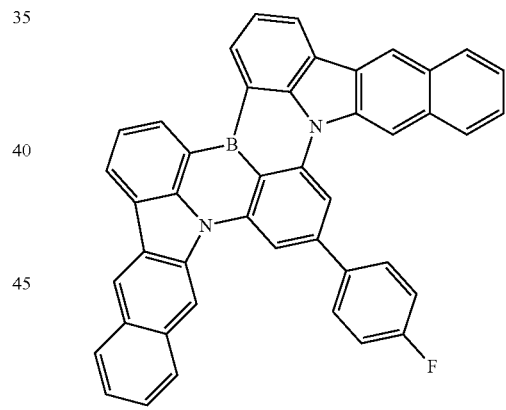
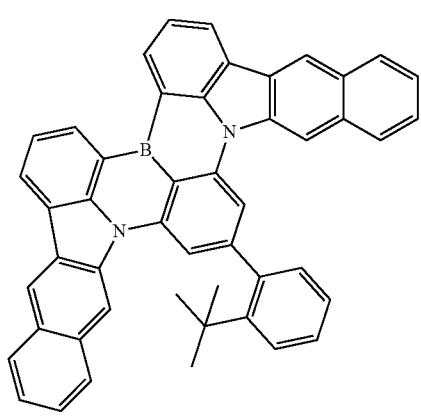
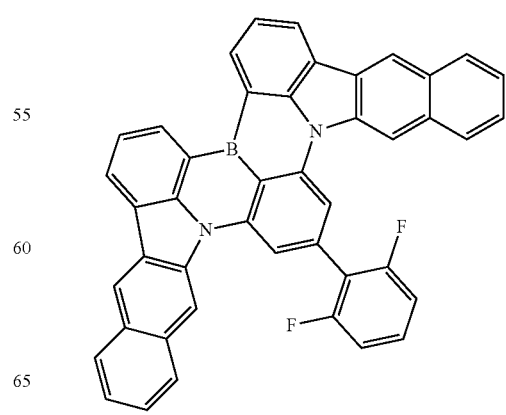

-continued
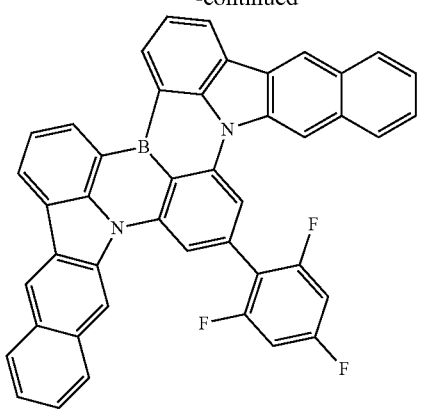
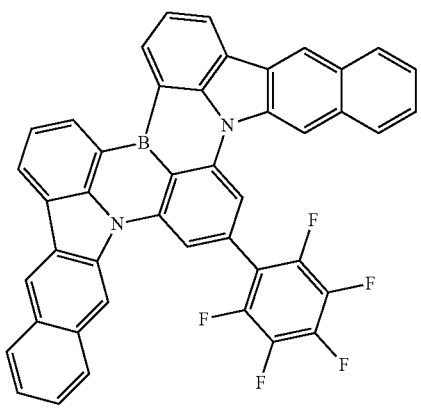
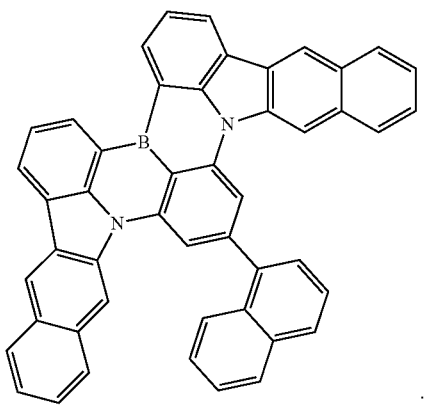
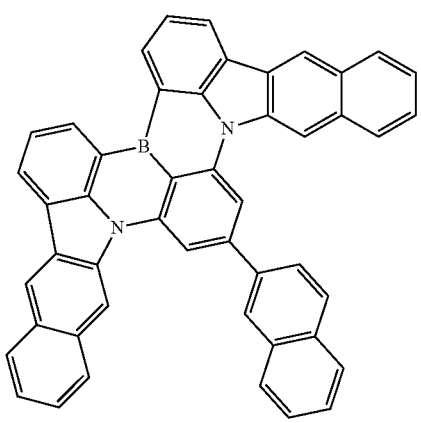
-continued
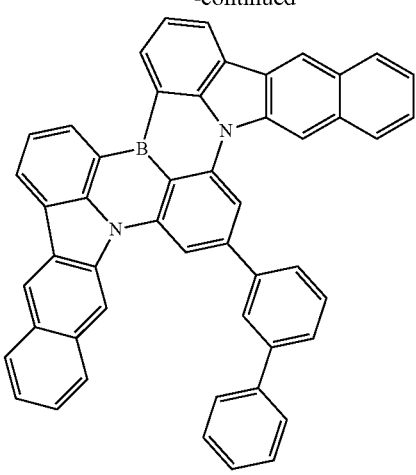
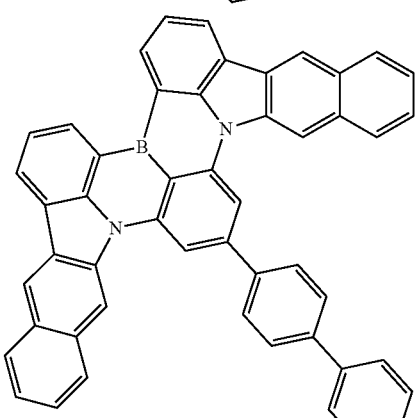
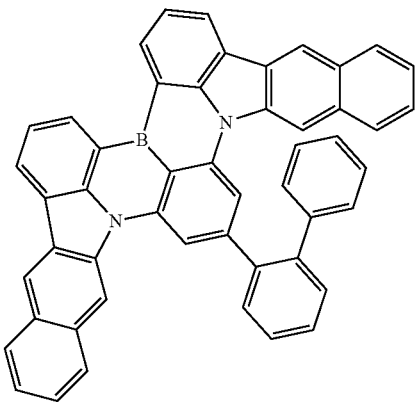
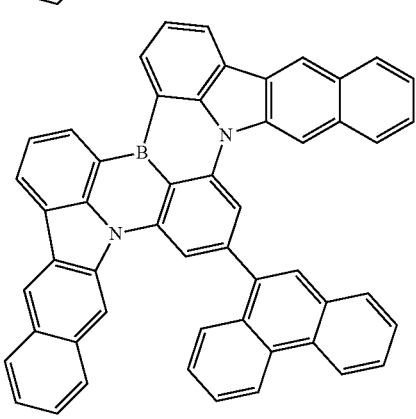

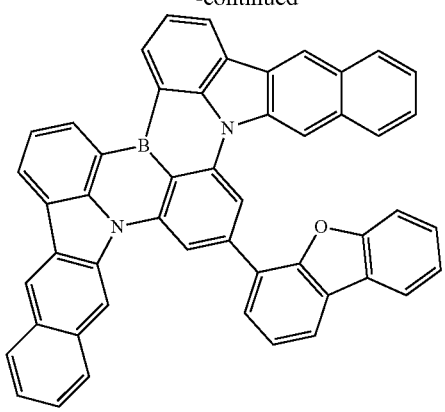
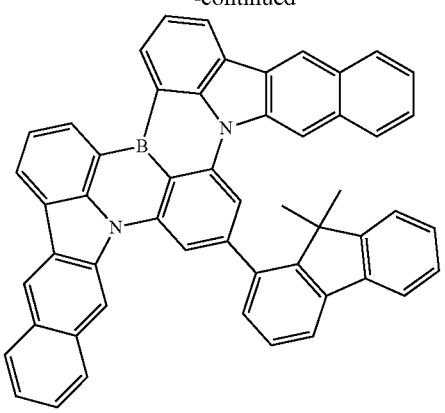
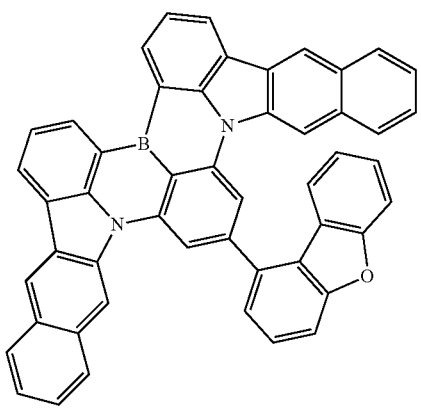
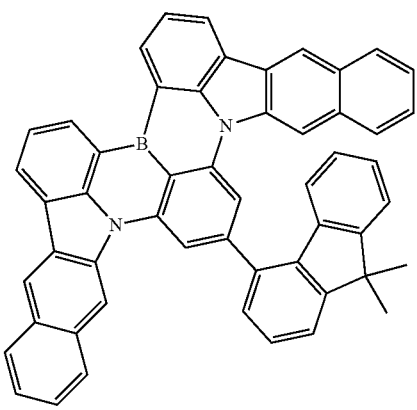
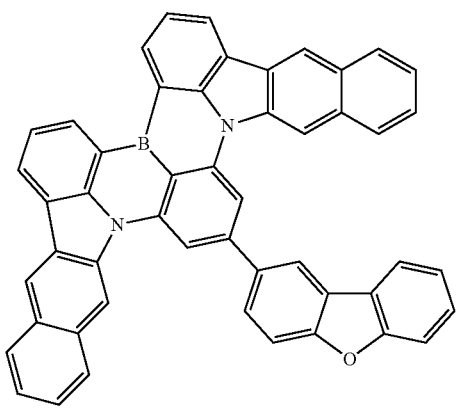
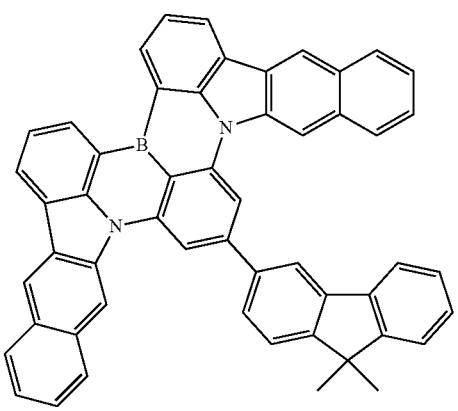
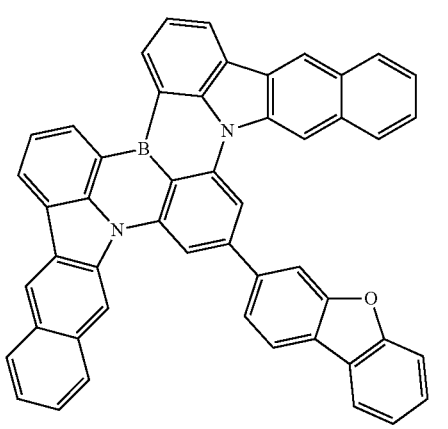
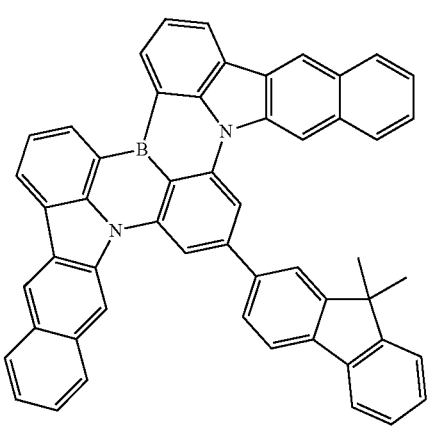

49
-continued
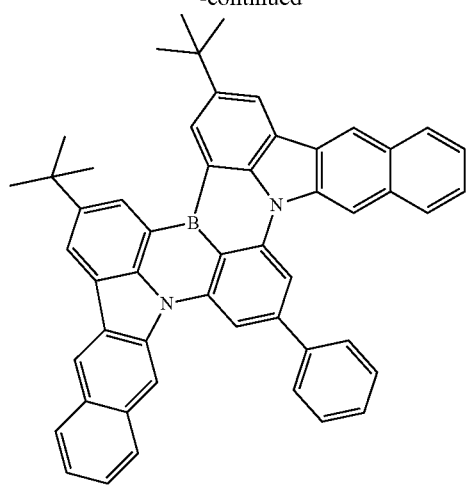
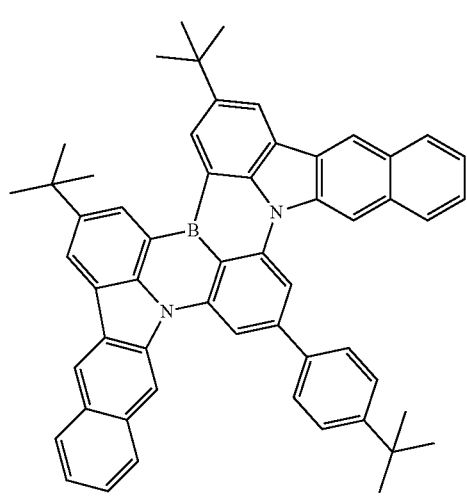
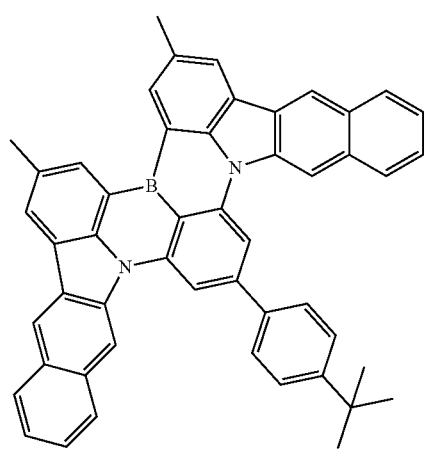
50
-continued
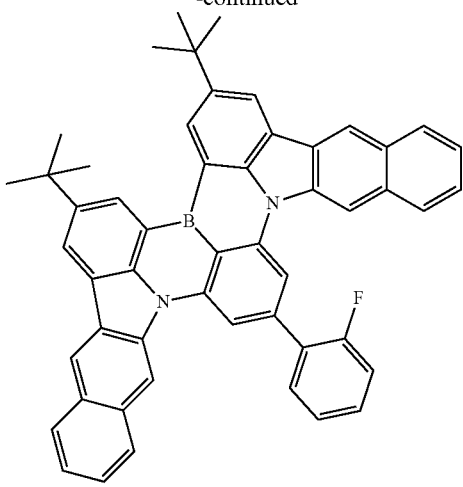
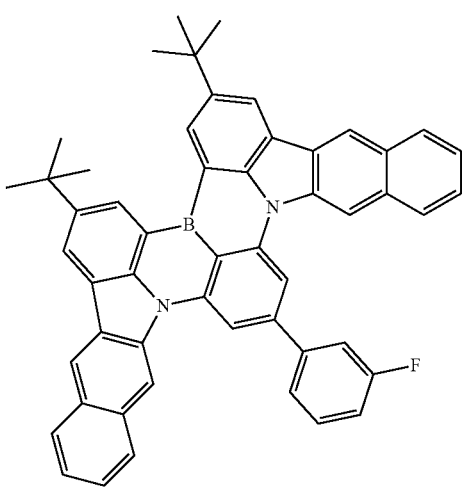
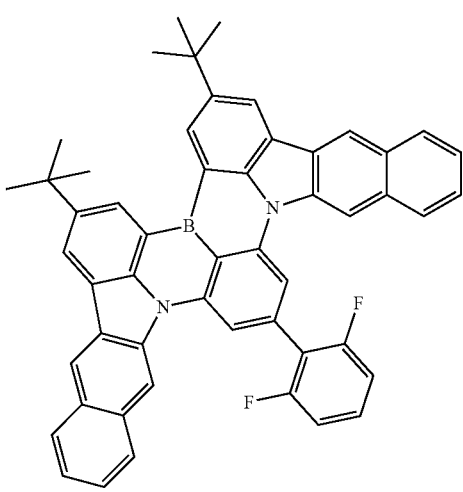

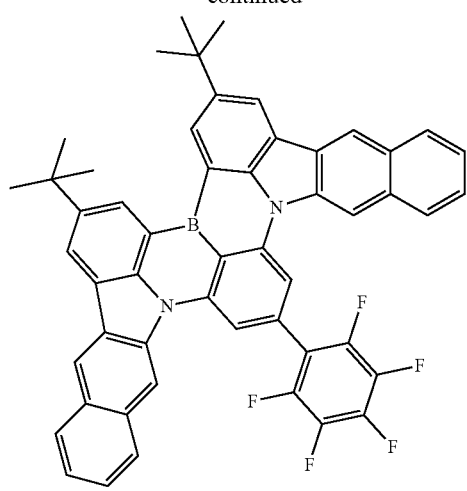
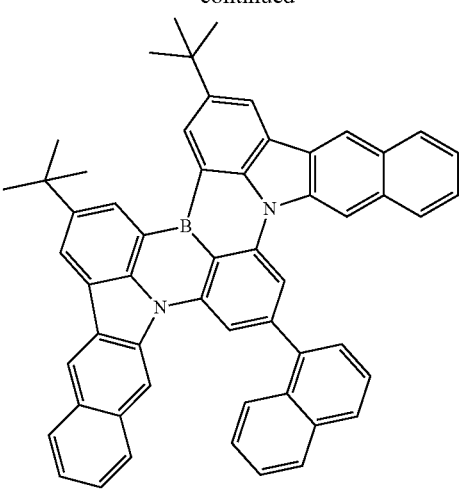
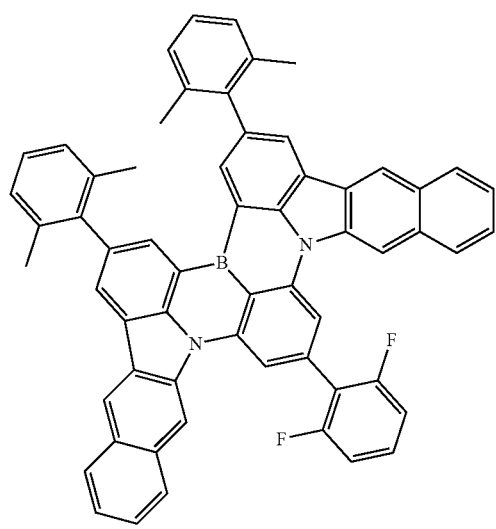
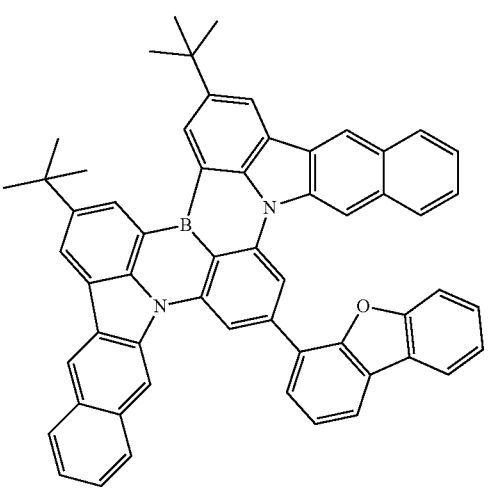
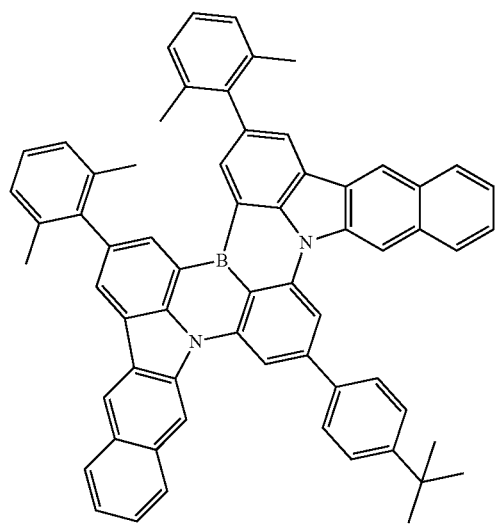
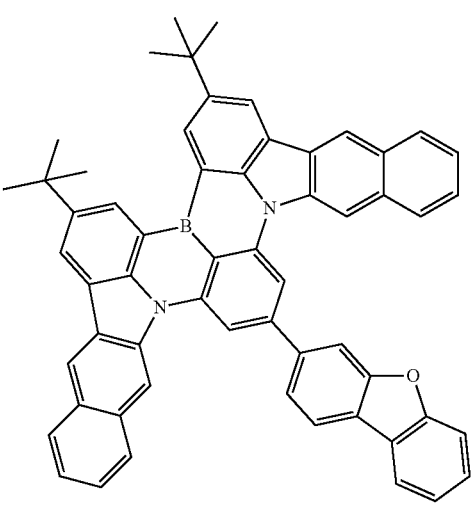

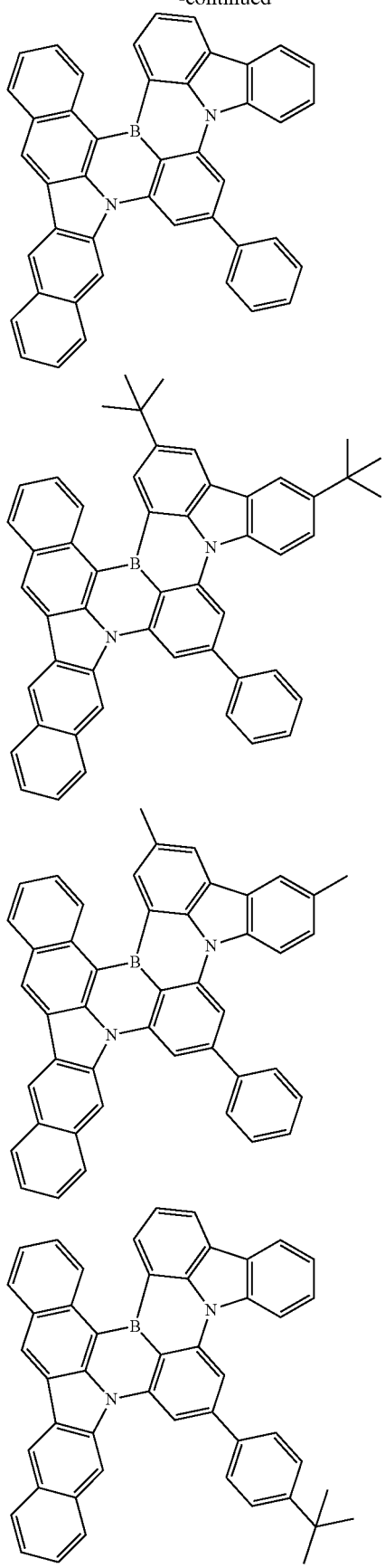
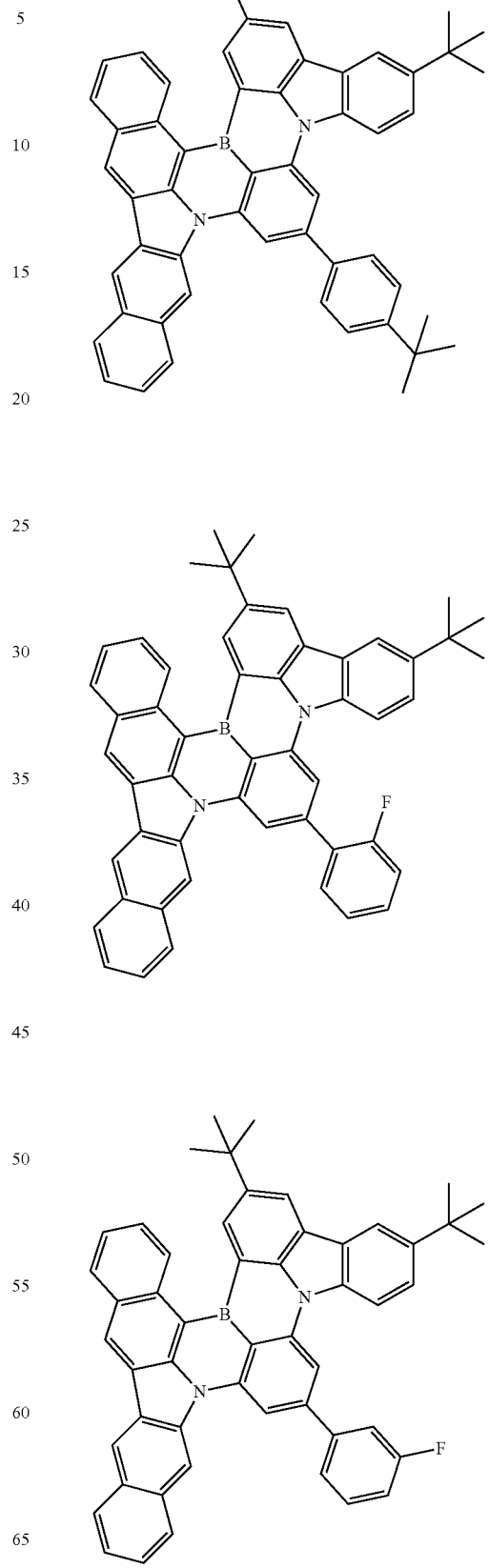

-continued
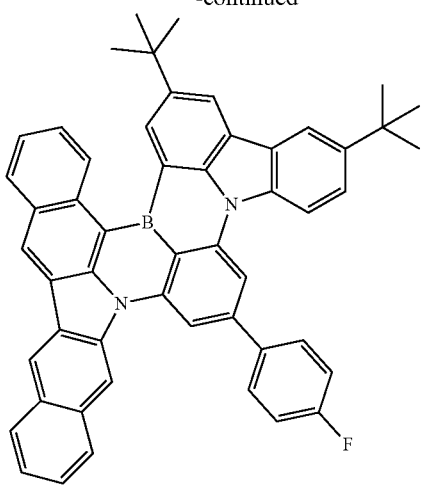 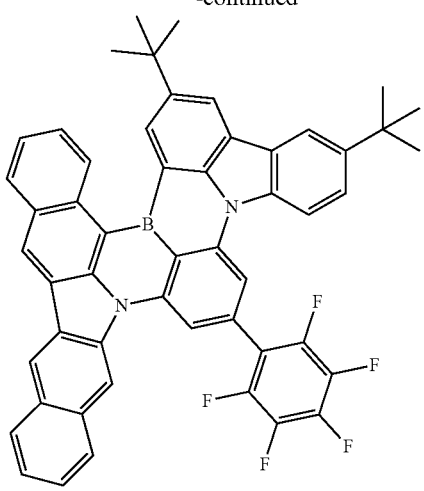
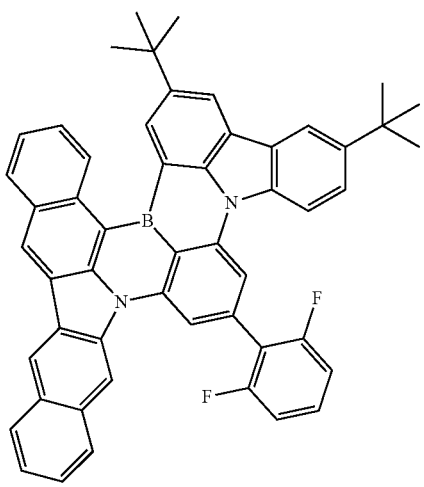 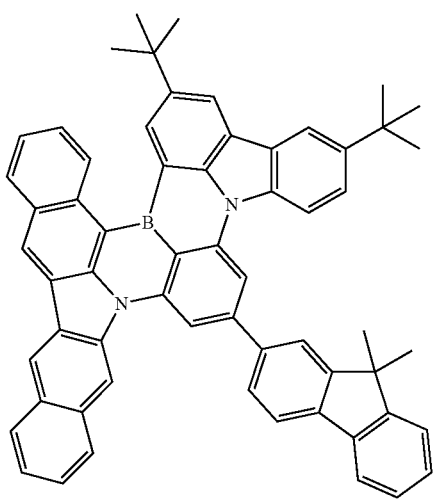
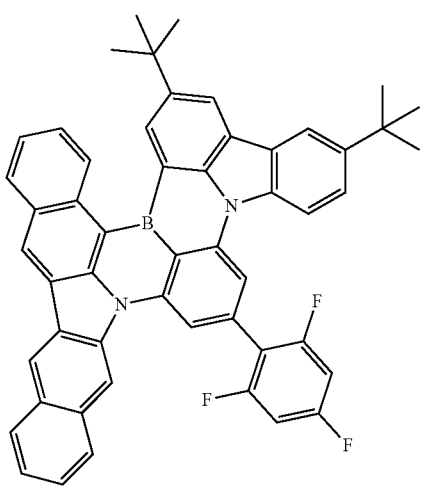 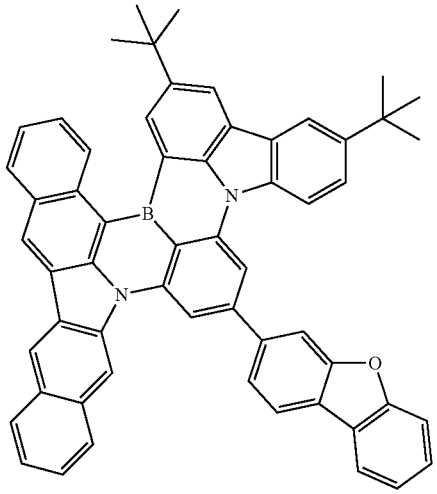

57
-continued
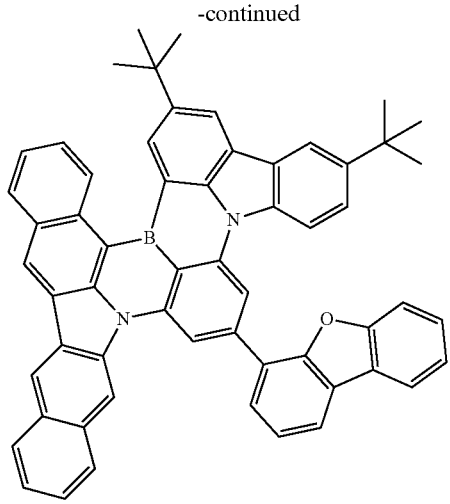
58
-continued
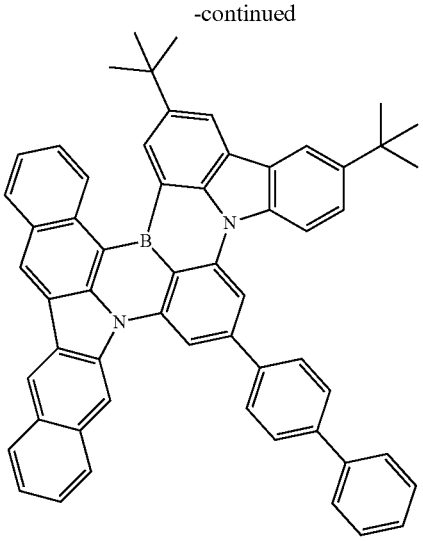
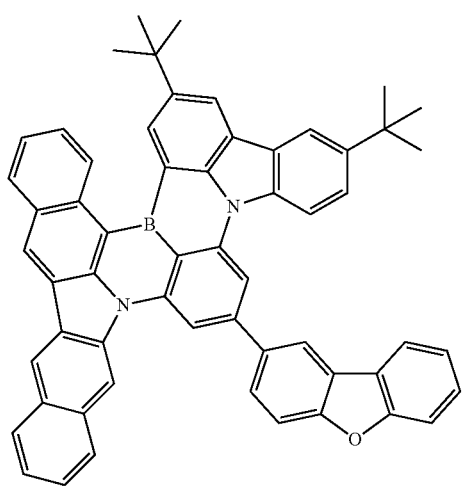
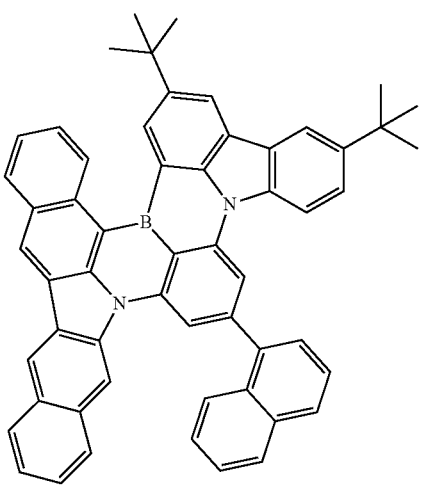
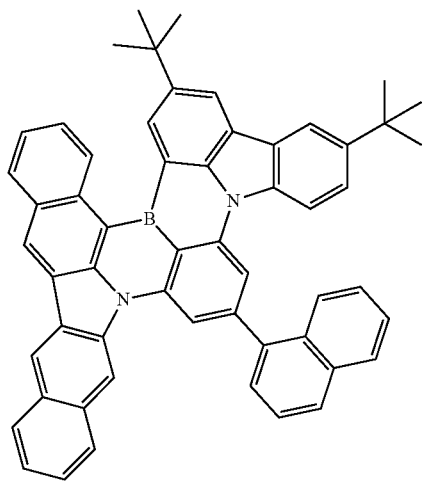
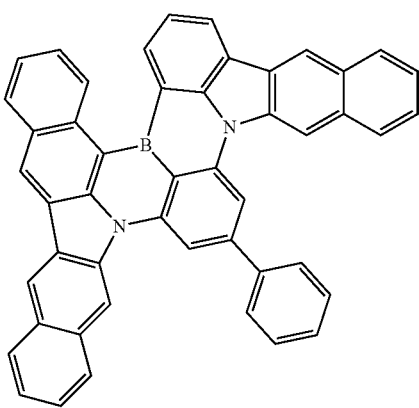

59
-continued
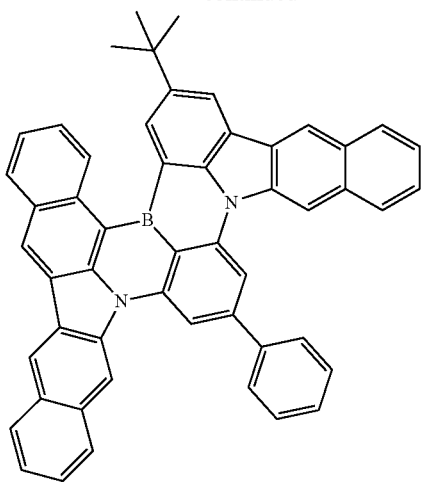
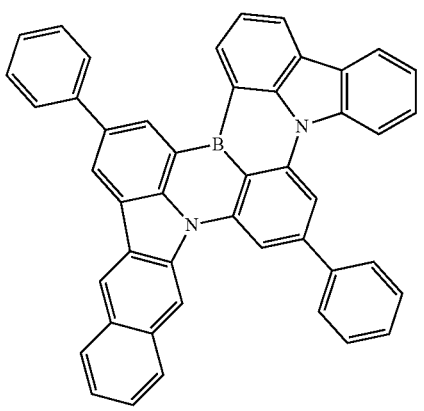
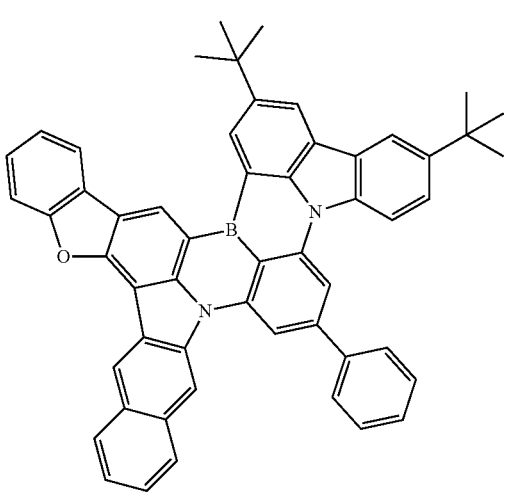
60
-continued
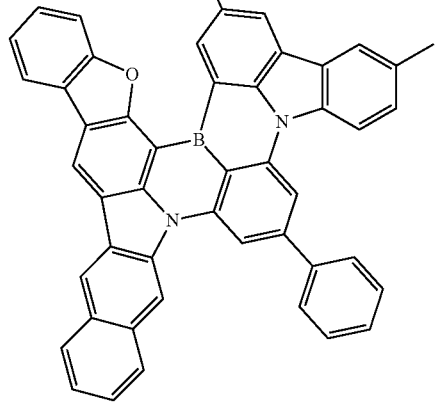
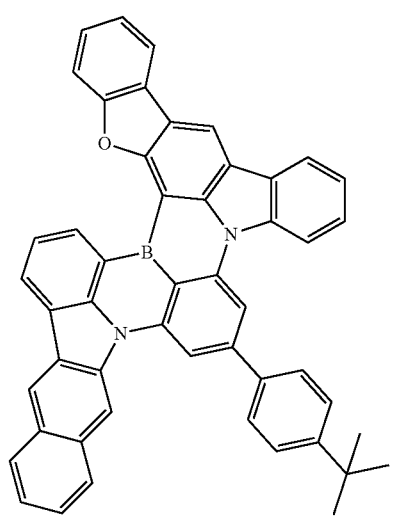
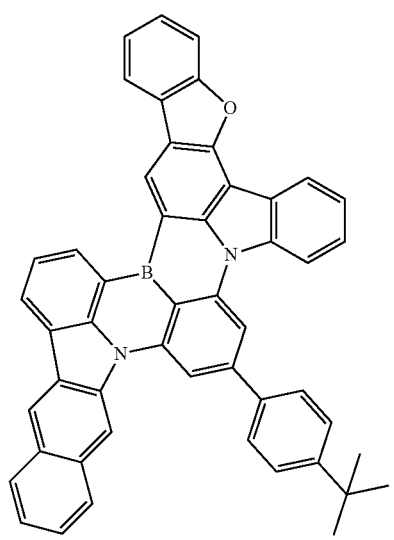

-continued

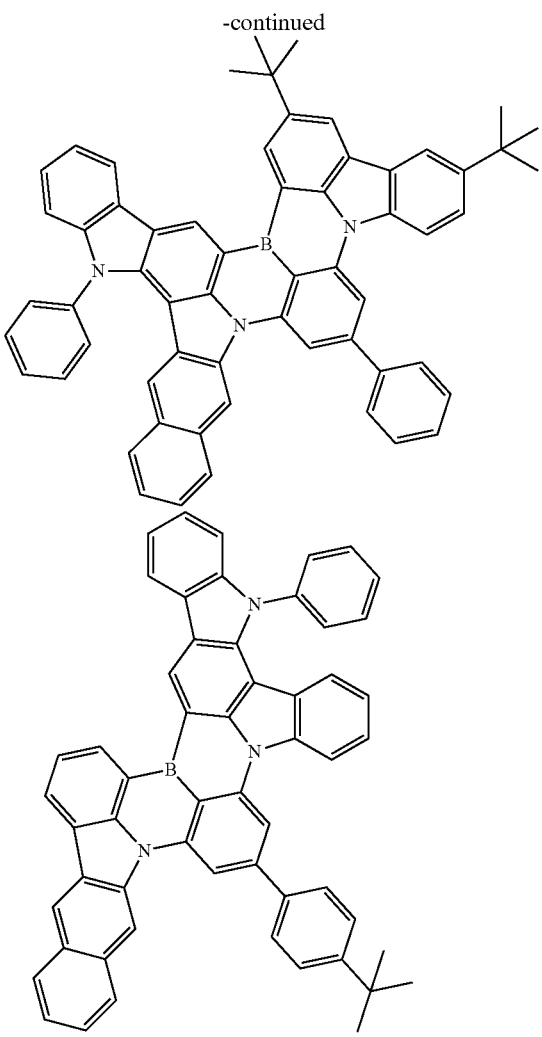

The compound according to the exemplary embodiment can improve a performance of the organic EL device. According to the exemplary embodiment, a drive voltage is reducible, EQE is improvable, and a light having a narrow main-peak full width at half maximum is emittable from the organic EL device.

Second Exemplary Embodiment

Organic-Electroluminescence-Device Material

An organic-electroluminescence-device material according to the second exemplary embodiment contains the compound according to the first exemplary embodiment. As one example, the organic-electroluminescence-device material contains only the compound according to the first exemplary embodiment. As another example, the organic-electroluminescence-device material contains the compound according to the first exemplary embodiment and another compound(s) different from the compound according to the first exemplary embodiment.

In the organic-electroluminescence-device material according to the second exemplary embodiment, the compound according to the first exemplary embodiment is preferably a dopant material. In this arrangement, the organic-electroluminescence-device material may contain the compound according to the first exemplary embodiment as the dopant material and another compound(s) such as a host material.

Third Exemplary Embodiment

Organic Electroluminescence Device

An organic EL device according to a third exemplary embodiment will be described.

The organic EL device according to the third exemplary embodiment includes a cathode, an anode, and an organic layer interposed between the cathode and the anode. The organic layer includes at least one layer formed of an organic compound.

Alternatively, the organic layer includes a plurality of layers formed of an organic compound(s). The organic layer may further include an inorganic compound. At least one layer included in the organic layer contains the compound according to the first exemplary embodiment (the compound represented by the formula (1)).

Accordingly, the organic layer may consist of a single emitting layer or, alternatively, may further include at least one layer usable in organic EL devices. Examples of the layer usable in the organic EL device, which are not particularly limited, include at least one layer selected from the group consisting of a hole injecting layer, hole transporting layer, electron injecting layer, electron transporting layer, and blocking layer.

FIG. 1 schematically shows an exemplary structure of the organic EL device of the exemplary embodiment.

An organic EL device 1 includes a light-transmissive substrate 2, an anode 3, a cathode 4, and an organic layer 10 provided between the anode 3 and the cathode 4. The organic layer 10 includes a hole injecting layer 6, a hole transporting layer 7, an emitting layer 5, an electron transporting layer 8, and an electron injecting layer 9, which are sequentially laminated on the anode 3. The invention is not limited to the arrangement of the organic EL device shown in FIG. 1.

Emitting Layer

The organic layer of the organic EL device according to the third exemplary embodiment includes the emitting layer.

The emitting layer preferably contains the compound according to the first exemplary embodiment (the compound represented by the formula (1)).

It is also preferable that the emitting layer further contains a delayed fluorescent material.

When the emitting layer contains the compound according to the first exemplary embodiment and the delayed fluorescent material, it is preferable that a lowest singlet energy $S_1(H)$ of the delayed fluorescent material and a lowest singlet energy $S_1(D)$ of the compound according to the first exemplary embodiment (the compound represented by the formula (1)) preferably satisfy a numerical formula (Numerical Formula 1) below.

$S_1(H) > S_1(D)$     (Numerical Formula 1)

In the organic EL device according to the third exemplary embodiment, the emitting layer preferably contains a first compound and a second compound. The first compound of the emitting layer is preferably the compound according to the first exemplary embodiment.

In this embodiment, the second compound is preferably a host material (occasionally also referred to as a matrix material) and the first compound is also preferably a dopant material (occasionally also referred to as a guest material, emitter or a luminescent material).

Herein, the "host material" refers to, for instance, a material that accounts for "50 mass % or more of the layer." Accordingly, for instance, the emitting layer contains the second compound in an amount of 50 mass % or more of the total mass of the emitting layer. Moreover, for instance, the "host material" may accounts for 60 mass % or more of the layer, 70 mass % or more of the layer, 80 mass % or more of the layer, 90 mass % or more of the layer, or 95 mass % or more of the layer.

In the organic EL device of the third exemplary embodiment, a lowest singlet energy $S_1(M1)$ of the first compound and a lowest singlet energy $S_1(M2)$ of the second compound preferably satisfy a relationship of a numerical formula (Numerical Formula 3) below.

$$S_1(M2) > S_1(M1) \qquad \text{(Numerical Formula 3)}$$

An energy gap $T_{77K}(M1)$ at 77K of the first compound is preferably smaller than an energy gap $T_{77K}(M2)$ at 77K of the second compound. In other words, a relationship of the following numerical formula (Numerical Formula 5) is preferably satisfied.

$$T_{77K}(M2) > T_{77K}(M1) \qquad \text{(Numerical Formula 5)}$$

When the organic EL device of the third exemplary embodiment emits light, it is preferable that the compound according to the first exemplary embodiment as the first compound mainly emits light in the emitting layer.

In another embodiment, the emitting layer may contain a metal complex.

In still another embodiment, the emitting layer preferably does not contain a metal complex.

In a further embodiment, the emitting layer preferably does not contain a phosphorescent material (dopant material).

In a still further embodiment, the emitting layer preferably does not contain a heavy metal complex and a phosphorescent rare earth metal complex. Examples of the heavy-metal complex include an iridium complex, osmium complex, and platinum complex.

In the third exemplary embodiment, when the emitting layer contains the compound of the first exemplary embodiment, the emitting layer preferably does not contain a phosphorescent metal complex, more preferably does not contain a metal complex other than the phosphorescent metal complex as well.

First Compound

The first compound is preferably the compound according to the first exemplary embodiment.

In another embodiment, the first compound is a fluorescent compound exhibiting no delayed fluorescence.

Second Compound

The second compound, which is not particularly limited, is preferably a delayed fluorescent material in the organic EL device of the third exemplary embodiment.

The delayed fluorescent material as the second compound is preferably the host material in the organic EL device of the third exemplary embodiment.

It is preferable in the organic EL device of the third exemplary embodiment that the delayed fluorescent material as the second compound is the host material and the compound according to the first exemplary embodiment as the first compound is the dopant material.

Delayed Fluorescence

Delayed fluorescence is explained in "Yuki Hando-tai no Debaisu Bussei (Device Physics of Organic Semiconductors)" (edited by ADACHI, Chihaya, published by Kodansha, on pages 261-268). This document describes that, if an energy difference $\Delta E_{13}$ of a fluorescent material between a singlet state and a triplet state is reducible, a reverse energy transfer from the triplet state to the singlet state, which usually occurs at a low transition probability, would occur at a high efficiency to express thermally activated delayed fluorescence (TADF). Further, a mechanism of generating delayed fluorescence is explained in FIG. 10.38 in the document. The delayed fluorescent material of the third exemplary embodiment is preferably a compound exhibiting thermally activated delayed fluorescence generated by such a mechanism.

In general, emission of delayed fluorescence can be confirmed by measuring the transient PL (Photo Luminescence).

The behavior of delayed fluorescence can also be analyzed based on the decay curve obtained from the transient PL measurement. The transient PL measurement is a method of irradiating a sample with a pulse laser to excite the sample, and measuring the decay behavior (transient characteristics) of PL emission after the irradiation is stopped. PL emission in TADF materials is classified into a light emission component from a singlet exciton generated by the first PL excitation and a light emission component from a singlet exciton generated via a triplet exciton. The lifetime of the singlet exciton generated by the first PL excitation is on the order of nanoseconds and is very short. Therefore, light emission from the singlet exciton rapidly attenuates after irradiation with the pulse laser.

On the other hand, the delayed fluorescence is gradually attenuated due to light emission from a singlet exciton generated via a triplet exciton having a long lifetime. As described above, there is a large temporal difference between the light emission from the singlet exciton generated by the first PL excitation and the light emission from the singlet exciton generated via the triplet exciton. Therefore, the luminous intensity derived from delayed fluorescence can be determined.

FIG. 2 shows a schematic diagram of an exemplary device for measuring the transient PL. An example of a method of measuring a transient PL using FIG. 2 and an example of behavior analysis of delayed fluorescence will be described.

A transient PL measuring device 100 in FIG. 2 includes: a pulse laser 101 capable of radiating a light having a predetermined wavelength; a sample chamber 102 configured to house a measurement sample; a spectrometer 103 configured to divide a light radiated from the measurement sample; a streak camera 104 configured to provide a two-dimensional image; and a personal computer 105 configured to import and analyze the two-dimensional image. A device for measuring the transient PL is not limited to the device described in the exemplary embodiment.

The sample to be housed in the sample chamber 102 is obtained by doping a matrix material with a doping material at a concentration of 12 mass % and forming a thin film on a quartz substrate.

The thin film sample housed in the sample chamber 102 is irradiated with the pulse laser from the pulse laser 101 to excite the doping material. Emission is extracted in a direction of 90 degrees with respect to a radiation direction of the excited light. The extracted emission is divided by the spectrometer 103 to form a two-dimensional image in the streak camera 104. As a result, the two-dimensional image is obtainable in which the ordinate axis represents a time, the abscissa axis represents a wavelength, and a bright spot represents a luminous intensity. When this two-dimensional image is taken out at a predetermined time axis, an emission spectrum in which the ordinate axis represents the luminous intensity and the abscissa axis represents the wavelength is obtainable. Moreover, when this two-dimensional image is taken out at the wavelength axis, a decay curve (transient PL) in which the ordinate axis represents a logarithm of the luminous intensity and the abscissa axis represents the time is obtainable.

For instance, a thin film sample A was manufactured as described above from a reference compound H1 as the matrix material and a reference compound D1 as the doping material and was measured in terms of the transient PL.

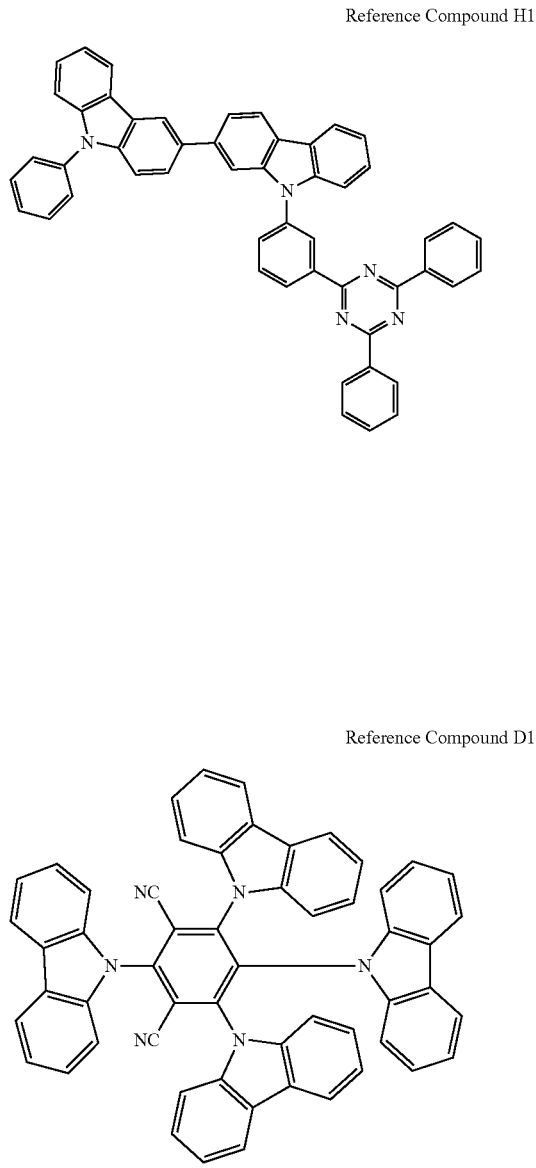

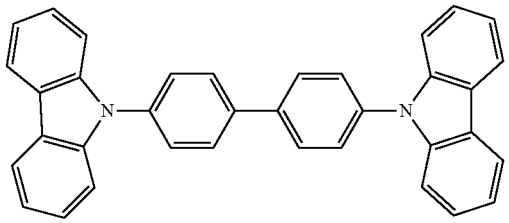

The decay curve was analyzed with respect to the above thin film sample A and a thin film sample B. The thin film sample B was manufactured in the same manner as described above from a reference compound H2 as the matrix material and the reference compound D1 as the doping material.

FIG. 3 shows decay curves obtained from transient PL obtained by measuring the thin film samples A and B.

As described above, an emission decay curve in which the ordinate axis represents the luminous intensity and the abscissa axis represents the time can be obtained by the transient PL measurement. Based on the emission decay curve, a fluorescence intensity ratio between fluorescence emitted from a singlet state generated by photo-excitation and delayed fluorescence emitted from a singlet state generated by inverse energy transfer via a triplet state can be estimated. In a delayed fluorescent material, a ratio of the intensity of the slowly decaying delayed fluorescence to the intensity of the promptly decaying fluorescence is relatively large.

Specifically, Prompt emission and Delay emission are present as emission from the delayed fluorescent material. Prompt emission is observed promptly when the excited state is achieved by exciting the compound of the exemplary embodiment with a pulse beam (i.e., a beam emitted from a pulse laser) having a wavelength absorbable by the delayed fluorescent material. Delay emission is observed not promptly when the excited state is achieved but after the excited state is achieved.

An amount of Prompt emission, an amount of Delay emission and a ratio between the amounts thereof can be obtained according to the method as described in "Nature 492, 234-238, 2012" (Reference Document 1). The amount of Prompt emission and the amount of Delay emission may be calculated using a device different from one described in Reference Document 1 or one shown in FIG. 2.

Herein, a sample manufactured by a method shown below is used for measuring delayed fluorescence of the delayed fluorescent material. For instance, the delayed fluorescent material is dissolved in toluene to prepare a dilute solution with an absorbance of 0.05 or less at the excitation wavelength to eliminate the contribution of self-absorption. In order to prevent quenching due to oxygen, the sample solution is frozen and degassed and then sealed in a cell with a lid under an argon atmosphere to obtain an oxygen-free sample solution saturated with argon.

The fluorescence spectrum of the sample solution is measured with a spectrofluorometer FP-8600 (manufactured by JASCO Corporation), and the fluorescence spectrum of a 9,10-diphenylanthracene ethanol solution is measured under the same conditions. Using the fluorescence area intensities of both spectra, the total fluorescence quantum yield is calculated by an equation (1) in Morris et al. J. Phys. Chem. 80 (1976) 969.

In the third exemplary embodiment, provided that an amount of Prompt emission of a measurement target compound (delayed fluorescent material) is denoted by $X_P$ and the amount of Delay emission is denoted by $X_D$, a value of $X_D/X_P$ is preferably 0.05 or more.

The amounts of Prompt emission and Delay emission and a ratio of the amounts thereof in compounds other than the delayed fluorescent material herein are measured in the same manner as those of the delayed fluorescent material.

ΔST

In the third exemplary embodiment, a difference ($S_1$-$T_{77K}$) between the lowest singlet energy ST and an energy gap $T_{77K}$ at 77K is defined as ΔST.

A difference ΔST(H) between the singlet energy $S_1$(H) of the delayed fluorescent material and the energy gap $T_{77K}$(H) at 77K of the delayed fluorescent material is preferably less than 0.3 eV, more preferably less than 0.2 eV, further preferably less than 0.1 eV, more further preferably less than 0.01 eV. In other words, ΔST(H) preferably satisfies a relationship of one of numerical formulae (Numerical Formulae 10, 11, 12 and 13).

$$\Delta ST(H)=S_1(H)-T_{77K}(H)<0.3 \text{ eV} \quad \text{(Numerical Formula 10)}$$

$$\Delta ST(H)=S_1(H)-T_{77K}(H)<0.2 \text{ eV} \quad \text{(Numerical Formula 11)}$$

$$\Delta ST(H)=S_1(H)-T_{77K}(H)<0.1 \text{ eV} \quad \text{(Numerical Formula 12)}$$

$$\Delta ST(H)=S_1(H)-T_{77K}(H)<0.01 \text{ eV} \quad \text{(Numerical Formula 13)}$$

Relationship Between Triplet Energy and Energy Gap at 77K

Here, a relationship between a triplet energy and an energy gap at 77K will be described. In the exemplary embodiment, the energy gap at 77K is different from a typical triplet energy in some aspects.

The triplet energy is measured as follows. Firstly, a solution in which a compound (measurement target) is dissolved in an appropriate solvent is encapsulated in a quartz glass tube to prepare a sample. A phosphorescent spectrum (ordinate axis: phosphorescent luminous intensity, abscissa axis: wavelength) of the sample is measured at a low temperature (77K). A tangent is drawn to the rise of the phosphorescent spectrum close to the short-wavelength region. The triplet energy is calculated by a predetermined conversion equation based on a wavelength value at an intersection of the tangent and the abscissa axis.

Herein, the delayed fluorescent compound used in the present exemplary embodiment is preferably a compound having a small ΔST. When ΔST is small, intersystem crossing and inverse intersystem crossing are likely to occur even at a low temperature (77K), so that the singlet state and the triplet state coexist. As a result, the spectrum to be measured in the same manner as the above includes emission from both the singlet state and the triplet state. Although it is difficult to distinguish the emission from the singlet state from the emission from the triplet state, the value of the triplet energy is basically considered dominant.

Accordingly, in the exemplary embodiment, the triplet energy is measured by the same method as a typical triplet energy T, but a value measured in the following manner is referred to as an energy gap $T_{77K}$ in order to differentiate the measured energy from the typical triplet energy in a strict meaning. The measurement target compound is dissolved in EPA (diethylether:isopentane:ethanol=5:5:2 in volume ratio) at a concentration of 10 μmol/L, and the obtained solution is encapsulated in a quartz cell to provide a measurement sample. A phosphorescent spectrum (ordinate axis: phosphorescent luminous intensity, abscissa axis: wavelength) of the sample is measured at a low temperature (77K). A tangent is drawn to the rise of the phosphorescent spectrum close to the short-wavelength region. An energy amount is calculated by a conversion equation below based on a wavelength value $\lambda_{edge}$ [nm] at an intersection of the tangent and the abscissa axis and is defined as an energy gap $T_{77K}$ at 77K.

$$T_{77K} \text{ [eV]}=1239.85/\lambda_{edge} \quad \text{Conversion Equation (F1):}$$

The tangent to the rise of the phosphorescence spectrum close to the short-wavelength region is drawn as follows. While moving on a curve of the phosphorescence spectrum from the short-wavelength region to the maximum spectral value closest to the short-wavelength region among the maximum spectral values, a tangent is checked at each point on the curve toward the long-wavelength of the phosphorescence spectrum. An inclination of the tangent is increased along the rise of the curve (i.e., a value of the ordinate axis is increased). A tangent drawn at a point of the maximum inclination (i.e., a tangent at an inflection point) is defined as the tangent to the rise of the phosphorescence spectrum close to the short-wavelength region.

The maximum with peak intensity being 15% or less of the maximum peak intensity of the spectrum is not included in the above-mentioned maximum closest to the short-wavelength region. The tangent drawn at a point of the maximum spectral value being closest to the short-wavelength region and having the maximum inclination is defined as a tangent to the rise of the phosphorescence spectrum close to the short-wavelength region.

For phosphorescence measurement, a spectrophotofluorometer body F-4500 (manufactured by Hitachi High-Technologies Corporation) is usable. Any device for phosphorescence measurement is usable. A combination of a cooling unit, a low temperature container, an excitation light source and a light-receiving unit may be used for phosphorescence measurement.

Lowest Singlet Energy $S_1$

A method of measuring the lowest singlet energy ST with use of a solution (occasionally referred to as a solution method) is exemplified by a method below.

A toluene solution in which a measurement target compound is dissolved at a concentration of 10 μmol/L is prepared and is encapsulated in a quartz cell to provide a measurement sample. Absorption spectrum (ordinate axis: absorption intensity, abscissa axis: wavelength) of the sample is measured at the normal temperature (300K). A tangent is drawn to the fall of the absorption spectrum on the long-wavelength side, and a wavelength value $\lambda_{edge}$ (nm) at an intersection of the tangent and the abscissa axis is assigned to a conversion equation (F2) below to calculate the lowest singlet energy.

$$S_1 \text{ [eV]}=1239.85/\lambda_{edge} \quad \text{Conversion Equation (F2):}$$

Any device for measuring absorption spectrum is usable. For instance, a spectrophotometer (U3310 manufactured by Hitachi, Ltd.) is usable.

The tangent to the fall of the absorption spectrum on the long-wavelength side is drawn as follows. While moving on a curve of the absorption spectrum from the maximum spectral value closest to the long-wavelength side in a long-wavelength direction, a tangent at each point on the curve is checked. An inclination of the tangent is decreased and increased in a repeated manner as the curve falls (i.e., a value of the ordinate axis is decreased). A tangent drawn at a point of the minimum inclination closest to the long-wavelength side (except when absorbance is 0.1 or less) is defined as the tangent to the fall of the absorption spectrum on the long-wavelength side.

The maximum absorbance of 0.2 or less is not included in the above-mentioned maximum absorbance on the long-wavelength side.

Compound Represented by Formula (2)

In the third exemplary embodiment, any compound having delayed fluorescence is usable as the delayed fluorescent material. In another embodiment, the delayed fluorescent material is a compound represented by a formula (2) below.

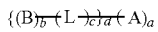 (2)

In the formula (2):

A is an acceptor (electron accepting) moiety having a partial structure selected from partial structures represented by formulae (a-1) to (a-7) below; when a plurality of A are present, the plurality of A are mutually the same or different and may be bonded to each other to form a saturated or unsaturated ring or are not bonded;

B is a donor (electron donating) moiety having a partial structure selected from partial structures represented by formulae (b-1) to (b-6) below; when a plurality of B are present, the plurality of B are mutually the same or different and may be bonded to each other to form a saturated or unsaturated ring or are not bonded;

a, b, and d are each independently 1, 2, 3, 4, or 5;

c is 0, 1, 2, 3, 4 or 5;

when c is 0, A and B are bonded via a single bond or a spiro bond;

when c is 1, 2, 3, 4 or 5, L is a linking group selected from the group consisting of a substituted or unsubstituted aryl group having 6 to 30 ring carbon atoms, and a substituted or unsubstituted heterocyclic group having 5 to 30 ring atoms; and when a plurality of L are present, the plurality of L are mutually the same or different and are optionally mutually bonded to form a saturated or unsaturated ring.

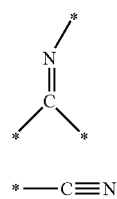 (a-1)

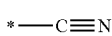 (a-2)

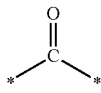 (a-3)

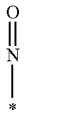 (a-4)

 (a-5)

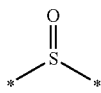 (a-6)

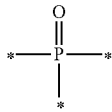 (a-7)

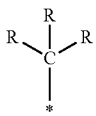 (b-1)

 (b-2)

 (b-3)

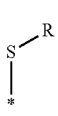 (b-4)

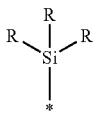 (b-5)

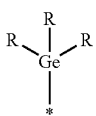 (b-6)

In the formulae (b-1) to (b-6): at least one combination of adjacent two or more of a plurality of R are mutually bonded to form a substituted or unsubstituted monocyclic ring, mutually bonded to form a substituted or unsubstituted fused ring, or not mutually bonded;

R neither forming the substituted or unsubstituted monocyclic ring nor forming substituted or unsubstituted fused ring are each independently a hydrogen atom, a substituted or unsubstituted aryl group having 6 to 30 ring carbon atoms, a substituted or unsubstituted heterocyclic group having 5 to 30 ring atoms, a substituted or unsubstituted alkyl group having 1 to 30 carbon atoms, or a substituted or unsubstituted cycloalkyl group having 3 to 30 ring carbon atoms.

When a plurality of R are present, the plurality of R are mutually the same or different.

Examples of the bonding form of the compound represented by the formula (2) are shown in Table 1 below.

TABLE 1

| No | a | b | c | d | Bonding Pattern |
|---|---|---|---|---|---|
| (1A) | 1 | 1 | 0 | 1 | B—A |
| (1B) | 1 | 1 | 1 | 1 | B—L—A |
| (1C) | 2 | 1 | 0 | 1 | B—A—A, B⟨A A⟩ |
| (1D) | 1 | 2 | 0 | 1 | B—B—A, B⟨B A⟩ |

TABLE 1-continued

| No | a | b | c | d | Bonding Pattern |
|---|---|---|---|---|---|
| (1E) | 2 | 1 | 1 | 1 | B—L—A—A, B—L(A)(A) |
| (1F) | 1 | 2 | 1 | 1 | B—B—L—A, (B)(B)L—A |
| (1G) | 1 | 1 | 2 | 1 | B—L—L—A |
| (1H) | 1 | 1 | 1 | 2 | B—L(A), B—L(A), B—L—B—L—A |

Manufacturing Method of Delayed Fluorescent Material

The delayed fluorescent material can be manufactured by a known method. Moreover, the delayed fluorescent material can also be manufactured by application of known substitution reactions and materials depending on a target compound, based on a known method.

Specific Examples of Delayed Fluorescent Material

Examples of the delayed fluorescent material include the following compounds. However, the invention is not limited to these specific examples of the delayed fluorescent material.

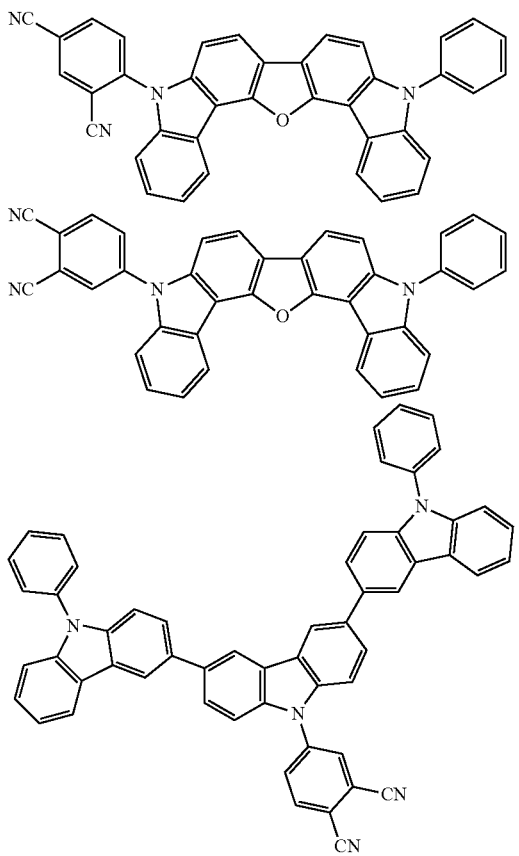

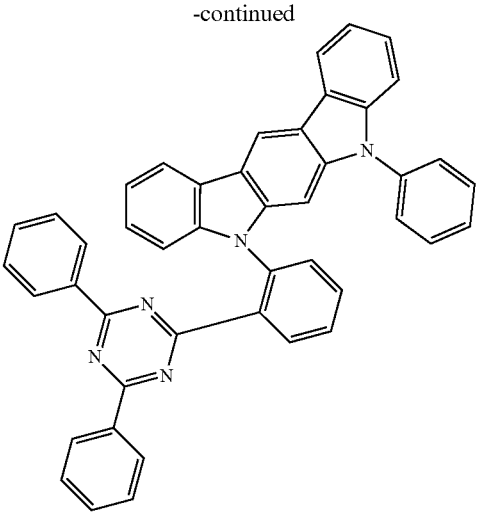

TADF Mechanism

FIG. 4 shows an example of a relationship between energy levels of the second compound M2 in a form of the delayed fluorescent material and the first compound M1 in a form of the compound of the first exemplary embodiment in the emitting layer. In FIG. 4, S0 represents a ground state. S1(M1) represents the lowest singlet state of the first compound M1. T1(M1) represents the lowest triplet state of the first compound M1. S1(M2) represents the lowest singlet state of the second compound M2. T1(M2) represents the lowest triplet state of the second compound M2.

A dashed arrow directed from S1(M2) to S1(M1) in FIG. 4 represents Forster energy transfer from the lowest singlet state of the second compound M2 to the first compound M1.

As shown in FIG. 4, when a compound having a small ΔST(M2) (delayed fluorescent material) is used as the second compound M2, inverse intersystem crossing from the lowest triplet state T1(M2) to the lowest singlet state S1(M2) can be caused by a heat energy. Subsequently, Forster energy transfer from the lowest singlet state S1(M2) of the second compound M2 to the first compound M1 occurs to generate the lowest singlet state S1(M1). Consequently, fluorescence from the lowest singlet state S1(M1) of the first compound M1 can be observed. It is inferred that the internal quantum efficiency can be theoretically raised up to 100% also by using delayed fluorescence by the TADF mechanism.

The second compound as the host material may be a compound having a higher Lowest Unoccupied Molecular Orbital (LUMO) level and a lower Highest Occupied Molecular Orbital (HOMO) level than the dopant material. Examples of the host material include: (1) a metal complex such as an aluminum complex, beryllium complex, or zinc complex; (2) a heterocyclic compound such as an oxadiazole derivative, benzimidazole derivative, or phenanthroline derivative; (3) a fused aromatic compound such as a carbazole derivative, anthracene derivative, phenanthrene derivative, pyrene derivative, or chrysene derivative; and (4) an aromatic amine compound such as a triarylamine derivative or a fused polycyclic aromatic amine derivative.

The organic EL device of the exemplary embodiment preferably emits green light.

When the organic EL device of the exemplary embodiment emits green light, a main peak wavelength of the light emitted from the organic EL device is preferably in a range from 500 nm to 560 nm.

A main peak wavelength of the light emitted from the organic EL device is measured as follows.

Voltage is applied on the organic EL devices such that a current density becomes 10 mA/cm$^2$, where spectral radiance spectrum is measured by a spectroradiometer CS-2000 (manufactured by Konica Minolta, Inc.).

A peak wavelength of an emission spectrum, at which the luminous intensity of the resultant spectral radiance spectrum is at the maximum, is measured and defined as the main peak wavelength (unit: nm).

Film Thickness of Emitting Layer

A film thickness of the emitting layer of the organic EL device in the exemplary embodiment is preferably in a range of 5 nm to 50 nm, more preferably in a range of 7 nm to 50 nm, further preferably in a range of 10 nm to 50 nm. When the film thickness of the emitting layer is 5 nm or more, the formation of the emitting layer and the adjustment of the chromaticity are easy. When the film thickness of the emitting layer is 50 nm or less, an increase in the drive voltage is likely to be reducible.

Content Ratios of Compounds in Emitting Layer

Content ratios of the first and second compounds contained in the emitting layer preferably fall, for instance, within a range below.

The content ratio of the first compound is preferably in a range from 0.01 mass % to 10 mass %, more preferably in a range from 0.01 mass % to 5 mass %, further preferably in a range from 0.01 mass % to 2 mass %.

The content ratio of the second compound is preferably in a range from 10 mass % to 80 mass %, more preferably in a range from 10 mass % to 60 mass %, further preferably in a range from 20 mass % to 60 mass %.

It is not excluded that the emitting layer of the exemplary embodiment further contains a material(s) other than the first and second compounds.

The emitting layer may include a single type of the first compound or may include two or more types of the first compound. The emitting layer may include a single of the second compound or may include two or more types of the second compound.

Substrate

The substrate is used as a support for the organic EL device. For instance, glass, quartz, plastics and the like are usable for the substrate. A flexible substrate is also usable. The flexible substrate means a substrate that can be bent. Examples of the flexible substrate include a plastic substrate made using polycarbonate, polyarylate, polyethersulfone, polypropylene, polyester, polyvinyl fluoride, and polyvinyl chloride. Moreover, an inorganic vapor deposition film is also usable.

Anode

Metal having a large work function (specifically, 4.0 eV or more), an alloy, an electrically conductive compound and a mixture thereof are preferably used as the anode formed on the substrate. Specific examples of the material include ITO (Indium Tin Oxide), indium oxide-tin oxide containing silicon or silicon oxide, indium oxide-zinc oxide, indium oxide containing tungsten oxide and zinc oxide, and graphene. In addition, gold (Au), platinum (Pt), nickel (Ni), tungsten (W), chrome (Cr), molybdenum (Mo), iron (Fe), cobalt (Co), copper (Cu), palladium (Pd), titanium (Ti), and nitrides of a metal material (e.g., titanium nitride) are usable.

The material is typically formed into a film by a sputtering method. For instance, the indium oxide-zinc oxide can be formed into a film by the sputtering method using a target in which zinc oxide in a range from 1 mass % to 10 mass % is added to indium oxide. Moreover, for instance, the indium oxide containing tungsten oxide and zinc oxide can be formed by the sputtering method using a target in which tungsten oxide in a range from 0.5 mass % to 5 mass % and zinc oxide in a range from 0.1 mass % to 1 mass % are added to indium oxide. In addition, the anode may be formed by a vacuum deposition method, a coating method, an inkjet method, a spin coating method or the like.

Among the organic layers formed on the anode, since the hole injecting layer adjacent to the anode is formed of a composite material into which holes are easily injectable irrespective of the work function of the anode, a material usable as an electrode material (e.g., metal, an alloy, an electroconductive compound, a mixture thereof, and the elements belonging to the group 1 or 2 of the periodic table) is also usable for the anode.

A material having a small work function such as elements belonging to Groups 1 and 2 in the periodic table of the elements, specifically, an alkali metal such as lithium (Li) and cesium (Cs), an alkaline earth metal such as magnesium (Mg), calcium (Ca) and strontium (Sr), alloys (e.g., MgAg and AlLi) including the alkali metal or the alkaline earth metal, a rare earth metal such as europium (Eu) and ytterbium (Yb), alloys including the rare earth metal are also usable for the anode. It should be noted that the vacuum deposition method and the sputtering method are usable for forming the anode using the alkali metal, alkaline earth metal and the alloy thereof. Further, when a silver paste is used for the anode, the coating method and the inkjet method are usable.

Cathode

It is preferable to use metal, an alloy, an electroconductive compound, and a mixture thereof, which have a small work function (specifically, 3.8 eV or less) for the cathode. Examples of the material for the cathode include elements belonging to Groups 1 and 2 in the periodic table of the elements, specifically, the alkali metal such as lithium (Li) and cesium (Cs), the alkaline earth metal such as magnesium (Mg), calcium (Ca) and strontium (Sr), alloys (e.g., MgAg and AlLi) including the alkali metal or the alkaline earth metal, the rare earth metal such as europium (Eu) and ytterbium (Yb), and alloys including the rare earth metal.

It should be noted that the vacuum deposition method and the sputtering method are usable for forming the cathode using the alkali metal, alkaline earth metal and the alloy thereof. Further, when a silver paste is used for the cathode, the coating method and the inkjet method are usable.

By providing the electron injecting layer, various conductive materials such as Al, Ag, ITO, graphene, and indium oxide-tin oxide containing silicon or silicon oxide are usable for forming the cathode regardless of a magnitude of the work function. The conductive materials can be formed into a film using the sputtering method, inkjet method, spin coating method and the like.

Hole Injecting Layer

The hole injecting layer is a layer containing a substance exhibiting a high hole injectability. Examples of the substance exhibiting a high hole injectability include molybdenum oxide, titanium oxide, vanadium oxide, rhenium oxide, ruthenium oxide, chrome oxide, zirconium oxide, hafnium oxide, tantalum oxide, silver oxide, tungsten oxide, and manganese oxide.

In addition, the examples of the highly hole-injectable substance further include: an aromatic amine compound, which is a low-molecule organic compound, such as 4,4', 4"-tris(N,N-diphenylamino)triphenylamine (abbreviation: TDATA), 4,4',4"-tris[N-(3-methylphenyl)-N-phenylamino] triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylaminojbiphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazole-3-yl)amino]-9-phenylcarbazole (abbreviation: PCzPCN1).

In addition, a high polymer compound (e.g., oligomer, dendrimer and polymer) is usable as the substance exhibiting a high hole injectability. Examples of the high-molecule compound include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), and poly[N,N'-bis(4-butylphenyl)-N,N'-bis(phenyl)benzidine] (abbreviation: Poly-TPD). Moreover, an acid-added high polymer compound such as poly(3,4-ethylenedioxythiophene)/poly(styrene sulfonic acid) (PEDOT/PSS) and polyaniline/poly(styrene sulfonic acid) (PAni/PSS) are also usable.

Hole Transporting Layer

The hole transporting layer is a layer containing a highly hole-transporting substance. An aromatic amine compound, carbazole derivative, anthracene derivative and the like are usable for the hole transporting layer. Specifically, an aromatic amine compound such as 4,4'-bis[N-(1-naphthyl)-N-phenylamino]biphenyl (abbreviation: NPB) ⇔ N,N'-bis(3-methylphenyl)-N,N'-diphenyl-[1,1'-biphenyl]-4,4'-diamine (abbreviation: TPD), 4-phenyl-4'-(9-phenylfluorene-9-yl)triphenylamine (abbreviation: BAFLP), 4,4'-bis[N-(9,9-dimethylfluorene-2-yl)-N-phenylamino]biphenyl (abbreviation: DFLDPBi), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluorene-2-yl)-N-phenylamino]biphenyl (abbreviation: BSPB) are usable. The above-described substances mostly have a hole mobility of $10^{-6}$ cm$^2$A/s or more.

For the hole transporting layer, a carbazole derivative such as CBP, CzPA, and PCzPA and an anthracene derivative such as t-BuDNA, DNA, and DPAnth may be used. A high polymer compound such as poly(N-vinylcarbazole) (abbreviation: PVK) and poly(4-vinyltriphenylamine) (abbreviation: PVTPA) is also usable.

However, in addition to the above substances, any substance exhibiting a higher hole transportability than an electron transportability may be used. A layer containing the substance exhibiting a higher hole transportability may be provided in the form of a single layer or a laminated layer of two or more layers of the above substance(s).

Electron Transporting Layer

The electron transporting layer is a layer containing a highly electron-transporting substance. For the electron transporting layer, 1) a metal complex such as an aluminum complex, beryllium complex, and zinc complex, 2) a hetero aromatic compound such as imidazole derivative, benzimidazole derivative, azine derivative, carbazole derivative, and phenanthroline derivative, and 3) a high polymer compound are usable. Specifically, as a low-molecule organic compound, a metal complex such as Alq, tris(4-methyl-8-quinolinato)aluminum (abbreviation: Almq$_3$), bis(10-hydroxybenzo[h]quinolinato)beryllium (abbreviation: BeBq$_2$), BAlq, Znq, ZnPBO and ZnBTZ is usable. In addition to the metal complex, a heteroaromatic compound such as 2-(4-biphenylyl)-5-(4-tert-butylphenyl)-1,3,4-oxadiazole (abbreviation: PBD), 1,3-bis[5-(ptert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproine (abbreviation: BCP), and 4,4'-bis(5-methylbenzoxazole-2-yl)stilbene (abbreviation: BzOs) is usable. The above-described substances mostly have an electron mobility of $10^{-6}$ cm$^2$A/s or more. It should be noted that any substance other than the above substance may be used for the electron transporting layer as long as the substance exhibits a higher electron transportability than the hole transportability. Moreover, the electron transporting layer may be provided in the form of a single layer or a laminated layer of two or more layers of the above substance(s).

Further, a high polymer compound is usable for the electron transporting layer. For instance, poly[(9,9-dihexylfluorene-2,7-diyl)-co-(pyridine-3,5-diyl)](abbreviation: PF-Py), poly[(9,9-dioctylfluorene-2,7-diyl)-co-(2,2'-bipyridine-6,6'-diyl)](abbreviation: PF-BPy) and the like are usable.

Electron Injecting Layer

The electron injecting layer is a layer containing a highly electron-injectable substance. Examples of a material for the electron injecting layer include an alkali metal, alkaline earth metal and a compound thereof, examples of which include lithium (Li), cesium (Cs), calcium (Ca), lithium fluoride (LiF), cesium fluoride (CsF), calcium fluoride (CaF$_2$), and lithium oxide (LiOx). In addition, the alkali metal, alkaline earth metal or the compound thereof may be added to the substance exhibiting the electron transportability in use. Specifically, for instance, magnesium (Mg) added to Alq may be used. In this case, the electrons can be more efficiently injected from the cathode.

Alternatively, the electron injecting layer may be provided by a composite material in a form of a mixture of the organic compound and the electron donor. Such a composite material exhibits excellent electron injectability and electron transportability since electrons are generated in the organic compound by the electron donor. In this case, the organic compound is preferably a material excellent in transporting the generated electrons. Specifically, the above examples (e.g., the metal complex and the hetero aromatic compound) of the substance forming the electron transporting layer are usable. As the electron donor, any substance exhibiting electron donating property to the organic compound is usable. Specifically, the electron donor is preferably alkali metal, alkaline earth metal and rare earth metal such as lithium, cesium, magnesium, calcium, erbium and ytterbium. The electron donor is also preferably alkali metal oxide and alkaline earth metal oxide such as lithium oxide, calcium oxide, and barium oxide. Moreover, a Lewis base such as magnesium oxide is usable. Further, the organic compound such as tetrathiafulvalene (abbreviation: TTF) is usable.

Layer Formation Method

A method for forming each layer of the organic EL device in the present exemplary embodiment is subject to no limitation except for the above particular description. However, known methods of dry film-forming such as vacuum deposition, sputtering, plasma or ion plating and wet film-forming such as spin coating, dipping, flow coating or ink-jet are applicable.

Film Thickness

A thickness of each of the organic layers in the organic EL device according to the third exemplary embodiment is not limited except for the above particular description. In general, the thickness preferably ranges from several nanometers to 1 μm because excessively small film thickness is likely to cause defects (e.g. pin holes) and excessively large thickness leads to the necessity of applying high voltage and consequent reduction in efficiency.

The organic EL device according to the third exemplary embodiment exhibits an improved performance because of containing the compound of the first exemplary embodiment. In another embodiment, an organic EL device having a low drive voltage, a high EQE, and a narrow main-peak full width at half maximum of light emitted from the organic EL device can be provided.

Fourth Exemplary Embodiment

Organic Electroluminescence Device

An arrangement of an organic EL device according to a fourth exemplary embodiment will be described below. In the description of the fourth exemplary embodiment, the same components as those in the third exemplary embodiment are denoted by the same reference signs and names to simplify or omit an explanation of the components. In the fourth exemplary embodiment, any materials and compounds that are not specified may be the same as those in the third exemplary embodiment.

The organic EL device according to the fourth exemplary embodiment is different from the organic EL device according to the third exemplary embodiment in that the emitting layer further includes a third compound. The rest of the arrangement of the organic EL device according to the fifth exemplary embodiment is the same as in the third exemplary embodiment.

In the fourth exemplary embodiment, the emitting layer preferably contains the first compound, the second compound, and the third compound. In this arrangement, the first compound is more preferably the compound of the first exemplary embodiment, and the second compound is further preferably the delayed fluorescent material. Moreover, in this arrangement, the first compound is preferably the dopant material, and the second compound is preferably the host material. The third compound is preferably not the dopant material. For instance, the total amount of the second compound and the third compound in the emitting layer of the fourth exemplary embodiment accounts for 50 mass % or more of the total mass of the emitting layer, and may account for 60 mass % or more of the layer, 70 mass % or more of the layer, 80 mass % or more of the layer, 90 mass % or more of the layer, or 95 mass % or more of the layer.

Third Compound

The third compound may be a thermally activated delayed fluorescent compound or a compound exhibiting no thermally activated delayed fluorescence.

The third compound is not particularly limited, but is preferably a compound other than an amine compound. Specifically, the third compound preferably does not contain a substituted or unsubstituted amino group. Although the third compound may be a carbazole derivative, dibenzofuran derivative, or dibenzothiophene derivative, the third compound is not limited thereto.

It is also preferable that the third compound has at least one of a partial structure represented by a formula (31), a partial structure represented by a formula (32), a partial structure represented by a formula (33A) and a partial structure represented by a formula (34A) in one molecule.

(31)

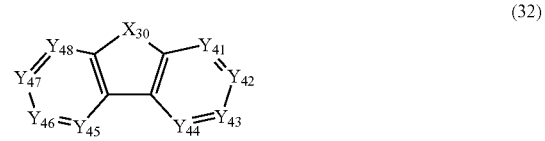

(32)

(33A)

(34A)

In the formula (31), $Y_{31}$ to $Y_{36}$ each independently represent a nitrogen atom or a carbon atom bonded to another atom in the molecule of the third compound.

At least one of $Y_{31}$ to $Y_{36}$ is a carbon atom bonded to another atom in the molecule of the third compound.

In the formula (32), $Y_{41}$ to $Y_{48}$ each independently represent a nitrogen atom or a carbon atom bonded to another atom in the molecule of the third compound.

At least one of $Y_{41}$ to $Y_{48}$ is a carbon atom bonded to another atom in the molecule of the third compound.

$X_{30}$ represents a nitrogen atom bonded to another atom in the molecule of the third compound, an oxygen atom, or a sulfur atom.

The mark * in the formulae (33A) and (34A) each independently shows a bonding position with another atom or another structure in the molecule of the third compound.

The third compound preferably has 2 to 10 partial structures in total of the partial structure represented by the formula (31) and the partial structure represented by the formula (32) in one molecule, more preferably has 4 to 8 partial structures.

In the formula (32), it is also preferable that at least two of $Y_{41}$ to $Y_{48}$ are carbon atoms bonded to other atoms in the molecule of the third compound to form a cyclic structure including the carbon atoms.

For instance, the partial structure represented by the formula (32) is preferably any one selected from the group consisting of partial structures represented by formulae (321), (322), (323), (324), (325) and (326).

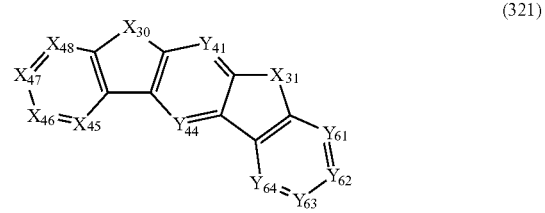

(321)

(322) 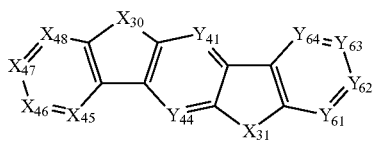

(323) 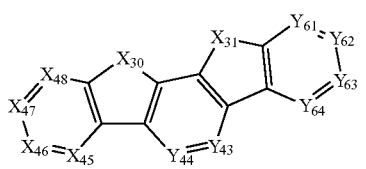

(324) 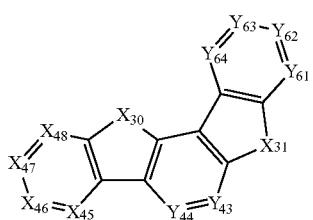

(325) 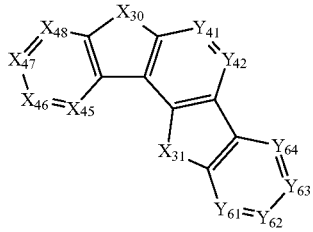

(326) 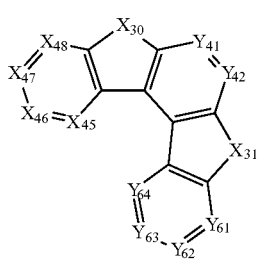

In the formulae (321) to (326), $X_{30}$ each independently represents a nitrogen atom bonded to another atom in the molecule of the third compound, an oxygen atom, or a sulfur atom.

$Y_{41}$ to $Y_{48}$ each independently represent a nitrogen atom or a carbon atom bonded to another atom in the molecule of the third compound.

$X_{31}$ each independently represents a nitrogen atom bonded to another atom in the molecule of the third compound, an oxygen atom, a sulfur atom, or a carbon atom bonded to another atom in the molecule of the third compound.

$Y_{61}$ to $Y_{64}$ each independently represent a nitrogen atom or a carbon atom bonded to another atom in the molecule of the third compound.

In the exemplary embodiments, the third compound preferably has the partial structure represented by the formula (323) among those represented by the formulae (323) to (326).

The partial structure represented by the formula (31) is preferably included in the third compound as at least one group selected from the group consisting of a group represented by a formula (33) and a group represented by a formula (34) below.

It is also preferable that the third compound has at least one of the partial structures represented by the formulae (33) and (34). Since bonding positions are situated in meta positions as shown in the partial structures represented by the formulae (33) and (34), an energy gap $T_{77K}$(M3) at 77 K of the third compound can be kept high.

(33)

(34)

In the formula (33), $Y_{31}$, $Y_{32}$, $Y_{34}$ and $Y_{36}$ are each independently a nitrogen atom or $CR_{31}$.

In the formula (34), $Y_{32}$, $Y_{34}$ and $Y_{36}$ are each independently a nitrogen atom or $CR_{31}$.

In the formulae (33) and (34), $R_{31}$ each independently represents a hydrogen atom or a substituent.

$R_{31}$ as the substituent is each independently selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a halogen atom, a cyano group, a nitro group, and a substituted or unsubstituted carboxy group.

The substituted or unsubstituted aryl group having 6 to 30 ring carbon atoms for $R_{31}$ is preferably a non-fused ring.

The mark * in the formulae (33) and (34) each independently shows a bonding position with another atom or another structure in the molecule of the third compound.

In the formula (33), $Y_{31}$, $Y_{32}$, $Y_{34}$ and $Y_{36}$ are each independently preferably $CR_{31}$, in which a plurality of $R_{31}$ are the same or different.

In the formula (34), $Y_{32}$, $Y_{34}$ and $Y_{36}$ are each independently preferably $CR_{31}$, in which a plurality of $R_{31}$ are the same or different.

The substituted germanium group is preferably represented by —Ge($R_{301}$)3. $R_{301}$ is each independently a substituent. The substituent $R_{301}$ is preferably a substituted or unsubstituted alkyl group having 1 to 30 carbon atoms or a substituted or unsubstituted aryl group having 6 to 30 ring carbon atoms. A plurality of $R_{301}$ are mutually the same or different.

The partial structure represented by the formula (32) is preferably included in the third compound as at least one group selected from the group consisting of groups represented by formulae (35) to (39) and a group represented by a formula (30a).

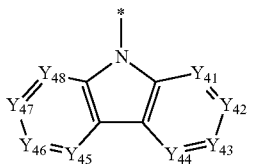
(35)

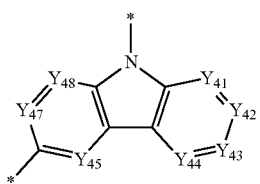
(36)

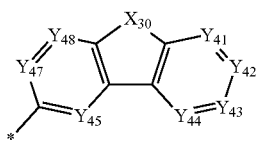
(37)

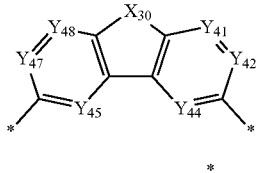
(38)

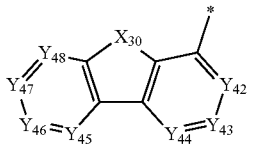
(39)

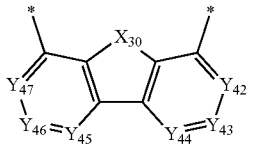
(30a)

In the formula (35), $Y_{41}$ to $Y_{48}$ are each independently a nitrogen atom or $CR_{32}$.

In the formulae (36) and (37), $Y_{41}$ to $Y_{45}$, $Y_{47}$ and $Y_{48}$ are each independently a nitrogen atom or $CR_{32}$.

In the formula (38), $Y_{41}$, $Y_{42}$, $Y_{44}$, $Y_{45}$, $Y_{47}$ and $Y_{48}$ are each independently a nitrogen atom or $CR_{32}$.

In the formula (39), $Y_{42}$ to $Y_{48}$ are each independently a nitrogen atom or $CR_{32}$.

In the formula (30a), $Y_{42}$ to $Y_{47}$ are each independently a nitrogen atom or $CR_{32}$.

In the formulae (35) to (39) and (30a), $R_{32}$ each independently represents a hydrogen atom or a substituent.

$R_{32}$ as the substituent is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a halogen atom, a cyano group, a nitro group, and a substituted or unsubstituted carboxy group.

A plurality of $R_{32}$ are the same or different.

In the formulae (37) to (39) and (30a), $X_{30}$ is $NR_{33}$, an oxygen atom or a sulfur atom.

$R_{33}$ is selected from the group consisting of a substituted or unsubstituted aryl group having 6 to 30 ring carbon atoms, a substituted or unsubstituted heteroaryl group having 5 to 30 ring atoms, a substituted or unsubstituted alkyl group having 1 to 30 carbon atoms, a substituted or unsubstituted fluoroalkyl group having 1 to 30 carbon atoms, a substituted or unsubstituted cycloalkyl group having 3 to 30 ring carbon atoms, a substituted or unsubstituted aralkyl group having 7 to 30 carbon atoms, a substituted or unsubstituted silyl group, a substituted germanium group, a substituted phosphine oxide group, a fluorine atom, a cyano group, a nitro group, and a substituted or unsubstituted carboxy group.

A plurality of $R_{33}$ are the same or different.

The substituted or unsubstituted aryl group having 6 to 30 ring carbon atoms for $R_{33}$ is preferably a non-fused ring.

The mark * in the formulae (35) to (39) and (30a) each independently shows a bonding position with another atom or another structure in the molecule of the third compound.

In the formula (35), $Y_{41}$ to $Y_{48}$ are each independently preferably $CR_{32}$. In the formulae (36) and (37), $Y_{41}$ to $Y_{45}$, $Y_{47}$ and $Y_{48}$ are each independently preferably $CR_{32}$. In the formula (38), $Y_{41}$, $Y_{42}$, $Y_{44}$, $Y_{45}$, $Y_{47}$ and $Y_{48}$ are each independently preferably $CR_{32}$. In the formula (39), $Y_{42}$ to $Y_{48}$ are each independently preferably $CR_{32}$. In the formula (30a), $Y_{42}$ to $Y_{47}$ are each independently preferably $CR_{32}$. A plurality of $R_{32}$ are the same or different.

In the third compound, $X_{30}$ is preferably an oxygen atom or a sulfur atom, more preferably an oxygen atom.

In the third compound, $R_{31}$ and $R_{32}$ each independently represent a hydrogen atom or a substituent. $R_{31}$ and $R_{32}$ as the substituents are preferably each independently a group selected from the group consisting of a fluorine atom, a cyano group, a substituted or unsubstituted alkyl group having 1 to 30 carbon atoms, a substituted or unsubstituted aryl group having 6 to 30 ring carbon atoms, and a substituted or unsubstituted heteroaryl group having 5 to 30 ring atoms. $R_{31}$ and $R_{32}$ are more preferably a hydrogen atom, a cyano group, a substituted or unsubstituted aryl group having 6 to 30 ring carbon atoms, or a substituted or unsubstituted heteroaryl group having 5 to 30 ring atoms. When $R_{31}$ and $R_{32}$ as the substituents are each a substituted or unsubstituted aryl group having 6 to 30 ring carbon atoms, the aryl group is preferably a non-fused ring.

It is also preferable that the third compound is an aromatic hydrocarbon compound or an aromatic heterocyclic compound.

Examples of the substituent in the third compound are shown below, but the invention is not limited thereto.

Specific examples of the aryl group (occasionally referred to as an aromatic hydrocarbon group) include a phenyl group, tolyl group, xylyl group, naphthyl group, phenanthryl group, pyrenyl group, chrysenyl group, benzo[c]phenanthryl group, benzo[g]chrysenyl group, benzoanthryl group, triphenylenyl group, fluorenyl group, 9,9-dimethylfluorenyl group, benzofluorenyl group, dibenzofluorenyl group, biphenyl group, terphenyl group, quarterphenyl group and fluoranthenyl group, among which a phenyl group, biphenyl group, terphenyl group, quarterphenyl group, naphthyl group, triphenylenyl group and fluorenyl group may be preferable.

Specific examples of the aryl group having a substituent include a tolyl group, xylyl group and 9,9-dimethylfluorenyl group.

As is understood from the specific examples, the aryl group includes both fused aryl group and non-fused aryl group.

Preferable examples of the aryl group include a phenyl group, biphenyl group, terphenyl group, quarterphenyl group, naphthyl group, triphenylenyl group and fluorenyl group.

Specific examples of the heteroaryl group (occasionally referred to as a heterocyclic group, heteroaromatic ring group or aromatic heterocyclic group) include a pyrrolyl group, pyrazolyl group, pyrazinyl group, pyrimidinyl group, pyridazynyl group, pyridyl group, triazinyl group, indolyl group, isoindolyl group, imidazolyl group, benzimidazolyl group, indazolyl group, imidazo[1,2-a]pyridinyl group, furyl group, benzofuranyl group, isobenzofuranyl group, dibenzofuranyl group, azadibenzofuranyl group, thiophenyl group, benzothienyl group, dibenzothienyl group, azadibenzothienyl group, quinolyl group, isoquinolyl group, quinoxalinyl group, quinazolinyl group, naphthyridinyl group, carbazolyl group, azacarbazolyl group, phenanthridinyl group, acridinyl group, phenanthrolinyl group, phenazinyl group, phenothiazinyl group, phenoxazinyl group, oxazolyl group, oxadiazolyl group, furazanyl group, benzoxazolyl group, thienyl group, thiazolyl group, thiadiazolyl group, benzothiazolyl group, triazolyl group and tetrazolyl group, among which a dibenzofuranyl group, dibenzothienyl group, carbazolyl group, pyridyl group, pyrimidinyl group, triazinyl group, azadibenzofuranyl group and azadibenzothienyl group may be preferable.

The heteroaryl group is preferably a dibenzofuranyl group, dibenzothienyl group, carbazolyl group, pyridyl group, pyrimidinyl group, triazinyl group, azadibenzofuranyl group or azadibenzothienyl group, and more preferably a dibenzofuranyl group, dibenzothienyl group, azadibenzofuranyl group and azadibenzothienyl group.

In the third compound, it is also preferable that the substituted silyl group is selected from the group consisting of a substituted or unsubstituted trialkylsilyl group, a substituted or unsubstituted arylalkylsilyl group, or a substituted or unsubstituted triarylsilyl group.

Specific examples of the substituted or unsubstituted trialkylsilyl group include trimethylsilyl group and triethylsilyl group.

Specific examples of the substituted or unsubstituted arylalkylsilyl group include diphenylmethylsilyl group, ditolylmethylsilyl group, and phenyldimethylsilyl group.

Specific examples of the substituted or unsubstituted triarylsilyl group include triphenylsilyl group and tritolylsilyl group.

In the third compound, it is also preferable that the substituted phosphine oxide group is a substituted or unsubstituted diaryl phosphine oxide group.

Specific examples of the substituted or unsubstituted diaryl phosphine oxide group include a diphenyl phosphine oxide group and ditolyl phosphine oxide group.

In the third compound, the substituted carboxy group is exemplified by a benzoyloxy group.

Manufacturing Method of Third Compound

The third compound can be manufactured by methods disclosed in International Publication No. WO2012/153780, International Publication No. WO2013/038650, and the like. Furthermore, the second compound can be manufactured, for instance, by application of known substitution reactions and/or materials depending on a target compound.

Specific Examples of Third Compound

Specific examples of the third compound in the exemplary embodiment are shown below. It should be noted that the third compound of the invention is not limited to the specific examples.

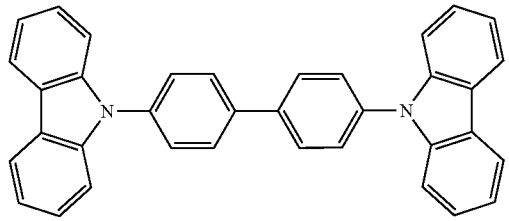

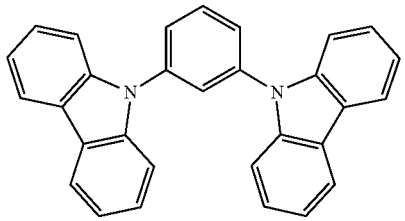

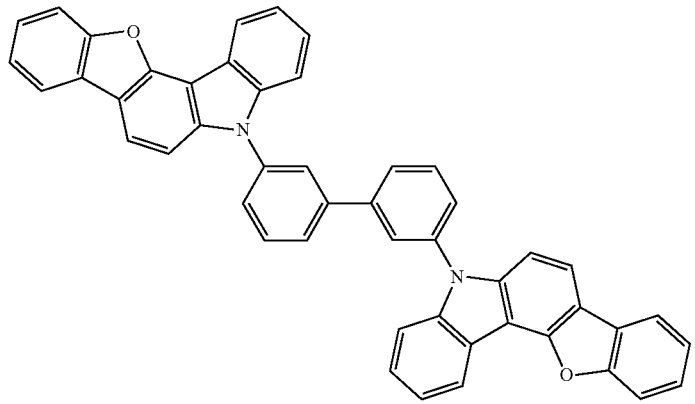

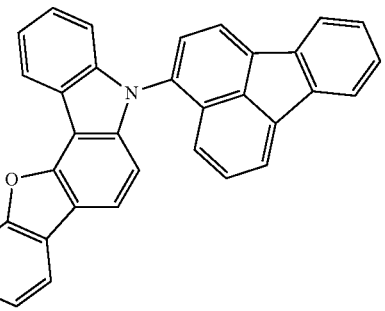

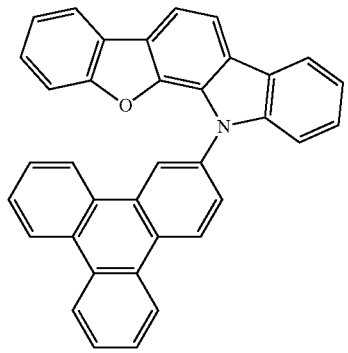
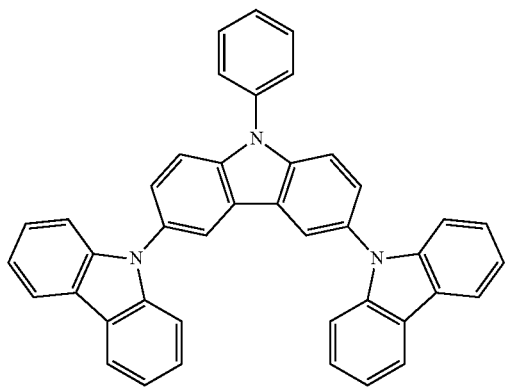
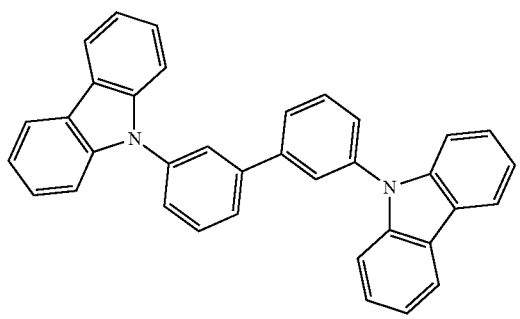
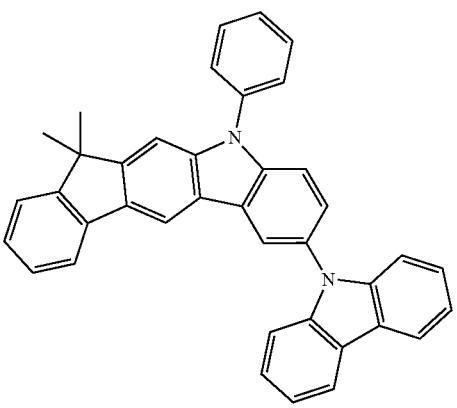
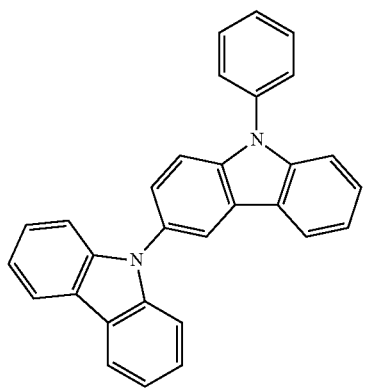
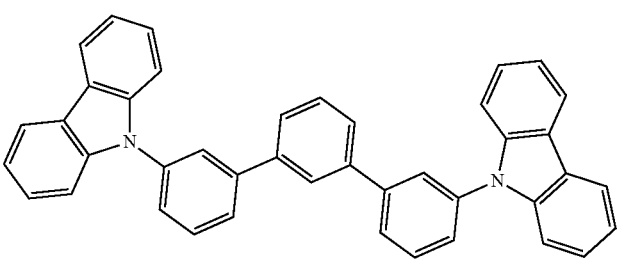
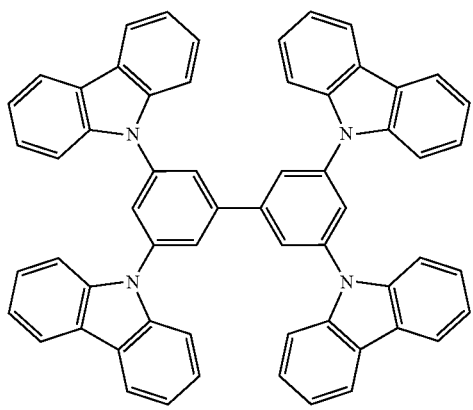

-continued

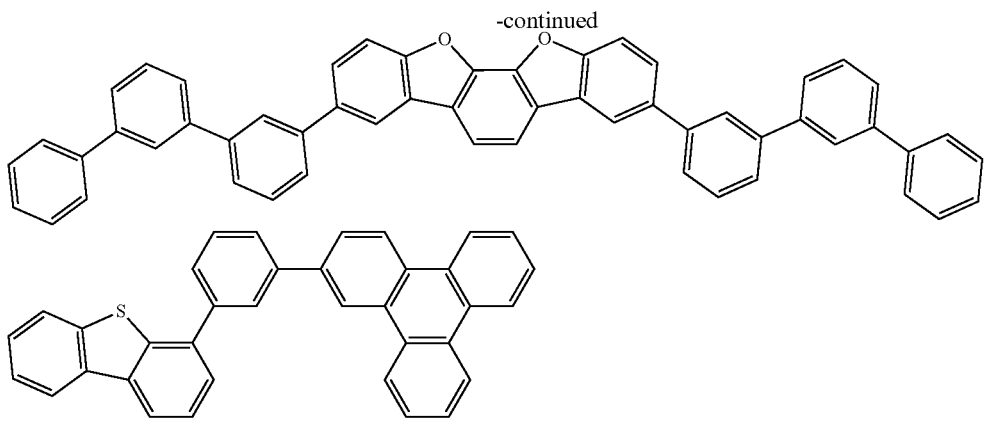

Relationship between First Compound, Second Compound and Third Compound in Emitting Layer In the organic EL device of the exemplary embodiment, when the emitting layer contains the second compound and the third compound, a lowest singlet energy $S_1(M2)$ of the second compound and a lowest singlet energy $S_1(M3)$ of the third compound preferably satisfy a relationship of a numerical formula (Numerical Formula 2) below.

$$S_1(M3) > S_1(M2) \quad \text{(Numerical Formula 2)}$$

An energy gap $T_{77K}(M3)$ at 77K of the third compound is preferably larger than an energy gap $T_{77K}(M1)$ at 77K of the first compound.

The energy gap $T_{77K}(M3)$ at 77K of the third compound is preferably larger than an energy gap $T_{77K}(M2)$ at 77K of the second compound.

A lowest singlet energy $S_1(M1)$ of the first compound, the lowest singlet energy $ST(M2)$ of the second compound, and the lowest singlet energy $S_1(M3)$ of the third compound preferably satisfy a relationship of a numerical formula (Numerical Formula 2A) below.

$$S_1(M3) > S_1(M2) > S_1(M1) \quad \text{(Numerical Formula 2A)}$$

An energy gap $T_{77K}(M1)$ at 77K of the first compound, an energy gap $T_{77K}(M2)$ at 77K of the second compound, and an energy gap $T_{77K}(M3)$ at 77K of the third compound preferably satisfy a relationship of a numerical formula (Numerical Formula 2B) below.

$$T_{77K}(M3) > T_{77K}(M2) > T_{77K}(M1) \quad \text{(Numerical Formula 2B)}$$

When the organic EL device of the exemplary embodiment emits light, it is preferable that the compound of the first exemplary embodiment mainly emits light in the emitting layer.

The organic EL device of the fourth exemplary embodiment preferably emits green light in the same manner as the organic EL device of the third exemplary embodiment.

When the organic EL device of the exemplary embodiment emits green light, a main peak wavelength of the light emitted from the organic EL device is preferably in a range from 500 nm to 560 nm.

A main peak wavelength of the organic EL device can be measured by the same method as that for the organic EL device of the third exemplary embodiment.

Content Ratios of Compounds in Emitting Layer

When the emitting layer contains the first compound, the second compound, and the third compound, the content ratios of the first compound, the second compound, and the third compound in the emitting layer preferably fall, for instance, within a range below.

The content ratio of the first compound is preferably in a range from 0.01 mass % to 10 mass %, more preferably in a range from 0.01 mass % to 5 mass %, further preferably in a range from 0.01 mass % to 2 mass %.

The content ratio of the second compound is preferably in a range from 10 mass % to 80 mass %, more preferably in a range from 10 mass % to 60 mass %, further preferably in a range from 20 mass % to 60 mass %.

The content ratio of the third compound is preferably in a range from 10 mass % to 80 mass %.

An upper limit of the total of the respective content ratios of the first, second and third compounds in the emitting layer is 100 mass %. It should be noted that the emitting layer of the exemplary embodiment may further contain material(s) other than the first, second and third compounds.

The emitting layer may include a single type of the first compound or may include two or more types of the first compound. The emitting layer may include a single of the second compound or may include two or more types of the second compound. The emitting layer may include a single of the third compound or may include two or more types of the third compound.

FIG. 5 shows an example of a relationship between energy levels of the first, second and third compounds in the emitting layer. In FIG. 5, S0 represents a ground state. S1(M1) represents the lowest singlet state of the first compound. T1(M1) represents the lowest triplet state of the first compound. S1 (M2) represents the lowest singlet state of the second compound. T1(M2) represents the lowest triplet state of the second compound. S1(M3) represents the lowest singlet state of the third compound. T1(M3) represents the lowest triplet state of the third compound. A dashed arrow directed from S1(M2) to S1(M1) in FIG. 5 represents Forster energy transfer from the lowest singlet state of the second compound to the first compound.

As shown in FIG. 5, when a compound (delayed fluorescent material) having a small $\Delta ST(M2)$ is used as the second compound, inverse intersystem crossing from the lowest triplet state T1 (M2) to the lowest singlet state S1 (M2) can be caused by a heat energy. Subsequently, Forster energy transfer from the lowest singlet state S1 (M2) of the second compound to the first compound occurs to generate the lowest singlet state S1(M1). Consequently, fluorescence from the lowest singlet state S1(M1) of the first compound can be observed. It is inferred that the internal quantum efficiency can be theoretically raised up to 100% also by using delayed fluorescence by the TADF mechanism.

The organic EL device according to the third exemplary embodiment exhibits an improved performance since containing the compound of the first exemplary embodiment. In another embodiment, an organic EL device having a low drive voltage, a high EQE, and a narrow main-peak full width at half maximum of light emitted from the organic EL device can be provided.

Fifth Exemplary Embodiment

Electronic Device

An electronic device according to the present exemplary embodiment is installed with any one of the organic EL devices according to the above exemplary embodiments. Examples of the electronic device include a display device and a light-emitting device. Examples of the display device include a display component (e.g., an organic EL panel module), TV, mobile phone, tablet and personal computer. Examples of the light-emitting unit include an illuminator and a vehicle light.

Modification of Embodiment(s)

The scope of the invention is not limited by the above-described exemplary embodiments but includes any modification and improvement as long as such modification and improvement are compatible with the invention.

For instance, the emitting layer is not limited to a single layer, but may be provided by laminating a plurality of emitting layers. When the organic EL device has a plurality of emitting layers, it is only required that at least one of the organic layers satisfies the conditions described in the above exemplary embodiments and it is preferable that at least one of the emitting layers contains the compound of the first exemplary embodiment. When one of the plurality of the emitting layers contains the compound of the first exemplary embodiment, for instance, the rest of the emitting layers may be fluorescent emitting layers, or phosphorescent emitting layers with use of emission caused by electron transfer from the triplet state directly to the ground state.

When the organic EL device includes a plurality of emitting layers, these emitting layers are mutually adjacently provided, or form a so-called tandem organic EL device, in which a plurality of emitting units are layered via an intermediate layer.

For instance, in an exemplary embodiment, a blocking layer is provided adjacent to at least one of a side near the anode and a side near the cathode of the emitting layer. The blocking layer is preferably provided in contact with the emitting layer to block at least any of holes, electrons, and excitons.

For instance, when the blocking layer is provided in contact with the cathode-side of the emitting layer, the blocking layer permits transport of electrons, and blocks holes from reaching a layer provided near the cathode (e.g., the electron transporting layer) beyond the blocking layer. When the organic EL device includes the electron transporting layer, the blocking layer is preferably disposed between the emitting layer and the electron transporting layer.

When the blocking layer is provided in contact with the anode-side of the emitting layer, the blocking layer permits transport of holes, but blocks electrons from reaching a layer provided near the anode (e.g., the hole transporting layer) beyond the blocking layer. When the organic EL device includes the hole transporting layer, the blocking layer is preferably disposed between the emitting layer and the hole transporting layer.

Alternatively, the blocking layer may be provided adjacent to the emitting layer so that the excitation energy does not leak out from the emitting layer toward neighboring layer(s). The blocking layer blocks excitons generated in the emitting layer from being transferred to a layer(s) (e.g., the electron transporting layer and the hole transporting layer) closer to the electrode(s) beyond the blocking layer.

The emitting layer is preferably bonded with the blocking layer.

Specific structure, shape and the like of the components in the invention may be designed in any manner as long as an object of the invention can be achieved.

EXAMPLES

Example(s) of the invention will be described below. However, the invention is not limited to Example(s).

Compounds

The compound represented by the formula (1) and used for manufacturing an organic EL device in Example 1 is shown below.

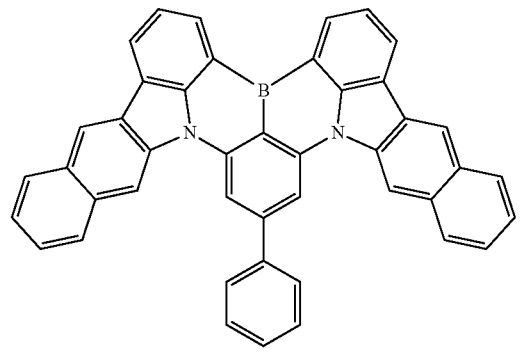

GD-1

Comparative compounds used for manufacturing organic EL devices in Comparatives 1 and 2 are shown below.

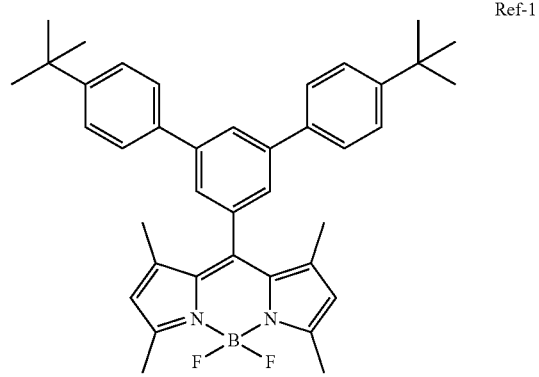

Ref-1

Ref-2
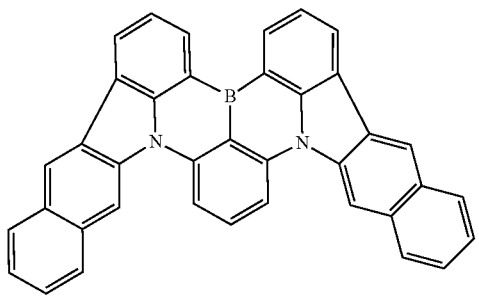
Other compounds used for manufacturing the organic EL devices in Examples and Comparatives are shown below.
HT-1
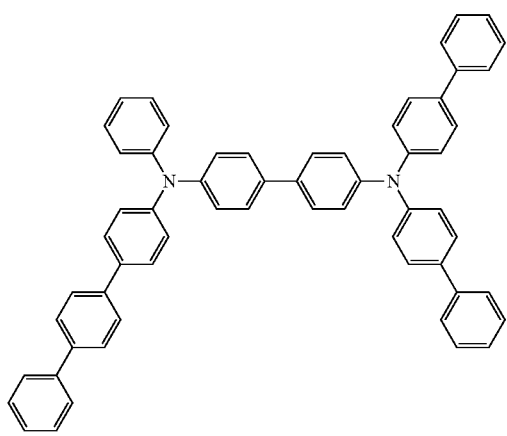
HA
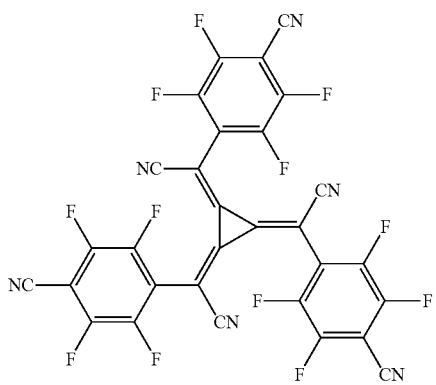
HT-2
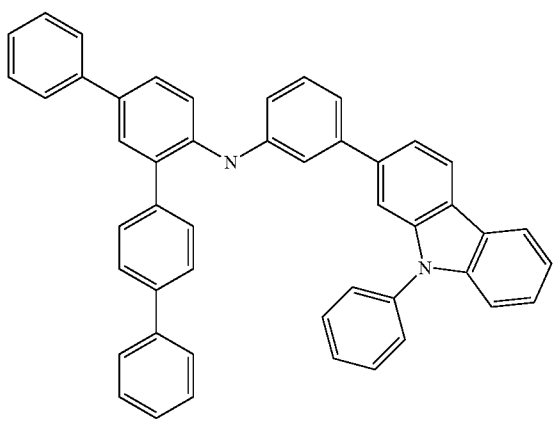
D-1
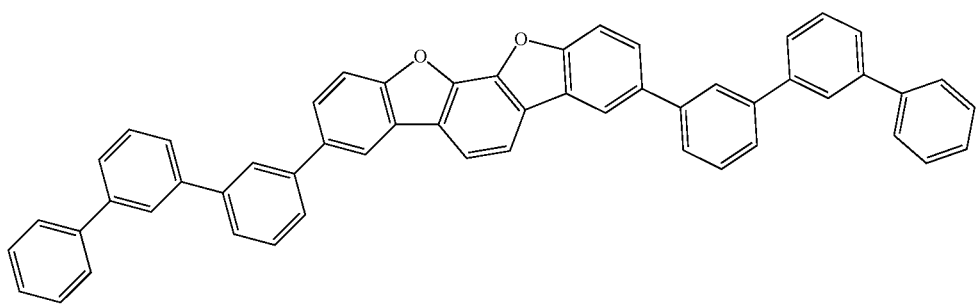

TADF-1

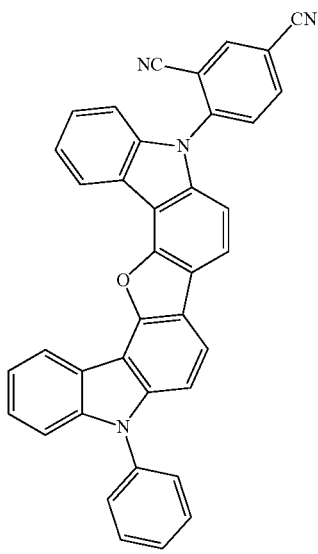

ET-1

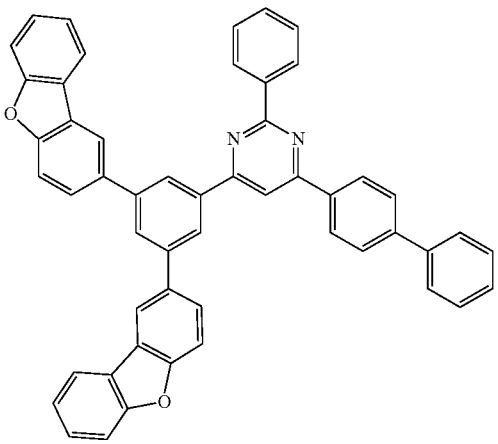

ET-2

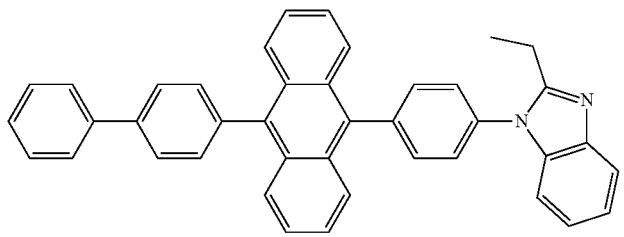

Preparation of Organic EL Device

The organic EL devices were prepared and evaluated as follows.

Example 1

A glass substrate (size: 25 mm*75 mm*1.1 mm thick, manufactured by Geomatec Co., Ltd.) having an ITO transparent electrode (anode) was ultrasonic-cleaned in isopropyl alcohol for five minutes, and then UV/ozone-cleaned for one minute. A film of ITO was 130 nm thick. After the glass substrate having the transparent electrode line was cleaned, the glass substrate was mounted on a substrate holder of a vacuum evaporation apparatus. Firstly, a compound HT-1 and a compound HA were co-deposited on a surface of the glass substrate where the transparent electrode line was provided in a manner to cover the transparent electrode, thereby forming a 10-nm-thick hole injecting layer. The concentrations of the compound HT-1 and the compound HA in the hole injecting layer were 97 mass % and 3 mass %, respectively.

Next, the compound HT-1 was vapor-deposited on the hole injecting layer to form a 110-nm-thick first hole transporting layer.

Next, a compound HT-2 was vapor-deposited on the first hole transporting layer to form a 10-nm-thick second hole transporting layer.

Next, a compound GD-1 (the first compound), a compound TADF-1 (the second compound), and a compound D-1 (the third compound) were co-deposited on the second hole transporting layer to form a 25-nm-thick emitting layer. The concentrations of the compound TADF-1, the compound GD-1, and the compound D-1 in the emitting layer were 25 mass %, 1 mass %, and 74 mass %, respectively.

Next, a compound ET-1 was vapor-deposited on the emitting layer to form a 5-nm-thick first electron transporting layer.

Next, a compound ET-2 was vapor-deposited on the first electron transporting layer to form a 50-nm-thick second electron transporting layer.

Next, lithium fluoride (LiF) was vapor-deposited on the second electron transporting layer to form a 1-nm-thick electron injectable electrode (cathode).

Subsequently, metal aluminum (Al) was vapor-deposited on the electron injectable electrode to form an 80-nm-thick metal Al cathode.

The device arrangement of the organic EL device in Example 1 is roughly shown as follows.

ITO(130)/HT-1:HA(10.97%:3%)/HT-1 (110)/HT-2(10)/D-1:TADF-1:GD-1 (25.74%:25%:1%)/ET-1 (5)/ET-2(50)/LiF(1)/Al(80)

Numerals in parentheses represent a film thickness (unit: nm).

The numerals (97%:3%) represented by percentage in the same parentheses indicate a ratio (mass %) between the compound HT and the compound HA in the hole injecting layer, and the numerals (74%:25%:1%) represented by percentage in the same parentheses indicate a ratio (mass %) between the third compound, the second compound, and the first compound in the emitting layer. Similar notations apply to the description below.

Comparative 1

The organic EL device in Comparative 1 was manufactured in the same manner as in Example 1 except that the first compound shown in Table 2 was used in place of the compound GD-1 in Example 1.

Comparative 2

The organic EL device in Comparative 2 was manufactured in the same manner as in Example 1 except that the first compound shown in Table 2 was used in place of the compound GD-1 in Example 1.

Evaluation of Organic EL Devices

The manufactured organic EL devices were evaluated as follows. Evaluation results are shown in Table 2. Moreover, Table 2 also shows the lowest singlet energy ST and the main peak wavelength of the compound of the formula (1), the thermally activated delayed fluorescence properties (ΔST and a Delay/Prompt ratio) and the lowest singlet energy $S_1$ of the second compound, and the lowest singlet energy ST of the third compound, the first, second and third compounds being used in the emitting layer in each Example.

Drive Voltage (V)

A voltage (unit: V) was measured when current was applied between the anode and the cathode such that a current density was 10 mA/cm$^2$.

CIE1931 Chromaticity

Voltage was applied on each of the organic EL devices such that a current density of the organic EL device was 10 mA/cm$^2$, where spectral radiance spectrum was measured by a spectroradiometer CS-2000 (manufactured by Konica Minolta, Inc.). The chromaticities CIEx and CIEy were calculated based on the obtained spectral-radiance spectra.

External Quantum Efficiency EQE

Voltage was applied on each of the organic EL devices such that a current density of the organic EL device was 10 mA/cm$^2$, where spectral radiance spectrum was measured by a spectroradiometer CS-2000 (manufactured by Konica Minolta, Inc.). The external quantum efficiency EQE (unit: %) was calculated based on the obtained spectral-radiance spectra, assuming that the spectra was provided under a Lambertian radiation.

Main Peak Wavelength (λp) and Full Width at Half Maximum FWHM

Voltage was applied on each of the organic EL devices such that a current density of the organic EL device was 10 mA/cm$^2$, where spectral radiance spectrum was measured by a spectroradiometer CS-2000 (manufactured by Konica Minolta, Inc.). The main peak wavelength $\lambda_P$ (unit: nm) was calculated based on the obtained spectral-radiance spectra. Moreover, a full width at half maximum FWHM (unit: nm) was measured based on the obtained spectral-radiance spectra.

half maximum. It is found that the organic EL device of Example 1 can emit green light efficiently with the emission spectrum kept narrow by having the ring represented by the formula (2) and introducing substituents at specific positions represented by $R_{15}$ to $R_{17}$ in the compound represented by the formula (1).

Evaluation of Compounds

Values of physical properties of the compounds shown in Table 2 were measured by the following method.

Delayed Fluorescence

Delayed Fluorescence of Compound TADF-1

Delayed fluorescence properties were checked by measuring transient photoluminescence (PL) using a device shown in FIG. 2. The compound TADF-1 was dissolved in toluene to prepare a dilute solution with an absorbance of 0.05 or less at the excitation wavelength to eliminate the contribution of self-absorption. In order to prevent quenching due to oxygen, the sample solution was frozen and degassed and then sealed in a cell with a lid under an argon atmosphere to obtain an oxygen-free sample solution saturated with argon.

The fluorescence spectrum of the above sample solution was measured with a spectrofluorometer FP-8600 (manufactured by JASCO Corporation), and the fluorescence spectrum of a 9,10-diphenylanthracene ethanol solution was measured under the same conditions. Using the fluorescence area intensities of both spectra, the total fluorescence quantum yield is calculated by an equation (1) in Morris et al. J. Phys. Chem. 80 (1976) 969.

Prompt emission was observed immediately when the excited state was achieved by exciting the compound TADF-1 with a pulse beam (i.e., a beam emitted from a pulse laser) having a wavelength to be absorbed by the compound TADF-1, and Delay emission was observed not immediately when the excited state was achieved but after the excited state was achieved. The delayed fluorescence in Examples means that an amount of Delay Emission is 5% or more with respect to an amount of Prompt Emission. Specifically, provided that the amount of Prompt emission is denoted by $X_P$ and the amount of Delay emission is denoted by $X_D$, the delayed fluorescence means that a value of $X_D/X_P$ is 0.05 or more.

An amount of Prompt emission, an amount of Delay emission and a ratio between the amounts thereof can be obtained according to the method as described in "Nature 492, 234-238, 2012" (Reference Document 1). The amount of Prompt emission and the amount of Delay emission may be calculated using a device different from one described in Reference Document 1 or one shown in FIG. 2.

TABLE 2

| Emitting Layer | | | | | | | | Device Evaluation Results | | | | | |
|---|---|---|---|---|---|---|---|---|---|---|---|---|---|
| First Compound | | | Second Compound | | | Third Compound | | Drive | | | | | |
| Name | $S_1$ [eV] | λp [nm] | Name | $S_1$ [eV] | ΔST [eV] | Delay/Prompt | Name | $S_1$ [eV] | Voltage [V] | CIEx | CIEy | EQE [%] | λp [nm] | FWHM [nm] |

| | Name | $S_1$ [eV] | λp [nm] | Name | $S_1$ [eV] | ΔST [eV] | Delay/Prompt | Name | $S_1$ [eV] | Voltage [V] | CIEx | CIEy | EQE [%] | λp [nm] | FWHM [nm] |
|---|---|---|---|---|---|---|---|---|---|---|---|---|---|---|---|
| Example 1 | GD-1 | 2.44 | 504 | TADF-1 | 2.82 | <0.01 | >0.05 | D-1 | 3.63 | 3.92 | 0.217 | 0.686 | 9.13 | 515 | 25 |
| Compar. 1 | Ref-1 | 2.39 | 515 | TADF-1 | 2.82 | <0.01 | >0.05 | D-1 | 3.63 | 4.30 | 0.256 | 0.674 | 3.98 | 521 | 32 |
| Compar. 2 | Ref-2 | 2.45 | 500 | TADF-1 | 2.82 | <0.01 | >0.05 | D-1 | 3.63 | 3.94 | 0.217 | 0.675 | 8.46 | 512 | 28 |

Comparing with the organic EL device of Comparative 1 or 2, the organic EL device of Example 1 exhibited a lower drive voltage, a higher EQE, and a narrower full width at It was confirmed that the amount of Delay Emission was 5% or more with respect to the amount of Prompt Emission in the compound TADF-1.

Specifically, it was found that a value of $X_D/X_P$ was 0.05 or more in the compound TADF-1. In Table 2, "Delay/Prompt" refers to the value of "$X_D/X_P$", and the value of $X_D/X_P$ being ">0.05" refers to a value exceeding 0.05.

ΔST

Lowest singlet energy $S_1$ of each of the compounds GD-1, Ref-1, Ref-2, TADF-1, and D-1 was measured according to the above-described solution method. An energy gap $T_{77K}$ at 77K of the compound TADF-1 was measured by the measurement method of the energy gap $T_{77K}$ described above in "Relationship between Triplet Energy and Energy Gap at 77K."

ΔST of the compound TADF-1 was calculated from the measured lowest singlet energy ST and energy gap $T_{77K}$ at 77K.

Main Peak Wavelength of Compound

A 5-μmol/L toluene solution of each of the compounds (measurement target) was prepared and put in a quartz cell. A fluorescence spectrum (ordinate axis: fluorescence intensity, abscissa axis: wavelength) of each of the samples was measured at a normal temperature (300K). In Example, fluorescence spectrum was measured using a spectrophotofluorometer manufactured by Hitachi, Ltd. (device name: F-7000). It should be noted that the fluorescence spectrum measuring device may be different from the above device. A peak wavelength of the fluorescence spectrum exhibiting the maximum luminous intensity was defined as a main peak wavelength of the compound.

Synthesis of Compound

Synthesis Example 1: Synthesis of Compound GD-1

Manufacture of Intermediate 1-1

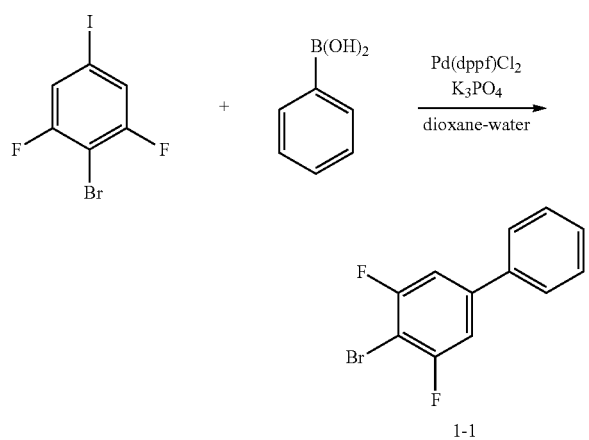

Under argon atmosphere, a mixture of 2-bromo-1,3-difluoro-5-iodobenzene (47.8 g), phenylboronic acid (18.29 g), tripotassium phosphate (39.8 g), [1,1-bis(diphenyl phosphino) ferrocene]palladium(II) dichloride (1.09 g), 1,4-dioxane (250 mL), and water (125 mL) was stirred at the room temperature for four hours. Toluene (250 mL) and water (200 mL) were added to the obtained mixture to extract an aqueous layer with toluene. An organic layer was washed with a saturated saline solution, and subsequently dried with magnesium sulfate and a solvent was distilled. The obtained residue was refined by silica-gel column chromatography, whereby an intermediate 1-1 (35.1 g, a yield of 87%) was obtained. In a reaction scheme, Pd(dppf)Cl₂ represents [1,1-bis(diphenylphosphino) ferrocene]palladium(II) dichloride.

Manufacture of Intermediate 1-2

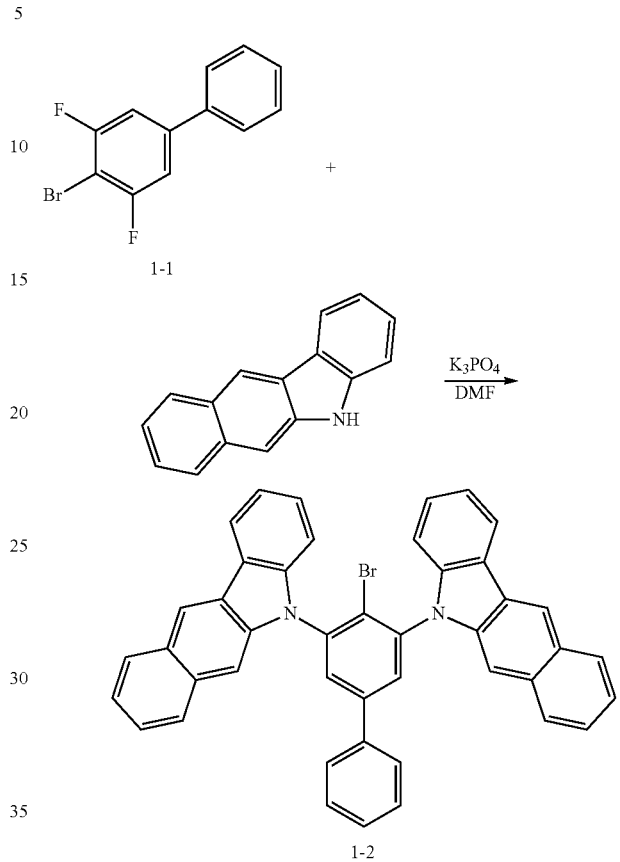

Under nitrogen atmosphere, a mixture of an intermediate 1-1 (2.69 g), benzo[b]carbazole (4.34 g), tripotassium phosphate (12.7 g), and dimethylformamide (50 mL) was stirred at 140 degrees C. for 3.5 hours. After cooled to the room temperature, the mixture was added with water (200 mL). The deposited solid was collected by filtration and washed with water. The obtained solid was dissolved in dichloromethane, adsorbed on silica gel, and refined by silica-gel column chromatography to obtain the intermediate 1-2 (3.16 g, a yield of 47%). In an reaction scheme, DMF represents dimethylformamide.

Manufacture of Compound GD-1

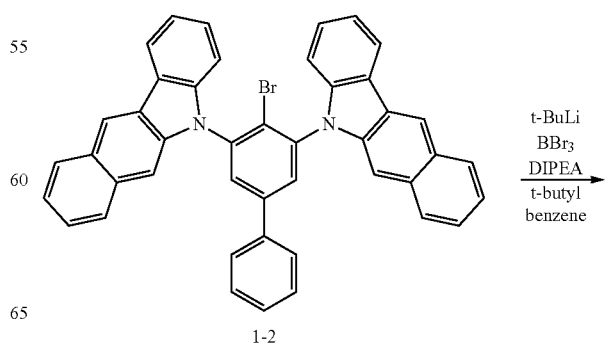

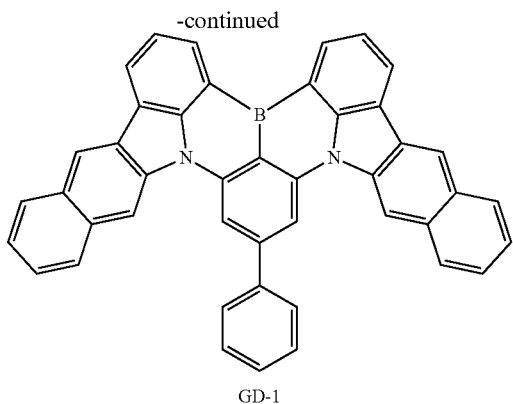

GD-1

Under argon atmosphere, the intermediated (1.2 g) was added to t-butylbenzene (18 mL), cooled to 0 degree C., and then added dropwise with a 1.9 M t-butyllithium pentane solution (1.9 mL). After the dropwise addition, the obtained solution was heated to 45 degrees C. and stirred for 15 minutes. Subsequently, the obtained reaction mixture was cooled to −55 degrees C., added with boron tribromide (0.43 mL), heated to the room temperature, and stirred for one hour. Subsequently, the reaction mixture was cooled to 0 degree C., added with N,N-diisopropylethylamine (0.79 mL), stirred at the room temperature until heat generation subsides, then heated to 145 degrees C., and stirred for 2.5 hours. After cooled to the room temperature, the reaction mixture was added with 1N aqueous potassium acetate solution. The deposited solid was collected by filtration and washed with water and ethanol. The solid collected by filtration was suspended in methylene chloride to collect a solid by filtration, and then the solid was further washed with methylene chloride to obtain an orange solid (527 mg, a yield of 49%). As a result of mass spectrum analysis, this orange solid was the target product, and 593.3 [M+H]+ was shown for a molecular weight of 592.51. In a reaction scheme, t-BuLi represents tert-butyllithium and DIPEA represents N,N-diisopropylethylamine.

Synthesis Example 2: Synthesis of Compound 2

Manufacture of Intermediate 2-1

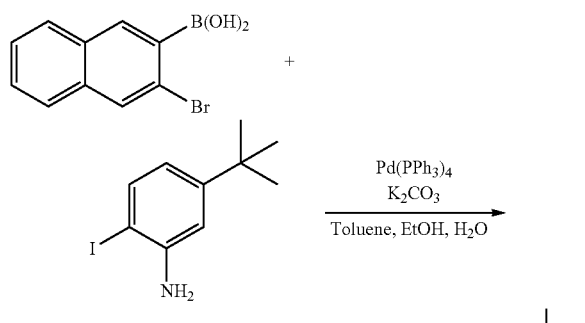

Under argon atmosphere, 3-bromo-2-naphthalene boronic acid (24.09 g) and potassium carbonate (12.44 g) were added to toluene (140 mL). The obtained mixture was added with 4-t-butyl-2-iodoaniline (16.51 g), ethanol (70 mL) and water (35 mL). The obtained mixture was further added with tetrakis(triphenylphosphine)palladium(0)(2.08 g) and stirred at 65 degrees C. for seven hours. The reaction mixture was cooled to the room temperature and added with toluene (50 mL) and water (200 mL) to extract an aqueous layer with toluene. The separated organic layer was washed with water and a saturated saline solution, and dried with sodium sulfate. After the solid was collected by filtration, the reaction solution was condensed under reduced pressure. The obtained residue was refined by silica-gel chromatography using methylene chloride to obtain an intermediate 2-1 (18.89 g, a yield of 89%). In a reaction scheme, Pd(PPh₃)₄ represents tetrakis(triphenylphosphine)palladium (0).

Manufacture of Intermediate 2-2

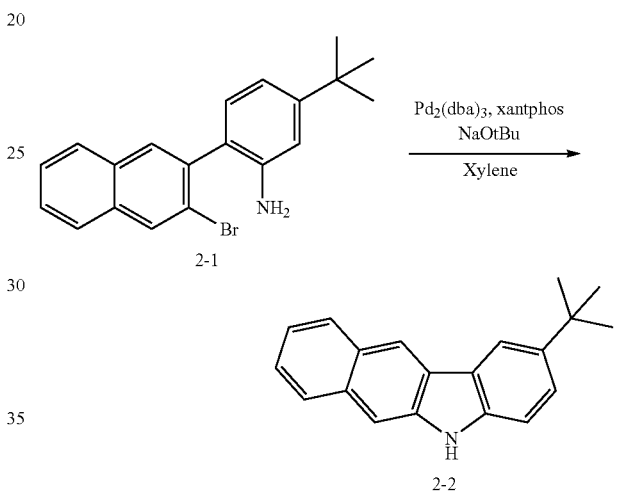

Under argon atmosphere, the intermediate 2-1 (18.07 g) and sodium t-butoxide (6.86 g) were added to xylene (250 mL). Xantphos (1.18 g) and tris(dibenzylideneacetone) dipalladium(0) (0.93 g) were added thereto, and the obtained mixture was stirred at 110 degrees C. for seven hours. After cooled to the room temperature, the reaction mixture was added with water (200 mL) and extraction was conducted with toluene (100 mL). The separated organic layer was washed with water and a saturated saline solution, and dried with sodium sulfate. After the solid was collected by filtration, the reaction solution was condensed under reduced pressure. The obtained residue was recrystalized from toluene. After collected, the deposited crystal was washed with heptane and dried under reduced pressure to obtain an intermediate 2-2 (11.67 g, a yield of 84%). In a reaction scheme, Pd₂(dba)₃ represents tris(dibenzylideneacentone) dipalladium(0) and NaOtBu represents sodium t-butoxide.

Manufacture of Intermediate 2-3

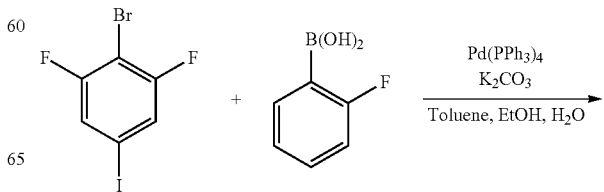

-continued

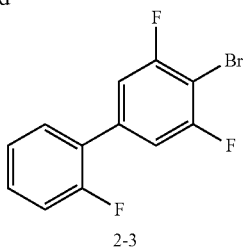
2-3

Under argon atmosphere, 2-bromo-1,3-difluoro-5-iodobenzene (7.97 g), 2-fluorophenylboronic acid (3.67 g), and potassium carbonate (5.18 g) were added to a mixed solvent of toluene (60 mL), ethanol (30 mL), and water (15 mL). The obtained mixture was further added with tetrakis(triphenylphosphine)palladium(0) (0.87 g) and stirred at 65 degrees C. for six hours. The reaction mixture was cooled to the room temperature and added with toluene (20 mL) and water (100 mL) to extract an aqueous layer with toluene. The separated organic layer was washed with water and a saturated saline solution, and dried with sodium sulfate. After the solid was collected by filtration, the reaction solution was condensed under reduced pressure. The obtained residue was refined by silica-gel chromatography using methylene chloride to obtain an intermediate 2-3 (3.07 g, a yield of 43%).

Manufacture of Intermediate 2-4

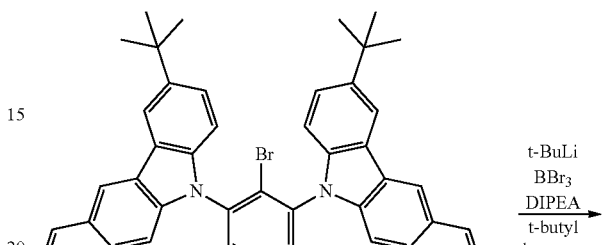

Under nitrogen atmosphere, a mixture of the intermediate 2-2 (4.48 g), the intermediate 2-3 (2.30 g), tripotassium phosphate (13.58 g), and dimethylformamide (50 mL) was stirred at 100 degrees C. for 15 hours. After cooled to the room temperature, the reaction mixture was added with water (400 mL). The deposited solid was collected by filtration and washed with water. The obtained solid was dissolved in dichloromethane, adsorbed on silica gel, and refined by silica-gel column chromatography using methylene chloride to obtain an intermediate 2-4 (4.88 g, a yield of 76%).

Manufacture of Compound 2

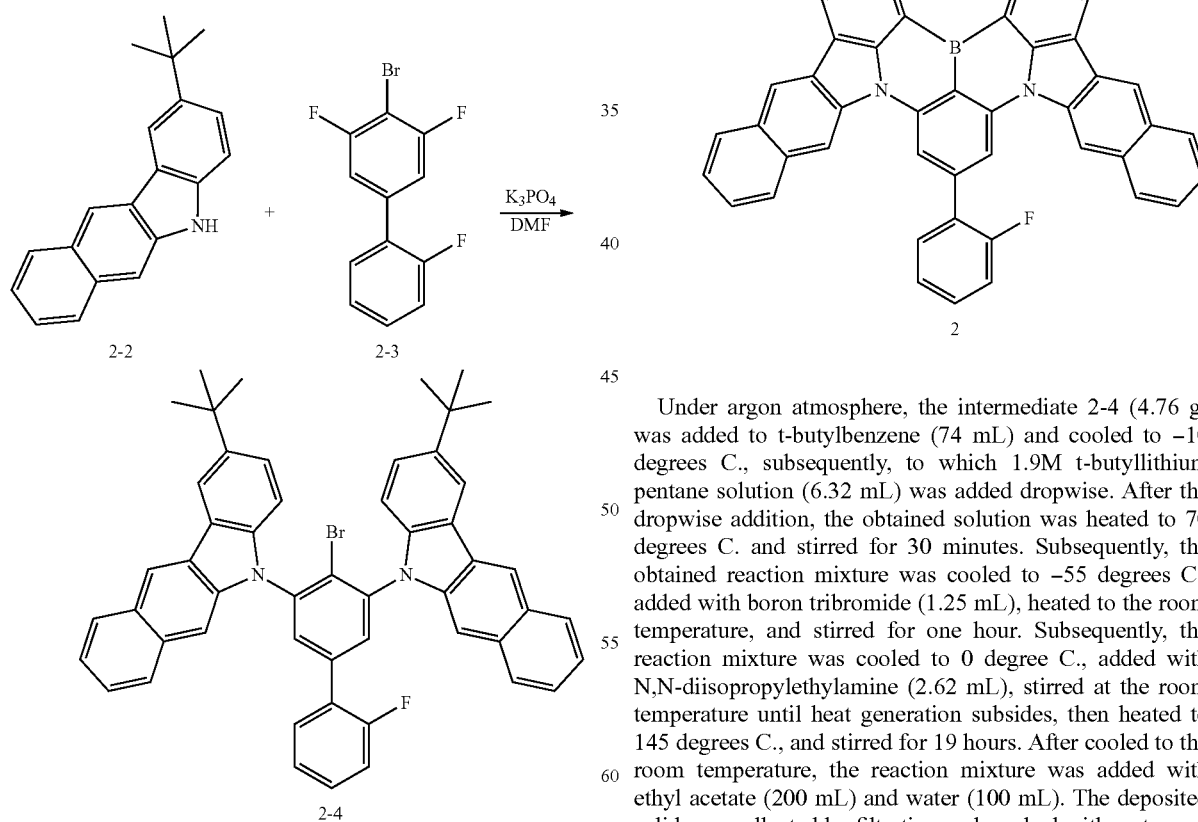

Under argon atmosphere, the intermediate 2-4 (4.76 g) was added to t-butylbenzene (74 mL) and cooled to −10 degrees C., subsequently, to which 1.9M t-butyllithium pentane solution (6.32 mL) was added dropwise. After the dropwise addition, the obtained solution was heated to 70 degrees C. and stirred for 30 minutes. Subsequently, the obtained reaction mixture was cooled to −55 degrees C., added with boron tribromide (1.25 mL), heated to the room temperature, and stirred for one hour. Subsequently, the reaction mixture was cooled to 0 degree C., added with N,N-diisopropylethylamine (2.62 mL), stirred at the room temperature until heat generation subsides, then heated to 145 degrees C., and stirred for 19 hours. After cooled to the room temperature, the reaction mixture was added with ethyl acetate (200 mL) and water (100 mL). The deposited solid was collected by filtration and washed with water and ethyl acetate. The collected solid was dried under reduced pressure to obtain an orange solid (1.45 g, 33%). As a result of mass spectrum analysis, this orange solid was the target product, and 723.3 [M+H]$^+$ was shown for a molecular weight of 722.71.

What is claimed is:

1. A compound represented by a formula (4),

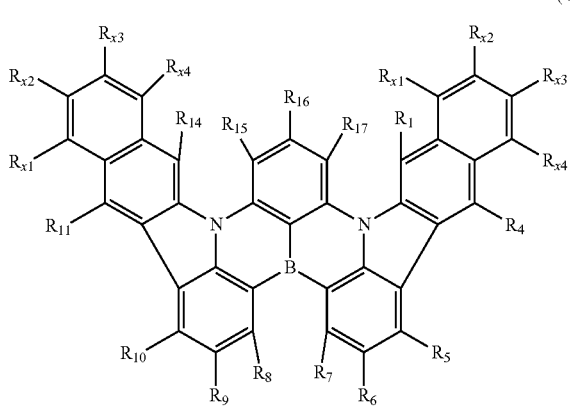

(4)

wherein;

$R_{X1}$ to $R_{X4}$, $R_1$, $R_4$ to $R_{11}$, $R_{14}$, $R_{15}$ and $R_{17}$ each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aralkyl group having 7 to 50 carbon atoms, a group represented by —O—($R_{914}$), a group represented by —S—($R_{915}$), a group represented by —N($R_{916}$)($R_{917}$), a group represented by —C(=O)$R_{918}$, a group represented by —COOR$_{919}$, a halogen atom, a cyano group, a nitro group, a substituted or unsubstituted aryl group having 6 to 50 ring carbon atoms, or a substituted or unsubstituted heterocyclic group having 5 to 50 ring atoms;

$R_{16}$ represents an unsubstituted phenyl group, an unsubstituted naphthyl group, a substituted or unsubstituted dibenzofuranyl group, a phenyl group substituted by an unsubstituted alkyl group having 1 to 25 carbon atoms, an unsubstituted cycloalkyl group having 3 to 25 ring carbon atoms, an unsubstituted aryl group having 6 to 25 ring carbon atoms, or an unsubstituted heterocyclic group having 5 to 25 ring atoms, or a naphthyl group substituted by an unsubstituted alkyl group having 1 to 25 carbon atoms, an unsubstituted cycloalkyl group having 3 to 25 ring carbon atoms, an unsubstituted aryl group having 6 to 25 ring carbon atoms, or an unsubstituted heterocyclic group having 5 to 25 ring atoms;

the plurality of $R_{X1}$ are mutually the same or different;
the plurality of $R_{X2}$ are mutually the same or different;
the plurality of $R_{X3}$ are mutually the same or different;
the plurality of $R_{X4}$ are mutually the same or different;

$R_{914}$ to $R_{919}$ are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms;

when a plurality of $R_{914}$ are present, the plurality of $R_{914}$ are mutually the same or different;

when a plurality of $R_{915}$ are present, the plurality of $R_{915}$ are mutually the same or different;

when a plurality of $R_{916}$ are present, the plurality of $R_{916}$ are mutually the same or different;

when a plurality of $R_{917}$ are present, the plurality of $R_{917}$ are mutually the same or different;

when a plurality of $R_{918}$ are present, the plurality of $R_{918}$ are mutually the same or different; and when a plurality of $R_{919}$ are present, the plurality of $R_{919}$ are mutually the same or different, and wherein a substituent for a substituted group of $R_{X1}$ to $R_{X4}$, $R_1$, $R_4$ to $R_{11}$, $R_{14}$, $R_{15}$ and $R_{17}$ and a substituent for a substituted dibenzofuranyl group of $R_{16}$ are each an unsubstituted alkyl group having 1 to 25 carbon atoms, an unsubstituted alkenyl group having 2 to 25 carbon atoms, an unsubstituted alkynyl group having 2 to 25 carbon atoms, an unsubstituted cycloalkyl group having 3 to 25 ring carbon atoms, a group represented by —O—($R_{904}$), a group represented by —S—($R_{905}$), a group represented by —N($R_{906}$)($R_{907}$), an unsubstituted aralkyl group having 7 to 50 carbon atoms, a group represented by —C(=O)$R_{908}$, a group represented by —COOR$_{909}$, a group represented by —S(=O)$_2R_{941}$, a group represented by —P(=O)($R_{942}$)($R_{943}$), a group represented by —Ge($R_{944}$)($R_{945}$)($R_{946}$), a halogen atom, a cyano group, a nitro group, an unsubstituted aryl group having 6 to 25 ring carbon atoms, or an unsubstituted heterocyclic group having 5 to 25 ring atoms; and $R_{904}$ to $R_{909}$ and $R_{941}$ to $R_{946}$ are each independently a hydrogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

2. The compound according to claim 1, wherein the compound is represented by a formula (7),

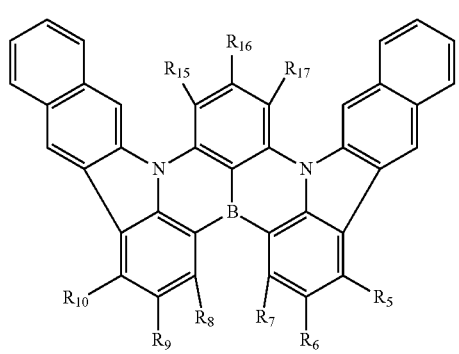

(7)

where $R_5$ to $R_{10}$ and $R_{15}$ to $R_{17}$ each independently represent the same as $R_5$ to $R_{10}$ and $R_{15}$ to $R_{17}$ defined in the formula (4).

3. The compound according to claim 1, wherein the compound is represented by a formula (9), (9)

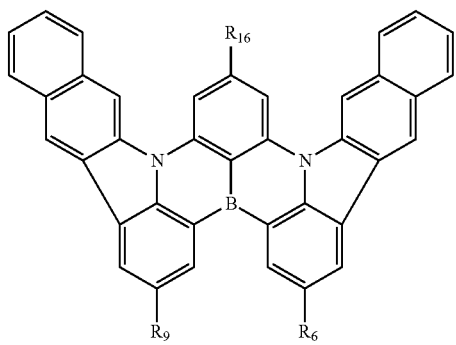

where $R_6$, $R_9$, and $R_{16}$ each independently represent the same as $R_6$, $R_9$, and $R_{16}$ defined in the formula (4).

4. The compound according to claim 3, wherein in the formula (9), $R_6$ and $R_9$ are each independently a hydrogen atom, a substituted or unsubstituted alkyl group having 1 to 25 carbon atoms, or a substituted or unsubstituted aryl group having 6 to 25 ring carbon atoms.

5. The compound according to claim 3, wherein the compound is represented by a formula (9A), (9A)

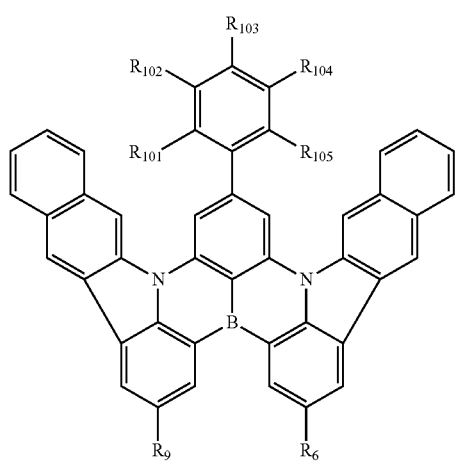

where $R_6$, and $R_9$ each independently represent the same as $R_6$, and $R_9$ defined in the formula (4); at least one combination of adjacent two or more of $R_{101}$ to $R_{105}$ are mutually bonded to form a substituted or unsubstituted monocyclic ring, mutually bonded to form a substituted or unsubstituted fused ring, or not mutually bonded; and $R_{101}$ to $R_{105}$ neither forming the substituted or unsubstituted monocyclic ring nor forming the substituted or unsubstituted fused ring each independently represent a hydrogen atom, an unsubstituted alkyl group having 1 to 25 carbon atoms, an unsubstituted cycloalkyl group having 3 to 25 ring carbon atoms, an unsubstituted aryl group having 6 to 25 ring carbon atoms, or an unsubstituted heterocyclic group having 5 to 25 ring atoms.

6. The compound according to claim 1, wherein the substituent for the substituted group of $R_{X1}$ to $R_{X4}$, $R_1$, $R_4$ to $R_{11}$, $R_{14}$, $R_{15}$ and $R_{17}$ and the substituent for the substituted dibenzofuranyl group of $R_{16}$ are each a halogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

7. The compound according to claim 1, wherein the substituent for the substituted group of $R_{X1}$ to $R_{X4}$, $R_1$, $R_4$ to $R_{11}$, $R_{14}$, $R_{15}$ and $R_{17}$ and the substituent for the substituted dibenzofuranyl group of $R_{16}$ are each a fluorine atom, an unsubstituted alkyl group having 1 to 10 carbon atoms, an unsubstituted aryl group having 6 to 12 ring carbon atoms, or an unsubstituted heterocyclic group having 5 to 12 ring atoms.

8. The compound according to claim 1, wherein all groups described as the substituted or unsubstituted groups are unsubstituted groups.

9. An organic-electroluminescence-device material, comprising:
the compound to of claim 1.

10. An organic electroluminescence device, comprising:
a cathode;
an anode; and
an organic layer formed between the cathode and the anode,
wherein the organic layer comprises an emitting layer and includes at least one layer comprising the compound of claim 1.

11. The organic electroluminescence device according to claim 10, wherein the emitting layer comprises the compound.

12. The organic electroluminescence device according to claim 10, wherein the emitting layer comprises a delayed fluorescent material.

13. The organic electroluminescence device according to claim 12, wherein a lowest singlet energy $S_1(H)$ of the delayed fluorescent material and a lowest singlet energy $S_1(D)$ of the compound satisfy Numerical Formula 1, $S_1(H) > S_1(D)$.

14. An electronic device, comprising:
the organic electroluminescence device of claim 10.

15. A compound represented by a formula (4), (4)

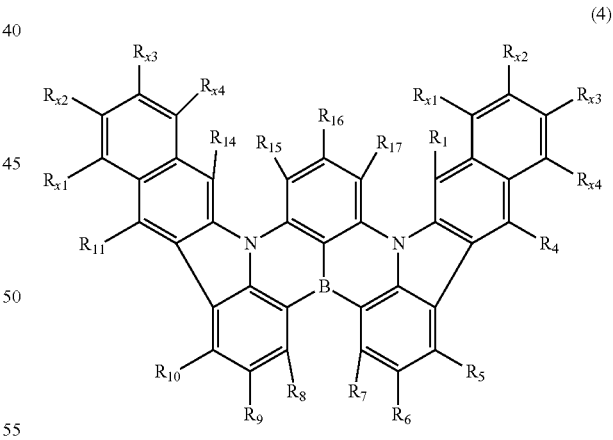

wherein:
$R_{X1}$ to $R_{X4}$, $R_1$, $R_4$ to $R_{11}$, $R_{14}$, $R_{15}$ and $R_{17}$ each independently represent a hydrogen atom, a substituted or unsubstituted alkyl group having 1 to 50 carbon atoms, a substituted or unsubstituted alkenyl group having 2 to 50 carbon atoms, a substituted or unsubstituted alkynyl group having 2 to 50 carbon atoms, a substituted or unsubstituted cycloalkyl group having 3 to 50 ring carbon atoms, a substituted or unsubstituted aralkyl group having 7 to 50 carbon atoms, a group represented by —O—($R_{914}$), a group represented by —S—($R_{915}$), a group represented by —N(R$_{916}$)(R$_{917}$), a group represented by —C(═O)R$_{918}$, a group represented by —COOR$_{919}$, a halogen atom, a cyano group, a nitro group, a substituted or unsubstituted aryl group having 6 to 50 ring carbon atoms, or a substituted or unsubstituted heterocyclic group having 5 to 50 ring atoms;

R$_{16}$ represents an unsubstituted aryl group having 6 to 50 ring carbon atoms, or a substituted or unsubstituted heterocyclic group that does not contain a nitrogen atom and having 5 to 50 ring atoms;

the plurality of R$_{X1}$ are mutually the same or different;
the plurality of R$_{X2}$ are mutually the same or different:
the plurality of R$_{X3}$ are mutually the same or different;
the plurality of R$_{X4}$ are mutually the same or different;

R$_{914}$ to R$_{919}$ are each independently a hydrogen atom, a substituted or unsubstituted alkyl group having 1 to 50 carbon atoms, a substituted or unsubstituted aryl group having 6 to 50 ring carbon atoms, or a substituted or unsubstituted heterocyclic group having 5 to 50 ring atoms;

when a plurality of R$_{914}$ are present, the plurality of R$_{914}$ are mutually the same or different;
when a plurality of R$_{915}$ are present, the plurality of R$_{915}$ are mutually the same or different;
when a plurality of R$_{916}$ are present, the plurality of R$_{916}$ are mutually the same or different;
when a plurality of R$_{917}$ are present, the plurality of R$_{917}$ are mutually the same or different;
when a plurality of R$_{918}$ are present, the plurality of R$_{918}$ are mutually the same or different; and
when a plurality of R$_{919}$ are present, the plurality of R$_{919}$ are mutually the same or different;

a substituent for a substituted group of R$_{X1}$ to R$_{X4}$, R$_1$, R$_4$ to R$_{11}$, R$_{14}$, R$_{15}$ and R$_{17}$ and a substituent for a substituted heterocyclic group of R$_{16}$ are each an unsubstituted alkyl group having 1 to 25 carbon atoms, an unsubstituted alkenyl group having 2 to 25 carbon atoms, an unsubstituted alkynyl group having 2 to 25 carbon atoms, an unsubstituted cycloalkyl group having 3 to 25 ring carbon atoms, a group represented by —O—(R$_{904}$), a group represented by —S—(R$_{905}$), a group represented by —N(R$_{906}$)(R$_{907}$), an unsubstituted aralkyl group having 7 to 50 carbon atoms, a group represented by —C(═O)R$_{908}$, a group represented by —COOR$_{909}$, a group represented by —S(═O),R$_{941}$, a group represented by —P(═O)(R$_{942}$)(R$_{943}$), a group represented by —Ge(R$_{944}$)(R$_{945}$)(R$_{946}$), a halogen atom, a cyano group, a nitro group, an unsubstituted aryl group having 6 to 25 ring carbon atoms, or an unsubstituted heterocyclic group having 5 to 25 ring atoms; and R$_{904}$ to R$_{909}$ and R$_{941}$ to R$_{946}$ are each independently a hydrogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

16. The compound according to claim 1, wherein the substituent for the substituted dibenzofuranyl group of R$_{16}$ is an unsubstituted alkyl group having 1 to 25 carbon atoms, an unsubstituted aryl group having 6 to 25 ring carbon atoms, or an unsubstituted heterocyclic group having 5 to 25 ring atoms.

17. The compound according to claim 1, wherein the substituent for the substituted dibenzofuranyl group of R$_{16}$ is an unsubstituted alkyl group having 1 to 10 carbon atoms, an unsubstituted aryl group having 6 to 12 ring carbon atoms, or an unsubstituted heterocyclic group having 5 to 12 ring atoms.

18. The compound according to claim 15, wherein the compound is represented by a formula (7),

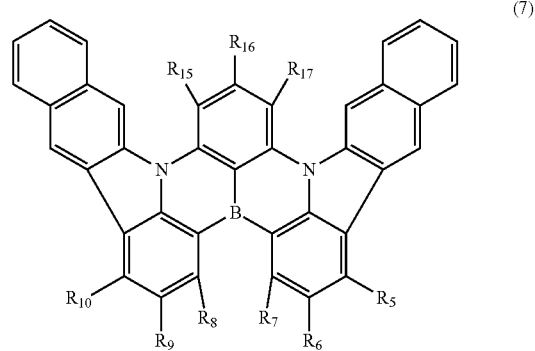

(7)

where R$_5$ to R$_{10}$ and R$_{15}$ to R$_{17}$ each independently represent the same as R$_5$ to R$_{10}$ and R$_{15}$ to R$_{17}$ defined in the formula (4).

19. The compound according to claim 15, wherein the compound is represented by a formula (9),

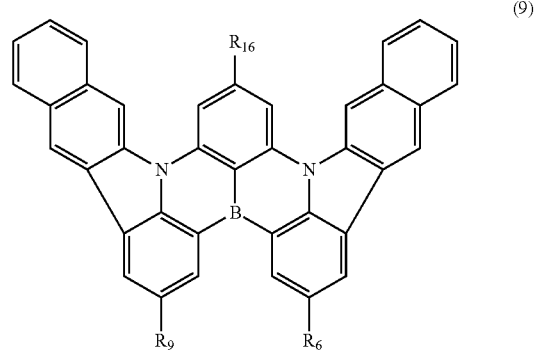

(9)

where R$_6$, R$_9$, and R$_{16}$ each independently represent the same as R$_6$, R$_9$, and R$_{16}$ defined in the formula (4).

20. The compound according to claim 19, wherein in the formula (9), R$_6$ and R$_9$ are each independently a hydrogen atom, a substituted or unsubstituted alkyl group having 1 to 25 carbon atoms, or a substituted or unsubstituted aryl group having 6 to 25 ring carbon atoms.

21. The compound according to claim 15, wherein the compound is represented by a formula (9A),

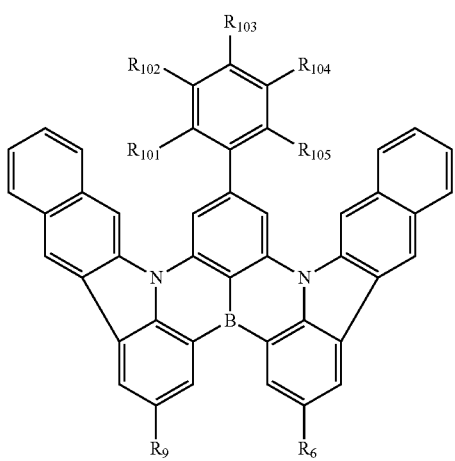

(9A)

where $R_6$ and $R_9$ each independently represent the same as $R_6$ and $R_9$ defined in the formula (4); at least one combination of adjacent two or more of $R_{101}$ to $R_{105}$ are mutually bonded to form a substituted or unsubstituted monocyclic ring, mutually bonded to form a substituted or unsubstituted fused ring, or not mutually bonded; and $R_{101}$ to $R_{105}$ neither forming the substituted or unsubstituted monocyclic ring nor forming the substituted or unsubstituted fused ring each independently represent a hydrogen atom.

22. The compound according to claim 15, wherein the substituent for the substituted group of $R_{X1}$ to $R_{X4}$, $R_1$, $R_4$ to $R_{11}$, $R_{14}$, $R_{15}$ and $R_{17}$ and the substituent for the substituted heterocyclic group of $R_{16}$ are each a halogen atom, an unsubstituted alkyl group having 1 to 25 carbon atoms, an unsubstituted aryl group having 6 to 25 ring carbon atoms, or an unsubstituted heterocyclic group having 5 to 25 ring atoms.

23. The compound according to claim 15, wherein the substituent for the substituted group of $R_{X1}$ to $R_{X4}$, $R_1$, $R_4$ to $R_{11}$, $R_{14}$, $R_{15}$ and $R_{17}$ and the substituent for the substituted heterocyclic group of $R_{16}$ are each a fluorine atom, an unsubstituted alkyl group having 1 to 10 carbon atoms, an unsubstituted aryl group having 6 to 12 ring carbon atoms, or an unsubstituted heterocyclic group having 5 to 12 ring atoms.

24. The compound according to claim 15, wherein all groups described as the substituted or unsubstituted groups are unsubstituted groups.

25. An organic-electroluminescence-device material, comprising:
the compound of claim 15.

26. An organic electroluminescence device, comprising:
a cathode;
an anode; and
an organic layer formed between the cathode and the anode,
wherein the organic layer comprises an emitting layer and includes at least one layer comprising the compound of claim 15.

27. The organic electroluminescence device according to claim 26, wherein the emitting layer comprises the compound.

28. The organic electroluminescence device according to claim 26, wherein the emitting layer comprises a delayed fluorescent material.

29. The organic electroluminescence device according to claim 28, wherein a lowest singlet energy $S_1(H)$ of the delayed fluorescent material and a lowest singlet energy $S_1(D)$ of the compound of claim 19 satisfy Numerical Formula 1, $S_1(H) > S_1(D)$.

30. An electronic device, comprising:
the organic electroluminescence device of claim 26.

* * * * *